(12) United States Patent
Kunitou

(10) Patent No.: US 6,221,723 B1
(45) Date of Patent: Apr. 24, 2001

(54) METHOD OF SETTING THRESHOLD VOLTAGE LEVELS OF A MULTIPLE-VALUED MASK PROGRAMMABLE READ ONLY MEMORY

(75) Inventor: Masao Kunitou, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/149,110

(22) Filed: Sep. 9, 1998

(30) Foreign Application Priority Data

Sep. 10, 1997 (JP) .................................................. 9-245388

(51) Int. Cl.$^7$ .............................................. H01L 21/8236
(52) U.S. Cl. ....................... 438/276; 438/278; 438/291; 438/587
(58) Field of Search ................................ 438/276, 277, 438/278, 279, 275, 289, 290, 291, 587

(56) References Cited

U.S. PATENT DOCUMENTS

| | | | |
|---|---|---|---|
| 3,868,274 | * 2/1975 | Hubar et al. | ................ 438/276 |
| 4,755,865 | * 7/1988 | Wilson et al. | ................ 357/63 |
| 5,520,769 | * 5/1996 | Barrett et al. | ................ 438/517 |
| 5,592,012 | * 1/1997 | Kubota | ................ 257/391 |
| 5,877,537 | * 3/1999 | Aoki | ................ 257/390 |
| 5,946,576 | * 8/1999 | Wen | ................ 438/278 |

FOREIGN PATENT DOCUMENTS 12-33759  9/1989 (JP) .
71-42611  6/1995 (JP) .

* cited by examiner

Primary Examiner—Michael Trinh
(74) Attorney, Agent, or Firm—Young & Thompson

(57) ABSTRACT

A method of setting a plurality of different threshold voltage levels to a plurality of cell regions for a mask programmable semiconductor device by carrying out a second impurity first-code selective ion-implantation, into at least a first-selected one of said plurality of cell regions doped with a first impurity to have a first threshold voltage level so that the at least the first-selected one of said cell regions has a second threshold voltage level which is different from the first threshold voltage level, the second impurity of the first-code selective ion-implantation being heavier than said first impurity so as to suppress any excess thermal diffusion to avoid variations in threshold voltage level of the cell regions.

51 Claims, 56 Drawing Sheets $V_{T0} < V_{T1} < V_{T2} < V_{T3}$ $$V_{T0} < V_{T1} < V_{T2} < V_{T3}$$

First code ion-implantation process of phosphorus

Second code ion-implantation process of phosphorus

First code ion-implantation process of phosphorus

Second code ion-implantation process of phosphorus

First code ion-implantation process of boron difluoride

Second code ion-implantation process of boron difluoride

First code ion-implantation process of boron difluoride

Second code ion-implantation process of boron difluoride

First code ion-implantation process of arsenic

Second code ion-implantation process of arsenic

# METHOD OF SETTING THRESHOLD VOLTAGE LEVELS OF A MULTIPLE-VALUED MASK PROGRAMMABLE READ ONLY MEMORY

BACKGROUND OF THE INVENTION

The present invention relates to a method of forming a semiconductor device, and more particularly to a method of setting multiple different threshold voltage levels to a plurality of cell transistor channel regions for a multiple-valued mask programmable read only memory in a reduced number of code selective ion-implantation processes.

In the mask programmable read only memory, ROM codes are decided in accordance with data supplied by the users. In order to decide the ROM code, it is necessary to carry out a plurality of code ion-implantation processes, wherein different mask patterns formed by photolithography processes are used to selectively ion-implant boron into selected cell transistor channel regions of the mask programmable read only memory. The selected, cell transistor channel regions having received boron implantation increase in threshold voltage level $V_T$. The unselected cell transistor channel regions free of boron implantation remain unchanged in threshold voltage level $V_T$. As a result of the plural code ion-implantation processes, the cell transistor channel regions have individually different threshold voltage levels. The difference in threshold voltage level of the cell transistor channel regions forms data. If two different threshold voltage levels are written into the cell transistor channel regions, this means that those cell transistor channel regions have binary digit data. If three or more different threshold voltage levels are written into the cell transistor channel regions, this means that those cell transistor channel regions have multiple valued data. In this case, the mask programmable read only memory is so called as a multiple-valued mask programmable read only memory.

FIG. 1 is a fragmentary plane view illustrative of arrays of cell transistor channel regions of a multiple-valued mask programmable read only memory.

The multiple-valued mask programmable read only memory has alternating alignments of a plurality of stripe-shaped n+-type buried regions 101 and 102 extending in a first horizontal direction and a plurality of rectangular-shaped p+-type isolation regions 200 which are aligned in the first horizontal direction so that each of the stripe-shaped p+-type isolation regions 200 isolates adjacent two of the stripe-shaped n+-type buried regions 101 and 102. Each pair of the stripe-shaped n+-type buried regions 101 and 102 sandwiches the alignment in the first horizontal direction of stripe-shaped p+-type isolation regions 200. The stripe-shaped n+-type buried regions 101 and 102 form source and drain regions of each cell transistor respectively. The stripe-shaped n+-type buried region 101 also serves as a ground line. The stripe-shaped n+-type buried region 102 also serves as a bit line.

The multiple-valued mask programmable read only memory further has a plurality of word lines 103 which extend in parallel to each other and in a second horizontal direction perpendicular to the first horizontal direction along which the stripe-shaped n+-type buried regions 101 and 102 extend. The word lines 103 extend cross over the stripe-shaped n+-type buried regions 101 and 102. The word lines 103 also serve as gate electrodes. First, second and third square-shaped cell transistor regions "a", "b" and "c" are represented by dotted lines. The rectangular-shaped p+-type isolation regions 200 isolates the first and second square-shaped cell transistor regions "a" and "b". Each of cell transistor channel regions 104 is positioned under the word line 103 and is sandwiched between the rectangular-shaped p+-type isolation regions 200 in the first horizontal direction and also sandwiched between the stripe-shaped n+-type buried regions 101 and 102. The threshold voltages of the cell transistor channel regions 104 are set to decide ROM-codes by boron-implantations carried out in accordance with the data supplied by the users.

FIGS. 2A through 2G are fragmentary cross sectional elevation views illustrative of a plurality of sequential ion-implantation processes involved in a conventional method of setting multiple threshold voltage levels of cell transistor channel regions of the multiple-valued mask programmable read only memory. Four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first, second and third code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

With reference to FIG. 2A, a p-well region 300 is formed over a silicon substrate. Field oxide films are selectively formed on the p-well region 300 over the silicon substrate to define an active region surrounded by the field oxide films. A gate oxide film 301 is formed on the active region of the p-well region 300. Further, gate electrodes are formed on the surface of the gate oxide film 301 so that the gate electrode are aligned at a constant pitch, wherein only four gate electrodes, for example, first to fourth gate electrodes 302a, 302b, 302c and 302d are illustrated.

With reference to FIG. 2B, a photo-resist is applied on an entire surface of the silicon substrate for subsequent photolithography process to form a photo-resist pattern 303 over the filed oxide film so that the photo-resist pattern 303 has an opening positioned over the active region or the gate electrodes 302a, 302b, 302c and 302d.

With reference to FIG. 2C, an ion-implantation of boron into an upper region of the p-well region 300 is carried out by use of the photo-resist pattern 300 and the gate electrodes 3a, 3b, 3c and 3d as masks, whereby p-type isolation regions 304a, 304b, 304c, 304d and 304e are formed in the upper region of the p-well region 300 and positioned under apertures between the gate electrodes 302a, 302b, 302c and 302d. This ion-implantation of boron is carried out at an ion-implantation energy of 20 KeV, and at a dose of about $1 \times 10^{13}$ cm$^{-2}$. The formations of the p-type isolation regions 304a, 304b, 304c, 304d and 304e define first to fourth cell transistor channel regions 305a, 305b, 305c and 305d. The first cell transistor channel region 305a is defined between the first and second p-type isolation regions 304a and 304b and also is positioned under the first gate electrode 302a. The second cell transistor channel region 305b is defined between the second and third p-type isolation regions 304b and 304c and also is positioned under the second gate electrode 302b. The third cell transistor channel region 305c is defined between the third and fourth p-type isolation regions 304c and 304d and also is positioned under the third gate electrode 302c. The fourth cell transistor channel region 305d is defined between the fourth and fifth p-type isolation regions 304d and 304e and also is positioned under the fourth gate electrode 302d. The first, second, third and fourth cell transistor channel regions 305a, 305b, 305c and 305d have the first threshold voltage level $V_{T0}$ as the lowest threshold voltage level.

With reference to FIG. 2D, the used photo-resist pattern 303 is removed before a photo-resist pattern 306 is provided over the substrate, wherein the photo-resist pattern 306 has two openings which are positioned over the second and fourth gate electrodes 302b and 302d. A first code ion-implantation of boron is carried out by use of the above photo-resist pattern 306 as a mask at an ion-implantation energy of 180 KeV and a dose in the range of about $1.0 \times 10^{13}$ to about $2.0 \times 10^{13}$, so that boron atoms penetrate through the gate oxide film 301 and the second to fourth gate electrodes 302b and 302d and are ion-implanted into the second to fourth cell transistor channel regions 305b and 305d under the second and fourth gate electrodes 302b and 302d. As a result of the first code ion-implantation of boron, the first threshold voltage level $V_{T0}$ of the above second and fourth cell transistor channel regions 305b and 305d is risen to the second threshold voltage level $V_{T1}$ as the second lowest threshold voltage level, whilst the first threshold voltage level $V_{T0}$ of the above first and third cell transistor channel regions 305a and 305c remains unchanged.

With reference to FIG. 2E, the used photo-resist pattern 306 is removed before a photo-resist pattern 307 is formed over the silicon substrate. The photo-resist pattern 307 has two openings which are positioned over the third gate electrode 302c and the fourth gate electrode 302d respectively, so that the third and fourth gate electrodes 302c and 302d are shown through the two openings of the second photo-resist pattern 307, whilst the first and second gate electrodes 302a and 302b as well as the gate oxide film 301 and the field oxide film are covered by the photo-resist pattern 307. A second code ion-implantation of boron is carried out at an ion-implantation energy of 180 KeV and at a dose in the range of $3.0 \times 10^{13}$ cm$^{-2}$ to $4.0 \times 10^{13}$ cm$^{-2}$ by use of the photo-resist pattern 307 as a mask, so that boron atoms penetrate the third and fourth gate electrodes 302c and 302d and the gate oxide film 301 and are ion-implanted into the third and fourth cell transistor channel regions 305c and 305d positioned under the third and fourth gate electrodes 302c and 302d shown through the openings of the photo-resist pattern 307, whereby the third and fourth cell transistor channel regions 305c and 305d have the third threshold voltage level $V_{T2}$ as the second highest threshold voltage level, whilst the first and second cell transistor channel regions 305a and 305b having the first and second threshold voltage levels $V_{T0}$ and $V_{T1}$ remain unchanged.

With reference to FIG. 2F, the used photo-resist pattern 307 is removed before a photo-resist pattern 308 is formed over the silicon substrate. The photo-resist pattern 308 has a single opening which is positioned over the fourth gate electrode 302d, so that the fourth gate electrode 302d is shown through the single opening of the photo-resist pattern 308, whilst the first, second and third gate electrodes 302a, 302b and 302c as well as the gate oxide film 301 and the field oxide film are covered by the photo-resist pattern 308. A third code ion-implantation of boron is carried out at an ion-implantation energy of 180 KeV and at a dose in the range of $1.0 \times 10^{14}$ cm$^{-2}$ to $2.0 \times 10^{14}$ cm$^{-2}$ by use of the photo-resist pattern 308 as a mask, so that boron atoms penetrate the fourth gate electrode 302d and the gate oxide film 301 and are ion-implanted into the fourth cell transistor channel region 305d positioned under the fourth gate electrode 302d shown through the single opening of the photo-resist pattern 308, whereby the fourth cell transistor channel region 305d having the third threshold voltage level $V_{T2}$ as the second highest threshold voltage level rises in threshold voltage level to the fourth threshold voltage level $V_{T3}$ as the highest threshold voltage level. In the meantime, the first, second and third cell transistor channel regions 305a, 305b and 305c having the first, second and third threshold voltage levels $V_{T0}$, $V_{T1}$ and $V_{T2}$ remain unchanged. As a result of the third code ion-implantation, the first cell transistor channel region 305a has the first threshold voltage level $V_{T0}$ as the lowest threshold voltage level. The second cell transistor channel region 305b has the second threshold voltage level $V_{T1}$ as the second lowest threshold voltage level. The third cell transistor channel region 305c has the third threshold voltage level $V_{T2}$ as the second highest threshold voltage level. The fourth cell transistor channel region 305d has the fourth threshold voltage level $V_{T3}$ as the highest threshold voltage level.

With reference to FIG. 2G, the used photo-resist pattern 308 is removed. Implementation of the above combined three code ion-implantations, for example, the first, second and third code ion-implantation processes could set four different threshold voltage levels, for example, the first, second, third and fourth threshold voltage levels $V_{T0}$, $V_1$, $V_{T2}$, and $V_{T3}$ to the first, second, third and fourth cell transistor channel regions 305a, 305b, 305c and 305d, whereby the first cell transistor channel region 305a has the first threshold voltage level $V_{T0}$ as the lowest threshold voltage level, the second cell transistor channel region 305b has the second threshold voltage level $V_{T1}$ as the second lowest threshold voltage level, the third cell transistor channel region 305c has the third threshold voltage level $V_{T2}$ as the second highest threshold voltage level, and the fourth cell transistor channel region 305d has the fourth threshold voltage level $V_{T3}$ as the highest threshold voltage level.

As described above, it is necessary for the conventional method to implement at least the three code ion-implantation processes. The above conventional method is hard to reduce the number of the necessary code ion-implantation processes to set the four different threshold voltage levels, for example, the first, second, third and fourth threshold voltage levels $V_{T0}$, $V_1$, $V_{T2}$, and $V_{T3}$ to the first, second, third and fourth cell transistor channel regions 305a, 305b, 305c and 305d. The difficulty in reduction in the number of the necessary code ion-implantation processes results in a difficulty in shortening the turn around time.

Further, it is more serious problems that the first, second and third code ion-implantation processes are carried out by implanting boron which is light in weight. Boron impurity light in weight is likely to show any excess thermal diffusion by a heat treatment to be carried out in a later manufacturing process. This excess thermal diffusion results in substantive variations in threshold voltage level of the cell transistor channel regions 305a, 305b, 305c and 305d by the heat treatment.

In Japanese laid-open patent publication No. 6-318683, there is disclosed the following second, third and fourth conventional methods other than the above conventional method for setting the four different threshold voltage levels to the cell transistor channel regions of the four-valued programmable read only memory.

In the second conventional method, four mask patterns are used to carry out four ion-implantations of boron at different four dose levels D1, D2, D3 and D4 to set different four threshold voltage levels.

In the third conventional method, three mask patterns are used to carry out three ion-implantations of boron into a first threshold voltage level region at different three dose levels D2, D3 and D4 to set different four threshold voltage levels.

In the fourth conventional method, two mask patterns are used to carry out two ion-implantations of boron into a first threshold voltage level region at different two dose levels D1 and D2, wherein one of the cell transistor channel region is subjected to both the two ion-implantations, thereby to set different four threshold voltage levels.

The above second, third and fourth conventional methods are, however, engaged with the above serious problems with the excess thermal diffusion by a heat treatment to be carried out in a later manufacturing process. This excess thermal diffusion results in substantive variations in threshold voltage level of the cell transistor channel regions by the heat treatment.

Further, the above second and third conventional methods are also engaged with the problem with the difficulty in reduction in the number of the necessary code ion-implantation processes, resulting in a difficulty in shortening the turn around time.

In the above circumstances, it had been required to develop a novel method of setting multiple different threshold voltage levels to a plurality of cell transistor channel regions for a multiple-valued mask programmable read only memory, free from the above problems.

SUMMARY OF THE INVENTION

Accordingly, it is an object of the present invention to provide a novel method of setting multiple different threshold voltage levels to a plurality of cell transistor channel regions for a multiple-valued mask programmable read only memory, free from the above problems.

It is a further object of the present invention to provide a novel method of setting multiple different threshold voltage levels to a plurality of cell transistor channel regions for a multiple-valued mask programmable read only memory, which is capable of suppressing any excess thermal diffusion of the impurity in the cell regions by a heat treatment to be carried out in a later manufacturing process, as compared to the first impurity.

It is a still further object of the present invention to provide a novel method of setting multiple different threshold voltage levels to a plurality of cell transistor channel regions for a multiple-valued mask programmable read only memory, which is capable of avoidance of any substantive variations in threshold voltage level of the cell regions.

It is yet a further object of the present invention to provide a novel method of setting multiple different threshold voltage levels to a plurality of cell transistor channel regions for a multiple-valued mask programmable read only memory, which is capable of reducing the number of the code selective ion-implantation processes using different photo-resist patterns as masks.

It is a further more object of the present invention to provide a novel method of setting multiple different threshold voltage levels to a plurality of cell transistor channel regions for a multiple-valued mask programmable read only memory, which is capable of shortening the turn around time.

The present invention, therefore, provides a method of setting a plurality of different threshold voltage levels to a plurality of cell regions for a mask programmable semiconductor device. The method comprises the step of: carrying out a first-code selective ion-implantation, into at least a first-selected one of the plurality of cell regions so doped with a first impurity as to have a first threshold voltage level, with a second impurity, so that the at least first-selected one of the cell regions has a second threshold voltage level which is different from the first threshold voltage level, wherein the second impurity of the first-code selective ion-implantation is heavier than the first impurity so as to suppress any excess thermal diffusion to avoid variations in threshold voltage level of the cell regions.

In accordance with the above present invention, the second impurity of the first-code selective ion-implantation is heavier than the first impurity This means that the heavy second impurity is capable of suppressing any excess thermal diffusion of the impurity in the cell regions by a heat treatment to be carried out in a later manufacturing process, as compared to the first impurity. This suppression of any excess thermal diffusion results in avoidance of any substantive variations in threshold voltage level of the cell regions.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
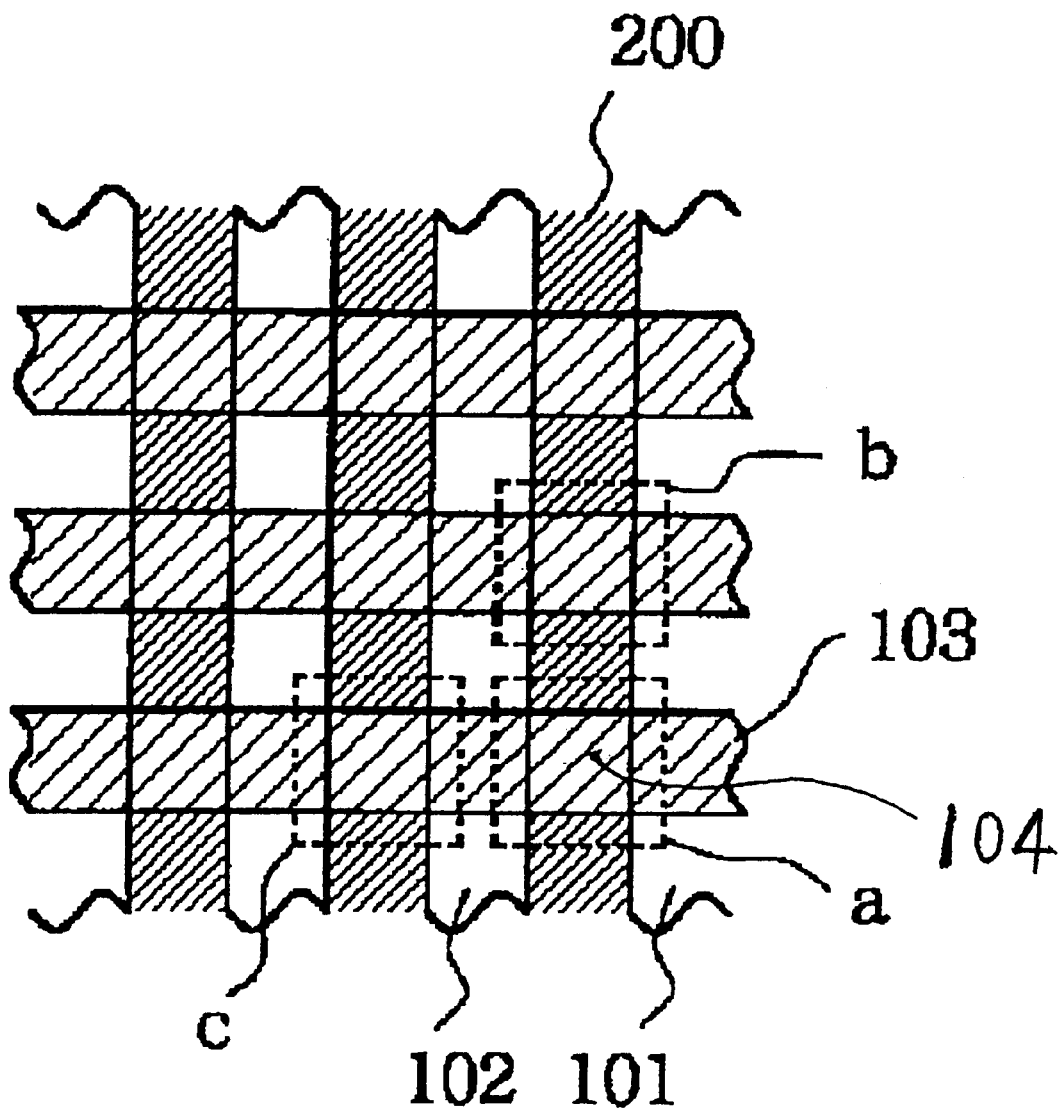
FIG. 1 is a fragmentary plane view illustrative of arrays of cell transistor channel regions of a multiple-valued mask programmable read only memory.
Figure 2A:
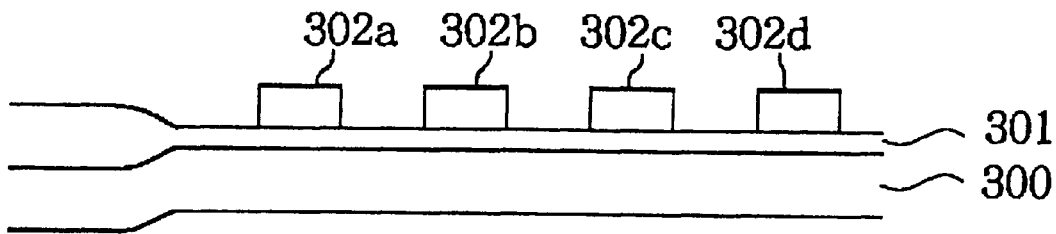
FIGS. 2A through 2G are fragmentary cross sectional elevation views illustrative of a plurality of sequential ion-implantation processes involved in a conventional method of setting multiple threshold voltage levels of cell transistor channel regions of the multiple-valued mask programmable read only memory.
Figure 2B:
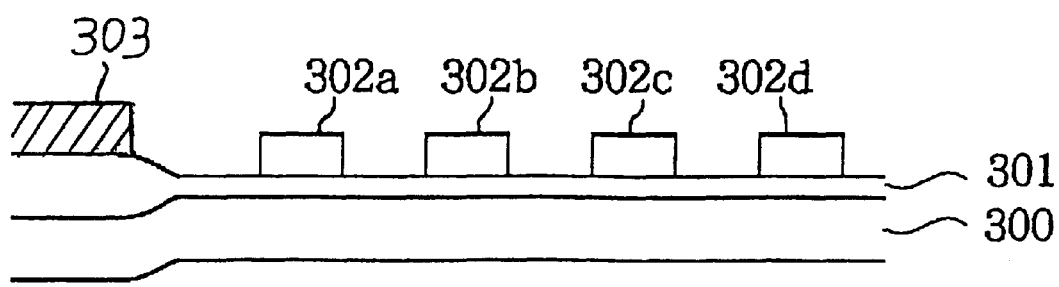
Figure 2C:
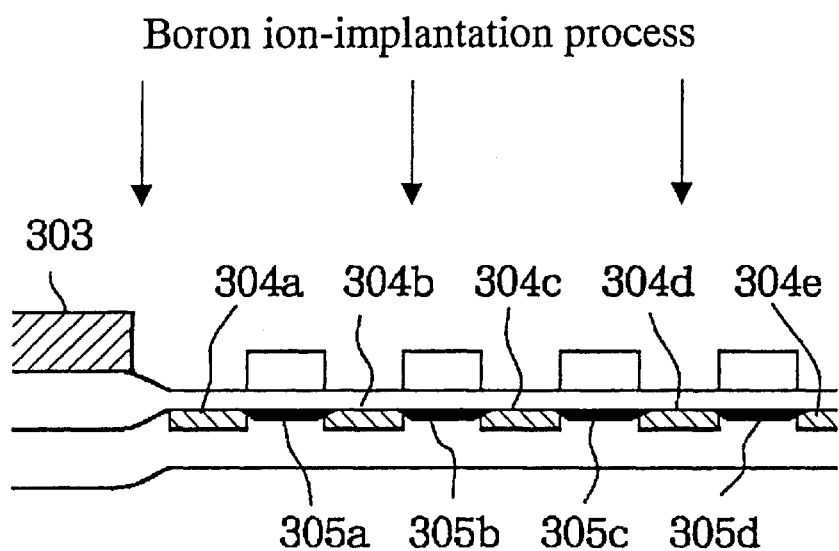
Figure 2D:
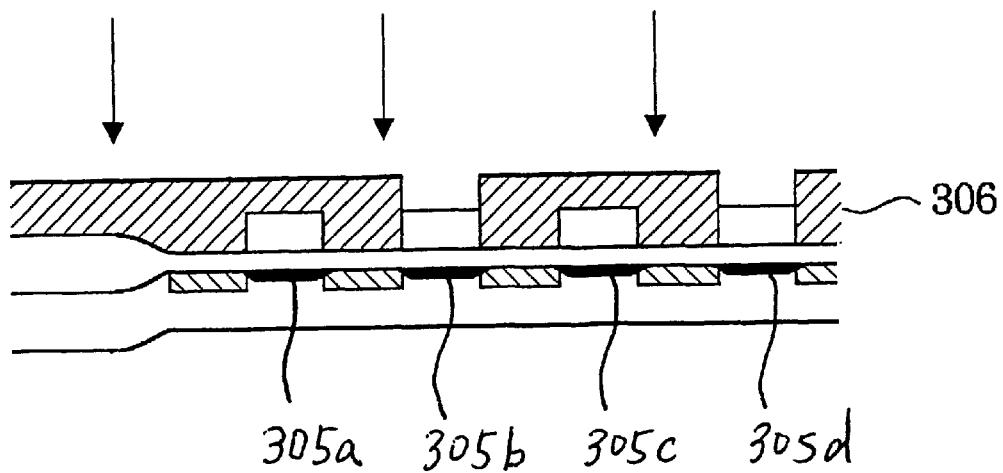
Figure 2E:
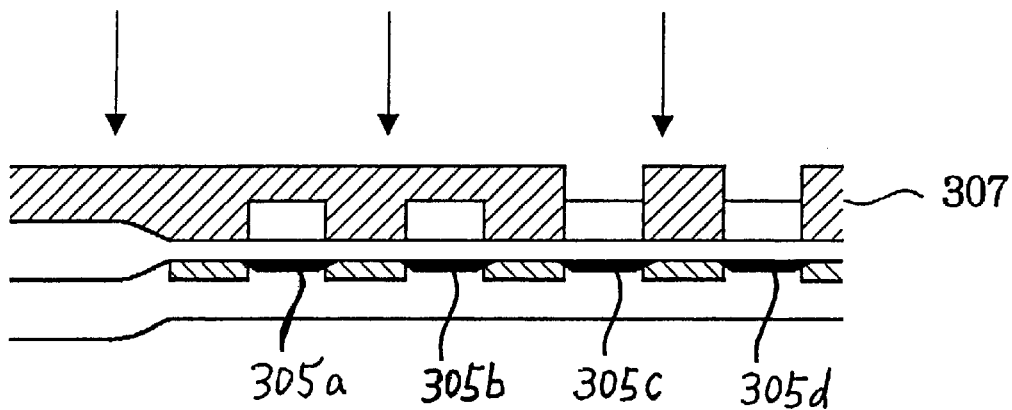
Figure 2F:
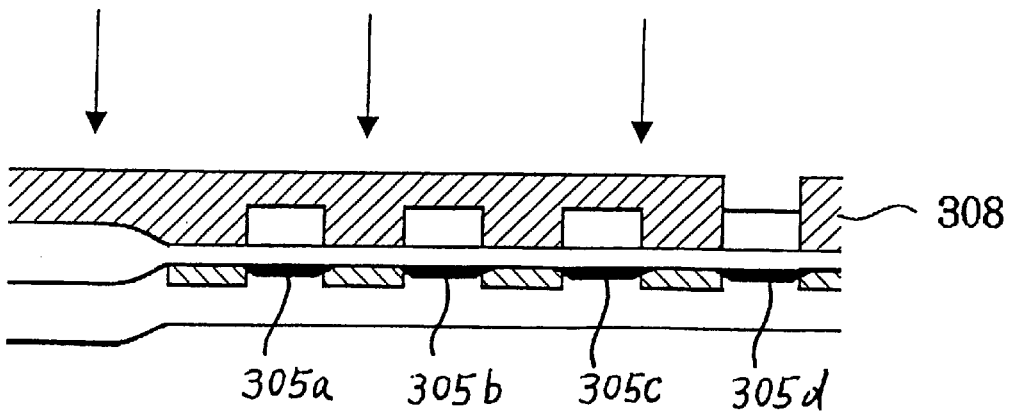
Figure 2G:
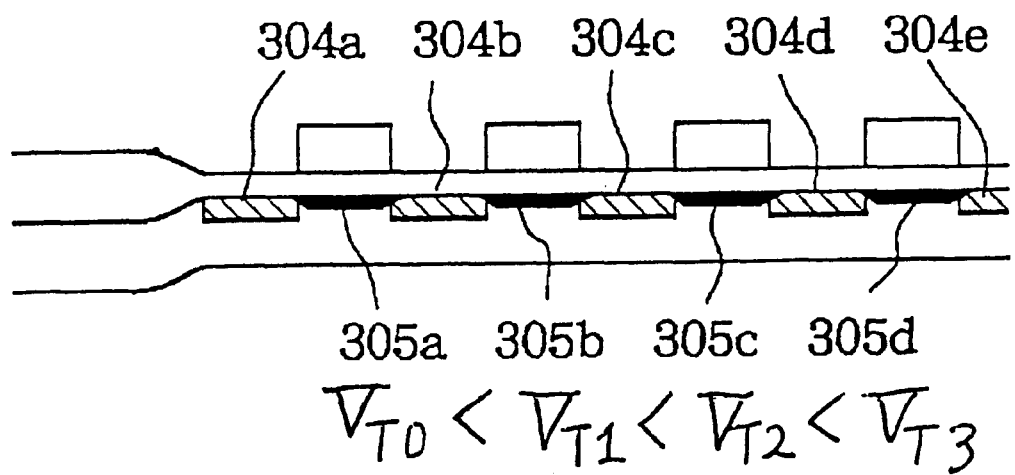
Figure 3:
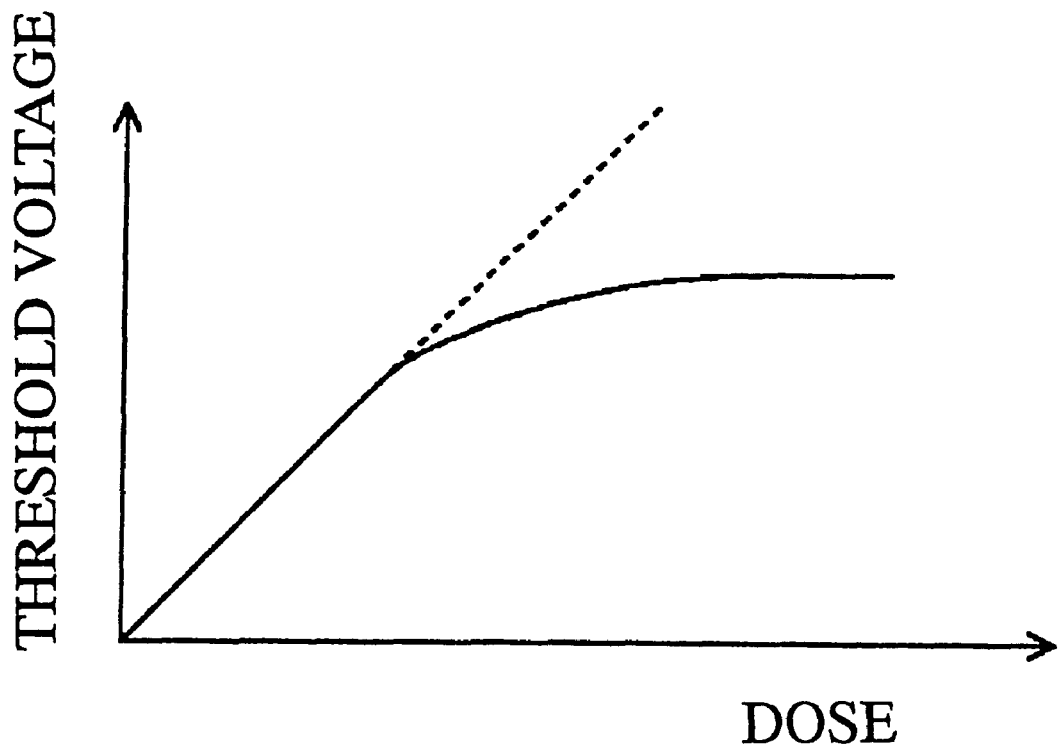
FIG. 3 is a diagram illustrative of variations in threshold voltage levels of a cell transistor channel region over doses of a multiple-valued programmable read only memory.

The first present invention provides a method of setting a plurality of different threshold voltage levels to a plurality of cell regions for a mask programmable semiconductor device. The method comprises the step of: carrying out a first-code selective ion-implantation, into at least a first-selected one of the plurality of cell regions so doped with a first impurity as to have a first threshold voltage level, with a second impurity, so that the at least first-selected one of the cell regions has a second threshold voltage level which is different from the first threshold voltage level, wherein the second impurity of the first-code selective ion-implantation is heavier than the first impurity so as to suppress any excess thermal diffusion to avoid variations in threshold voltage level of the cell regions.

In accordance with the above first present invention, the second impurity of the first-code selective ion-implantation is heavier than the first impurity. This means that the heavy second impurity is capable of suppressing any excess thermal diffusion of the impurity in the cell regions by a heat treatment to be carried out in a later manufacturing process step, as compared to the first impurity. This suppression of any excess thermal diffusion results in avoidance of any substantive variations in threshold voltage level of the cell regions.

It is available that the second impurity has an opposite conductivity type to the first impurity.

The use in combination of the first and second impurities of the opposite conductivity types to each other may reduce the number of the code selective ion-implantation processes using different photo-resist patterns as masks. The reduction in the number of the code selective ion-implantation processes shortens the turn around time.

It is further available that the first impurity comprises boron and the second impurity comprises an n-type impurity heavier than boron.

It is further more available that the n-type impurity of the second impurity comprises one selected from the group consisting of P, As and Sb.

It is also available that the first impurity comprises an n-type impurity and the second impurity comprises a p-type impurity heavier than the n-type impurity.

It is also available that the second impurity has the same conductivity type as the first impurity.

It is further available that the first and second impurities are of p-type, and the first impurity comprises boron and the second impurity comprises one selected from the group consisting of boron difluoride, gallium and indium.

It is furthermore available that the first and second impurities are of n-type, and the first impurity comprises phosphorus and the second impurity comprises one selected from the group consisting of arsenic and antimony.

It is available to further comprise a step of: carrying out a second-code selective ion-implantation of a third impurity into at least second-selected one of the plurality of cell regions, so that the at least a second-selected one of the cell regions has a third threshold voltage level which is different from the first and second threshold voltage levels, wherein the third impurity of the second-code selective ion-implantation is heavier than the first impurity.

The third impurity of the second-code selective ion-implantation is heavier than the first impurity This means that the heavy third impurity is capable of suppressing any excess thermal diffusion of the impurity in the cell regions by a heat treatment to be carried out in a later manufacturing process step, as compared to the first impurity. This suppression of any excess thermal diffusion results in avoidance of any substantive variations in threshold voltage level of the cell regions.

It is further available that the third impurity has an opposite conductivity type to the first impurity.

The use in combination of the first and third impurities of the opposite conductivity types to each other may reduce the number of the code selective ion-implantation processes using different photo-resist patterns as masks. The reduction in the number of the code selective ion-implantation processes shortens the turn around time.

It is further more available that the first impurity comprises boron and the second impurity comprises an n-type impurity heavier than boron.

It is moreover available that the n-type impurity of the third impurity comprises one selected from the group consisting of P, As and Sb.

It is also available that the first impurity comprises an n-type impurity and the third impurity comprises a p-type impurity heavier than the n-type impurity.

It is also available that the third impurity has the same conductivity type as the first impurity.

It is further available that the first and third impurities are of p-type, and the first impurity comprises boron and the third impurity comprises one selected from the group consisting of boron difluoride, gallium and indium.

It is further more available that the first and third impurities are of n-type, and the first impurity comprises phosphorus and the third impurity comprises one selected from the group consisting of arsenic and antimony.

It is also preferable that the first-code selective ion-implantation of the second impurity and the second-code selective ion-implantation of the third impurity are carried out at different doses from each other.

The use in combination of the first and second code selective ion-implantations different in dose may also reduce the number of the code selective ion-implantation processes using different photo-resist patterns as masks. The reduction in the number of the code selective ion-implantation processes shortens the turn around time.

It is further preferable that the at least first-selected one of the cell regions comprises first-selected plural cell regions and the at least first-selected one of the cell regions comprises second-selected plural cell regions, and wherein the first-selected plural cell regions partially overlap the second-selected plural cell regions, so that at least an overlapped cell region belonging both the first-selected and second-selected plural cell regions is subjected to both the first-code selective ion-implantation and subsequent the second-code selective ion-implantation.

The uses of the first and second code selective ion-implantations alone and in combination may also reduce the number of the code selective ion-implantation processes using different photo-resist patterns as masks. The reduction in the number of the code selective ion-implantation processes shortens the turn around time.

It is further preferable that the first-code selective ion-implantation is carried out at an ion-implantation energy which is higher than when the first impurity is doped into the all cell regions.

It is also preferable that the second-code selective ion-implantation is carried out at the same ion-implantation energy as the first-code selective ion-implantation.

The second present invention provides a method of setting multiple different threshold voltage levels to a plurality of cell transistor channel regions for a multiple-valued mask programmable read only memory. The method comprises the steps of: carrying out a first-code selective ion-implantation, into at least a first-selected one of the plurality of cell transistor channel regions so doped with a first impurity as to have a first threshold voltage level, with a second impurity, so that the at least first-selected one of the cell transistor channel regions has a second threshold voltage level which is different from the first threshold voltage level; and carrying out a second-code selective ion-implantation of a third impurity into at least second-selected one of the plurality of cell transistor channel regions, so that the at least second-selected one of the cell transistor channel regions has a third threshold voltage level which is different from the first and second threshold voltage levels, wherein the second impurity of the first-code selective ion-implantation is heavier than the first impurity, and the third impurity of the second-code selective ion-implantation is also heavier than the first impurity, so as to suppress any excess thermal diffusion to avoid variations in threshold voltage level of the cell transistor channel regions, and wherein at least any one of the second and third impurities has an opposite conductivity type to the first impurity.

In accordance with the above second present invention, the second impurity of the first-code selective ion-implantation is heavier than the first impurity, and also the third impurity of the second-code selective ion-implantation is heavier than the first impurity. This means that the heavy second and third impurities are capable of suppressing any excess thermal diffusion of the impurity in the cell regions by a heat treatment to be carried out in a later manufacturing process, as compared to the first impurity. This suppression of any excess thermal diffusion results in avoidance of any substantive variations in threshold voltage level of the cell regions.

The uses of the first impurity in combination with the second and third impurities, at least any one of which is of the opposite conductivity type to the first impurity, may reduce the number of the code selective ion-implantation processes using different photo-resist patterns as masks. The reduction in the number of the code selective ion-implantation processes shortens the turn around time.

It is also available that both the second and third impurities have an opposite conductivity type to the first impurity.

The uses of the first impurity in combination with the second and third impurities of the opposite conductivity type to the first impurity may reduce the number of the code selective ion-implantation processes using different photo-resist patterns as masks. The reduction in the number of the code selective ion-implantation processes shortens the turn around time.

It is further available that the first impurity comprises boron and each of the second and third impurities comprises an n-type impurity heavier than boron.

It is further more available that the n-type impurity of each of the second and third impurities comprises one selected from the group consisting of P, As and Sb.

It is also available that the first impurity comprises an n-type impurity and each of the second and third impurities comprises a p-type impurity heavier than the n-type impurity.

It is further available that the first and second impurities are of p-type, and the first impurity comprises boron and the second impurity comprises one selected from the group consisting of boron difluoride, gallium and indium.

It is further more available that the first and second impurities are of n-type, and the first impurity comprises phosphorus and the second impurity comprises one selected from the group consisting of arsenic and antimony.

It is also available that both the second and third impurities have opposite conductivity types to each other.

It is further available that the first impurity comprises boron, the second impurity comprises an n-type impurity heavier than boron, the third impurity comprises a p-type impurity heavier than boron.

It is further more available that the n-type impurity of the second impurity comprises one selected from the group consisting of P, As and Sb, and the p-type impurity of the third impurity comprises one selected from the group consisting of boron difluoride, gallium and indium It is also available that the first impurity comprises boron, the second impurity comprises a p-type impurity heavier than boron, the third impurity comprises an n-type impurity heavier than boron.

It is further available that the n-type impurity of the third impurity comprises one selected from the group consisting of P, As and Sb, and the p-type impurity of the second impurity comprises one selected from the group consisting of boron difluoride, gallium and indium.

It is preferable that the first-code selective ion-implantation of the second impurity and the second-code selective ion-implantation of the third impurity are carried out at different doses from each other.

The use in combination of the first and second code selective ion-implantations different in dose may also reduce the number of the code selective ion-implantation processes using different photo-resist patterns as masks. The reduction in the number of the code selective ion-implantation processes shortens the turn around time.

It is further preferable that the at least first-selected one of the cell transistor channel regions comprises first-selected plural cell transistor channel regions and the at least first-selected one of the cell transistor channel regions comprises second-selected plural cell transistor channel regions, and wherein the first-selected plural cell transistor channel regions partially overlap the second-selected plural cell transistor channel regions, so that at least an overlapped cell transistor channel region belonging both the first-selected and second-selected plural cell transistor channel regions is subjected to both the first-code selective ion-implantation and subsequent the second-code selective ion-implantation.

The uses of the first and second code selective ion-implantations alone and in combination may also reduce the number of the code selective ion-implantation processes using different photo-resist patterns as masks. The reduction in the number of the code selective ion-implantation processes shortens the turn around time.

It is also preferable that each of the first-code selective ion-implantation and the second-code selective ion-implantation is carried out at an ion-implantation energy which is higher than when the first impurity is doped into the all cell transistor channel regions.

The third present invention provides a method of setting multiple different threshold voltage levels to a plurality of cell transistor channel regions formed in a p-type silicon region for a multiple-valued mask programmable read only memory. The method comprises the steps of: carrying out a first-code selective ion-implantation, into at least a first-selected one of the plurality of cell transistor channel regions so doped with a first impurity of boron as to have a first threshold voltage level, with a second impurity of an n-type, so that the at least first-selected one of the cell transistor channel regions has a second threshold voltage level which is different from the first threshold voltage level; and carrying out a second-code selective ion-implantation of a third impurity of the n-type into at least second-selected one of the plurality of cell transistor channel regions, so that the at least second-selected one of the cell transistor channel regions has a third threshold voltage level which is different from the first and second threshold voltage levels, and wherein the second impurity of the first-code selective ion-implantation is heavier than the first impurity, and the third impurity of the second-code selective ion-implantation is also heavier than the first impurity, so as to suppress any excess thermal diffusion to avoid variations in threshold voltage level of the cell transistor channel regions.

In accordance with the above third present invention, the second impurity of the first-code selective ion-implantation is heavier than the first impurity, and also the third impurity of the second-code selective ion-implantation is heavier than the first impurity. This means that the heavy second and third impurities are capable of suppressing any excess thermal diffusion of the impurity in the cell regions by a heat treatment to be carried out in a later manufacturing process, as compared to the first impurity. This suppression of any excess thermal diffusion results in avoidance of any substantive variations in threshold voltage level of the cell regions.

The uses of the first impurity in combination with the second and third impurities of the opposite conductivity type to the first impurity may reduce the number of the code selective ion-implantation processes using different photo-resist patterns as masks. The reduction in the number of the code selective ion-implantation processes shortens the turn around time.

It is available that the n-type impurity of each of the second and third impurities comprises one selected from the group consisting of P, As and Sb.

It is preferable that the first-code selective ion-implantation of the second impurity and the second-code selective ion-implantation of the third impurity are carried out at different doses from each other.

The use in combination of the first and second code selective ion-implantations different in dose may also reduce the number of the code selective ion-implantation processes using different photo-resist patterns as masks. The reduction in the number of the code selective ion-implantation processes shortens the turn around time.

It is also preferable that the at least first-selected one of the cell transistor channel regions comprises first-selected plural cell transistor channel regions and the at least first-selected one of the cell transistor channel regions comprises second-selected plural cell transistor channel regions, and wherein the first-selected plural cell transistor channel regions partially overlap the second-selected plural cell transistor channel regions, so that at least an overlapped cell transistor channel region belonging both the first-selected and second-selected plural cell transistor channel regions is subjected to both the first-code selective ion-implantation and subsequent the second-code selective ion-implantation.

The uses of the first and second code selective ion-implantations alone and in combination may also reduce the number of the code selective ion-implantation processes using different photo-resist patterns as masks. The reduction in the number of the code selective ion-implantation processes shortens the turn around time.

It is also preferable that each of the first-code selective ion-implantation and the second-code selective ion-implantation is carried out at an ion-implantation energy which is higher than when boron as the first impurity is doped into the all cell transistor channel regions.

The fourth present invention provides a method of setting multiple different threshold voltage levels to a plurality of cell transistor channel regions formed in a p-type silicon region for a multiple-valued mask programmable read only memory. The method comprises the steps of: carrying out a first-code selective ion-implantation, into at least a first-selected one of the plurality of cell transistor channel regions so doped with a first impurity of boron as to have a first threshold voltage level, with a second impurity of an n-type, so that the at least first-selected one of the cell transistor channel regions has a second threshold voltage level which is different from the first threshold voltage level; and carrying out a second-code selective ion-implantation of a third impurity of a p-type into at least second-selected one of the plurality of cell transistor channel regions, so that the at least second-selected one of the cell transistor channel regions has a third threshold voltage level which is different from the first and second threshold voltage levels, wherein the second impurity of the first-code selective ion-implantation is heavier than the first impurity, and the third impurity of the second-code selective ion-implantation is also heavier than the first impurity, so as to suppress any excess thermal diffusion to avoid variations in threshold voltage level of the cell transistor channel regions.

In accordance with the above fourth present invention, the second impurity of the first-code selective ion-implantation is heavier than the first impurity, and also the third impurity of the second-code selective ion-implantation is heavier than the first impurity. This means that the heavy second and third impurities are capable of suppressing any excess thermal diffusion of the impurity in the cell regions by a heat treatment to be carried out in a later manufacturing process, as compared to the first impurity. This suppression of any excess thermal diffusion results in avoidance of any substantive variations in threshold voltage level of the cell regions.

The uses of the first impurity in combination with the second impurity of the opposite conductivity type to the first impurity and also in combination with the third impurity of the opposite conductivity type to the second impurity may reduce the number of the code selective ion-implantation processes using different photo-resist patterns as masks The reduction in the number of the code selective ion-implantation processes shortens the turn around time.

It is available that the n-type impurity of the second impurity comprises one selected from the group consisting of P, As and Sb, and the p-type impurity of the third impurity comprises one selected from the group consisting of boron difluoride, gallium and indium.

It is also preferable that the first-code selective ion-implantation of the second impurity and the second-code selective ion-implantation of the third impurity are carried out at different doses from each other.

The use in combination of the first and second code selective ion-implantations different in dose may also reduce the number of the code selective ion-implantation processes using different photo-resist patterns as masks. The reduction in the number of the code selective ion-implantation processes shortens the turn around time.

It is further preferable that the at least first-selected one of the cell transistor channel regions comprises first-selected plural cell transistor channel regions and the at least first-selected one of the cell transistor channel regions comprises second-selected plural cell transistor channel regions, and wherein the first-selected plural cell transistor channel regions partially overlap the second-selected plural cell transistor channel regions, so that at least an overlapped cell transistor channel region belonging both the first-selected and second-selected plural cell transistor channel regions is subjected to both the first-code selective ion-implantation and subsequent the second-code selective ion-implantation.

It is also preferable that each of the first-code selective ion-implantation and the second-code selective ion-implantation is carried out at an ion-implantation energy which is higher than when boron as the first impurity is doped into the all cell transistor channel regions.

The fifth present invention provides a method of setting multiple different threshold voltage levels to a plurality of cell transistor channel regions formed in a p-type silicon region for a multiple-valued mask programmable read only memory. The method comprises the steps of: carrying out a first-code selective ion-implantation, into at least first-selected one of the plurality of cell transistor channel regions so doped with a first impurity of boron as to have a first threshold voltage level, with a second impurity of a p-type, so that the at least first-selected one of the cell transistor channel regions has a second threshold voltage level which is different from the first threshold voltage level; and carrying out a second-code selective ion-implantation of a third impurity of an n-type into at least second-selected one of the plurality of cell transistor channel regions, so that the at least second-selected one of the cell transistor channel regions has a third threshold voltage level which is different from the first and second threshold voltage levels, wherein the second impurity of the first-code selective ion-implantation is heavier than the first impurity, and the third impurity of the second-code selective ion-implantation is also heavier than the first impurity, so as to suppress any excess thermal diffusion to avoid variations in threshold voltage level of the cell transistor channel regions.

In accordance with the above fifth present invention, the second impurity of the first-code selective ion-implantation is heavier than the first impurity, and also the third impurity of the second-code selective ion-implantation is heavier than the first impurity. This means that the heavy second and third impurities are capable of suppressing any excess thermal diffusion of the impurity in the cell regions by a heat treatment to be carried out in a later manufacturing process, as compared to the first impurity. This suppression of any excess thermal diffusion results in avoidance of any substantive variations in threshold voltage level of the cell regions.

The uses of the first impurity in combination with the second impurity and also in combination with the third impurity of the opposite conductivity type to the first and second impurities may reduce the number of the code selective ion-implantation processes using different photoresist patterns as masks. The reduction in the number of the code selective ion-implantation processes shortens the turn around time.

It is available that the p-type impurity of the second impurity comprises one selected from the group consisting of boron difluoride, gallium and indium, and the n-type impurity of the third impurity comprises one selected from the group consisting of P, As and Sb.

It is also preferable that the first-code selective ion-implantation of the second impurity and the second-code selective ion-implantation of the third impurity are carried out at different doses from each other.

The use in combination of the first and second code selective ion-implantations different in dose may also reduce the number of the code selective ion-implantation processes using different photo-resist patterns as masks. The reduction in the number of the code selective ion-implantation processes shortens the turn around time.

It is further preferable that the at least first-selected one of the cell transistor channel regions comprises first-selected plural cell transistor channel regions and the at least first-selected one of the cell transistor channel regions comprises second-selected plural cell transistor channel regions, and wherein the first-selected plural cell transistor channel regions partially overlap the second-selected plural cell transistor channel regions, so that at least an overlapped cell transistor channel region belonging both the first-selected and second-selected plural cell transistor channel regions is subjected to both the first-code selective ion-implantation and subsequent the second-ode selective ion-implantation.

The uses of the first and second code selective ion-implantations alone and in combination may also reduce the number of the code selective ion-implantation processes using different photo-resist patterns as masks. The reduction in the number of the code selective ion-implantation processes shortens the turn around time.

It is also preferable that each of the first-code selective ion-implantation and the second-code selective ion-implantation is carried out at an ion-implantation energy which is higher than when boron as the first impurity is doped into the all cell transistor channel regions.

PREFERRED EMBODIMENTS

First Embodiments

A first embodiment according to the present invention will be described in detail with reference to FIGS. 4A through 4G which are fragmentary cross sectional elevation views illustrative of sequential steps involved in a novel method of setting multiple different threshold voltage levels to cell transistor channel regions of a multiple-valued programmable read only memory. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 4A:
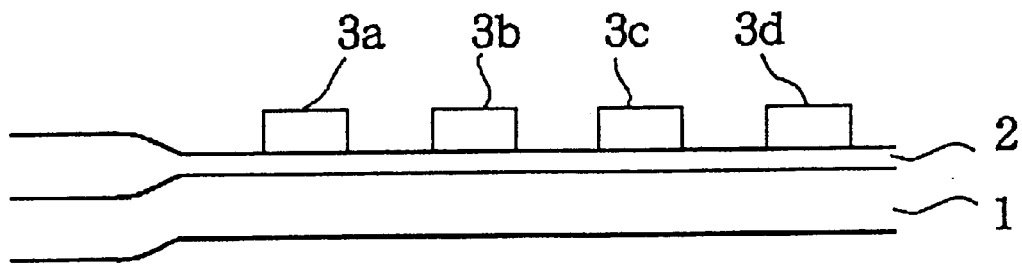
FIGS. 4A through 4G are fragmentary cross sectional elevation views illustrative of sequential steps involved in a novel method of setting multiple different threshold voltage levels to cell transistor channel regions of a multiple-valued programmable read only memory in a first embodiment in accordance with the present invention.

With reference to FIG. 4A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 4B:
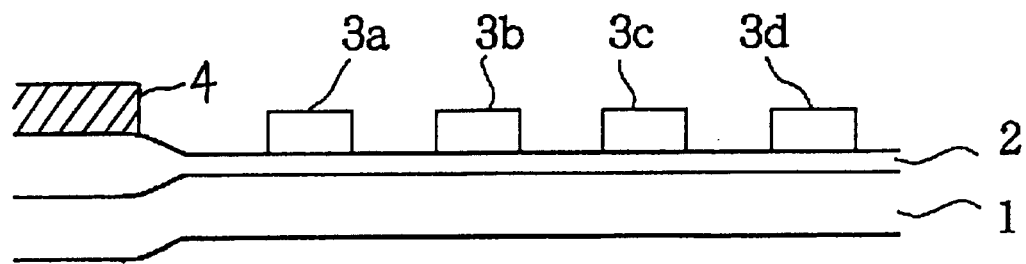

With reference to FIG. 4B, a photo-resist is applied on an entire surface of the silicon substrate for subsequent photolithography process to form a photo-resist pattern 4 over the filed oxide film so that the photo-resist pattern has an opening positioned over the active region or the gate electrodes 3a, 3b, 3c and 3d.

Figure 4C:
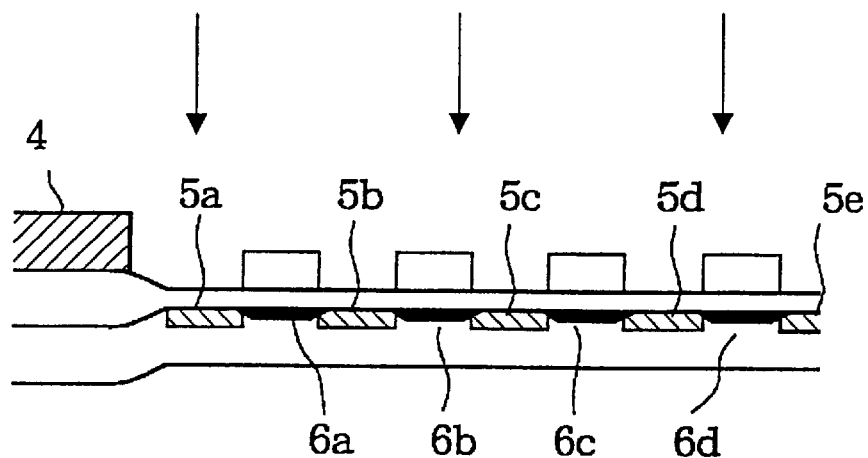

With reference to FIG. 4C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1\times10^{13}$ cm$^{-2}$. The formations of the p-type isolation regions 5a, 5b, 5c, 5d and 5e define first to fourth cell transistor channel regions 6a, 6b, 6c and 6d. The first cell transistor channel region 6a is defined between the first and second p-type isolation regions 5a and 5b and also is positioned under the first gate electrode 3a. The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c. The fourth cell transistor channel region 6d is defined between the fourth and fifth p-type isolation regions 5d and 5e and also is positioned under the fourth gate electrode 3d.

Figure 4D:
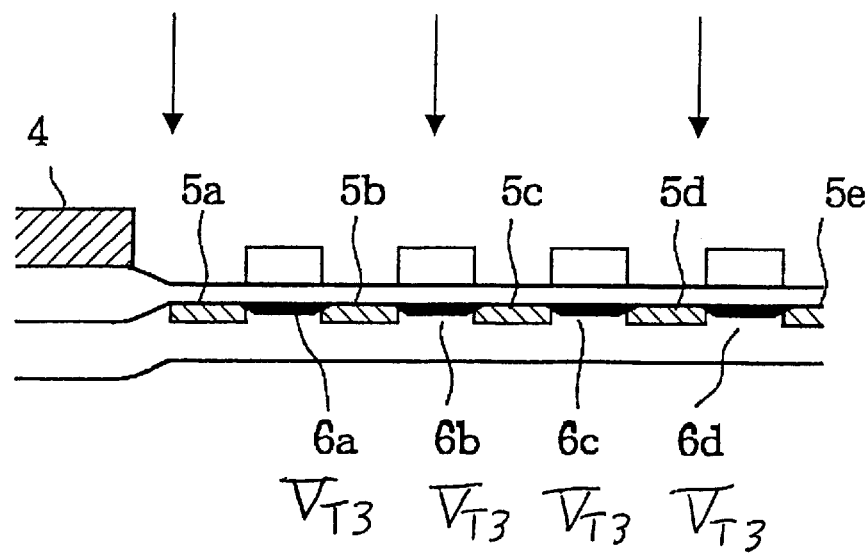

With reference to FIG. 4D, an ion-implantation of boron is carried out by use of the above photo-resist pattern 4 as a mask at an ion-implantation energy of 150 KeV and a dose in the range of about $8.0\times10^{13}$ to about $8.0\times10^{14}$, so that boron atoms penetrate through the gate oxide film 2 and the first to fourth gate electrodes 3a, 3b, 3c and 3d and are ion-implanted into not only the p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the boron atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the fourth threshold voltage level $V_{T3}$ as the highest threshold voltage level.

Figure 4E:
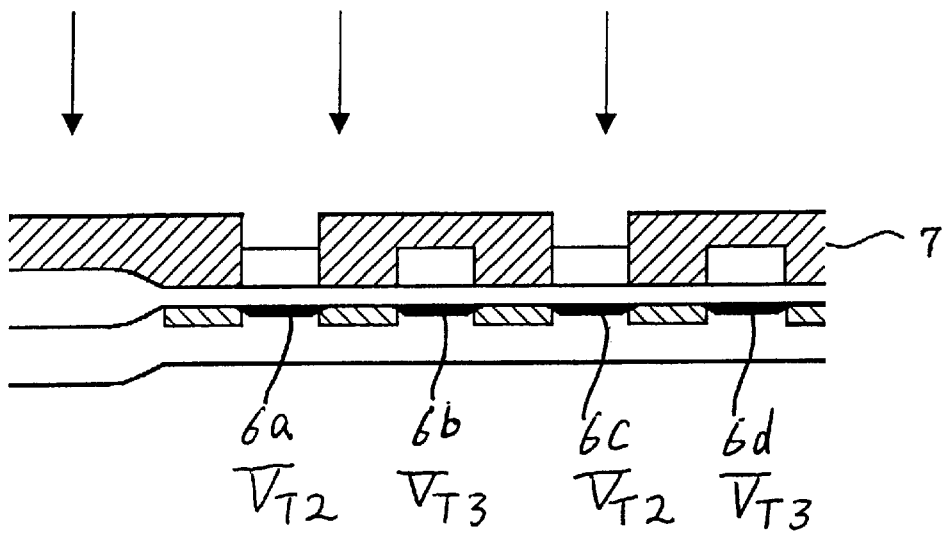

With reference to FIG. 4E, the used first photo-resist pattern 4 is removed before a second photo-resist pattern 7 is formed over the silicon substrate. The second photo-resist pattern 7 has two openings which are positioned over the first gate electrode 3a and the third gate electrode 3c respectively, so that the first and third gate electrodes 3a and 3c are shown through the two openings of the second photo-resist pattern 7, whilst the second and fourth gate electrodes 3b and 3d as well as the gate oxide film 2 and the field oxide film are covered by the second photo-resist pattern 7. A first code ion-implantation of phosphorus is carried out at an ion-implantation energy of 360 KeV and at a dose in the range of $4.0 \times 10^{12}$ cm$^{-2}$ to $5.0 \times 10^{12}$ cm$^{-2}$ by use of the second photo-resist pattern 7 as a mask, so that phosphorus atoms penetrate the first and third gate electrodes 3a and 3c and the gate oxide film 2 and are ion-implanted into the first and third cell transistor channel regions 6a and 6c positioned under the first and third gate electrodes 3a and 3c shown through the openings of the second photo-resist pattern 7, whereby the first and third cell transistor channel regions 6a and 6c having the fourth threshold voltage level $V_{T3}$ as the highest threshold voltage level drop in threshold voltage level by one level to the third threshold voltage level $V_{T2}$ as the second highest threshold voltage level, while the second and fourth cell transistor channel regions 6b and 6d having the fourth threshold voltage level $V_{T3}$ as the highest threshold voltage level remain unchanged in threshold voltage level. As a result of the first code ion-implantation, the first and third cell transistor channel regions 6a and 6c have the third threshold voltage level $V_{T2}$ as the second highest threshold voltage level. The second and fourth cell transistor channel regions 6b and 6d have the fourth threshold voltage level $V_{T3}$ as the highest threshold voltage level.

Figure 4F:
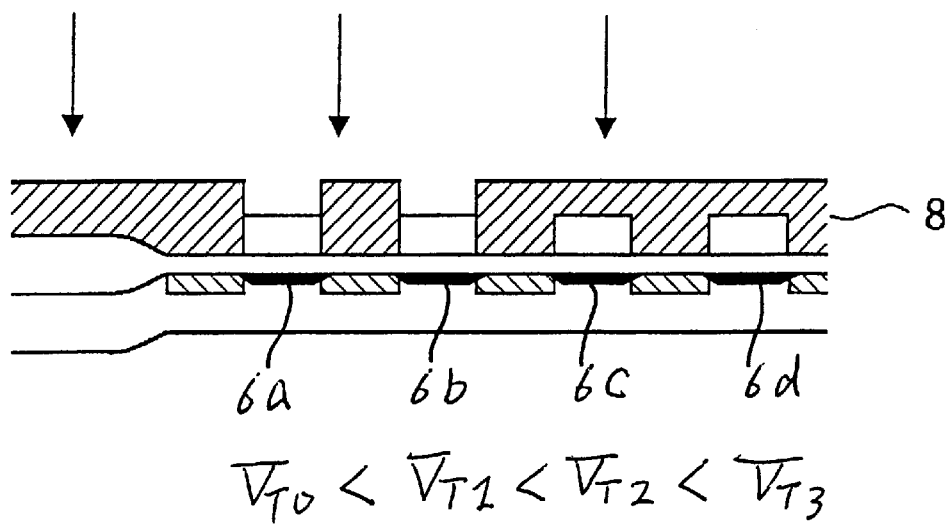

With reference to FIG. 4F, the used second photo-resist pattern 7 is removed before a third photo-resist pattern 8 is formed over the silicon substrate. The third photo-resist pattern 8 has two openings which are positioned over the first gate electrode 3a and the second gate electrode 3b respectively, so that the first and second gate electrodes 3a and 3b are shown through the two openings of the third photo-resist pattern 8, whilst the third and fourth gate electrodes 3c and 3d as well as the gate oxide film 2 and the field oxide film are covered by the third photo-resist pattern 8. A second code ion-implantation of phosphorus is carried out at an ion-implantation energy of 360 KeV and at a dose in the range of $9.0 \times 10^{12}$ cm$^{-2}$ to $1.0 \times 10^{13}$ cm$^{-2}$ by use of the third photo-resist pattern 8 as a mask, so that phosphorus atoms penetrate the first and second gate electrodes 3a and 3b and the gate oxide film 2 and are ion-implanted into the first and second cell transistor channel regions 6a and 6b positioned under the first and second gate electrodes 3a and 3b shown through the openings of the third photo-resist pattern 8, whereby the first cell transistor channel region 6a having the third threshold voltage level $V_{T2}$ as the second highest threshold voltage level drops in threshold voltage level by two levels to the first threshold voltage level $V_{T0}$ as the lowest threshold voltage level as well as the second cell transistor channel region 6b having the fourth threshold voltage level $V_{T3}$ as the highest threshold voltage level drops in threshold voltage level by two levels to the second threshold voltage level $V_{T1}$ as the second lowest threshold voltage level. In the meantime, the third cell transistor channel region 6c having the third threshold voltage level $V_{T2}$ as the second highest threshold voltage level remain unchanged in threshold voltage level as well as the fourth cell transistor channel region 6d having the fourth threshold voltage level $V_{T3}$ as the highest threshold voltage level remain unchanged in threshold voltage level. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level.

Figure 4G:
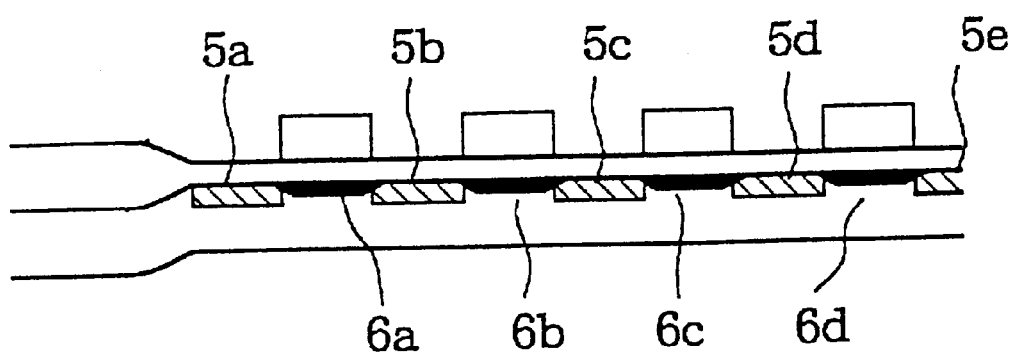

With reference to FIG. 4G, the used third photo-resist pattern 8 is removed. Implementation of the above combined two code ion-implantations, for example, the first and second code ion-implantation processes could set four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d, whereby the first cell transistor channel region 6a has the first threshold voltage level $V_{T0}$ as the lowest threshold voltage level, the second cell transistor channel region 6b has the second threshold voltage level $V_{T1}$ as the second lowest threshold voltage level, the third cell transistor channel region 6c has the third threshold voltage level $V_{T2}$ as the second highest threshold voltage level, and the fourth cell transistor channel region 6d has the fourth threshold voltage level $V_{T3}$ as the highest threshold voltage level. By contrast to the above present invention, it is necessary for the conventional method to implement three or more code ion-implantation processes as described above. The above novel method could reduce the number of the necessary code ion-implantation processes to set the four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting phosphorus which is heavier than boron. Phosphorus impurity heavier than boron impurity is capable of suppressing any excess thermal diffusion of the impurity in the first, second, third and fourth cell transistor channel regions 6a, 6b, 6c and 6d by a heat treatment to be carried out in a later manufacturing process, as compared to boron impurity. This suppression of any excess thermal diffusion results in avoidance of any substantive variations in threshold voltage level of the cell transistor channel regions 6a, 6b, 6c and 6d by the heat treatment.

Figure 5:
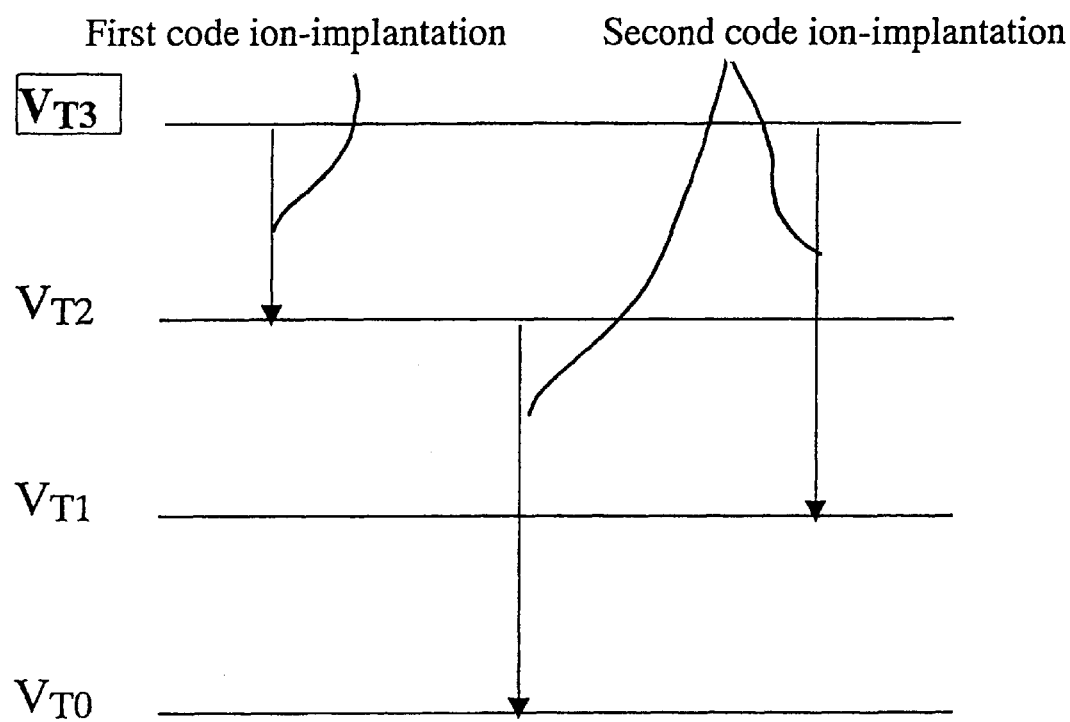
FIG. 5 is a diagram illustrative of changes in threshold voltage level of cell transistor channel regions upon first and second code selective ion-implantations for setting multiple different threshold voltage levels of a multiple-valued programmable read only memory in a first embodiment in accordance with the present invention.

FIG. 5 is a diagram illustrative of changes in threshold voltage level of cell transistor channel regions upon first and second code selective ion-implantations for setting multiple different threshold voltage levels of a multiple-valued programmable read only memory. The ion-implantation of boron is carried out to set the uniform threshold voltage level, for example, the fourth threshold voltage level $V_{T3}$ to all of the cell transistor channel regions 6a, 6b, 6c and 6d. The first code ion-implantation of phosphorus to the first and third cell transistor channel regions 6a and 6c is then carried out at the first level dose so that the fourth threshold voltage level $V_{T3}$ of the first and third cell transistor channel regions 6a and 6c is dropped by one level into the third threshold voltage level $V_{T2}$, while the fourth threshold voltage level $V_{T3}$ of the second and fourth cell transistor channel regions 6b and 6d remains unchanged. Subsequently, the second code ion-implantation of phosphorus to the first and second cell transistor channel regions 6a and 6b is then carried out at the second level dose so that the third threshold voltage level $V_{T2}$ of the first cell transistor channel region 6a is dropped by two levels into the first threshold voltage level $V_{T0}$, and the fourth threshold voltage level $V_{T3}$ of the second cell transistor channel region 6b is also dropped by two levels into the second threshold voltage level $V_{T1}$. In the meantime, the third threshold voltage level $V_{T2}$ of the third cell transistor channel region 6c and the fourth threshold voltage level $V_{T3}$ of the fourth cell transistor channel region 6d remain unchanged. As a result of the second code ion-implantation, the first cell transistor channel region 6a has the first threshold voltage level $V_{T0}$ as the lowest threshold voltage level. The second cell transistor channel region 6b has the second threshold voltage level $V_T$, as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level. The difference in dose of the first and second code ion-implantations shortens the number of the necessary steps to set the four different threshold voltage levels.

Second Embodiment

A second embodiment according to the present invention will be described in detail with reference to FIGS. 6A through 6G which are fragmentary cross sectional elevation views illustrative of sequential steps involved in a novel method of setting multiple different threshold voltage levels to cell transistor channel regions of a multiple-valued programmable read only memory. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 6A:
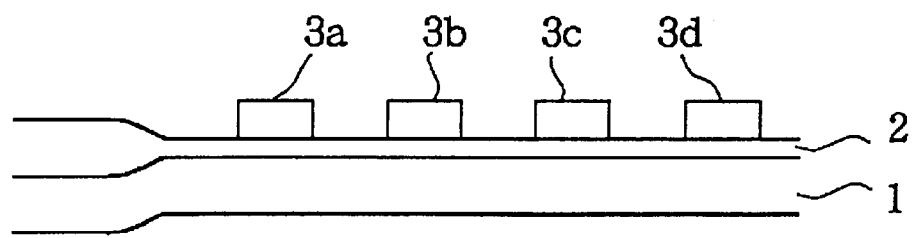
FIGS. 6A through 6G are fragmentary cross sectional elevation views illustrative of sequential steps involved in a novel method of setting multiple different threshold voltage levels to cell transistor channel regions of a multiple-valued programmable read only memory in a second embodiment in accordance with the present invention.

With reference to FIG. 6A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 6B:
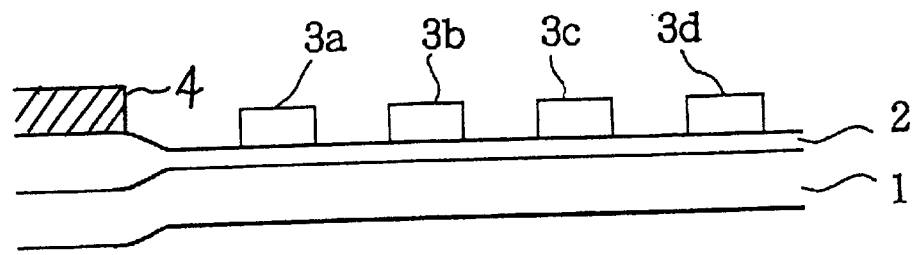

With reference to FIG. 6B, a photo-resist is applied on an entire surface of the silicon substrate for subsequent photolithography process to form a photo-resist pattern 4 over the filed oxide film so that the photo-resist pattern has an opening positioned over the active region or the gate electrodes 3a, 3b, 3c and 3d.

Figure 6C:
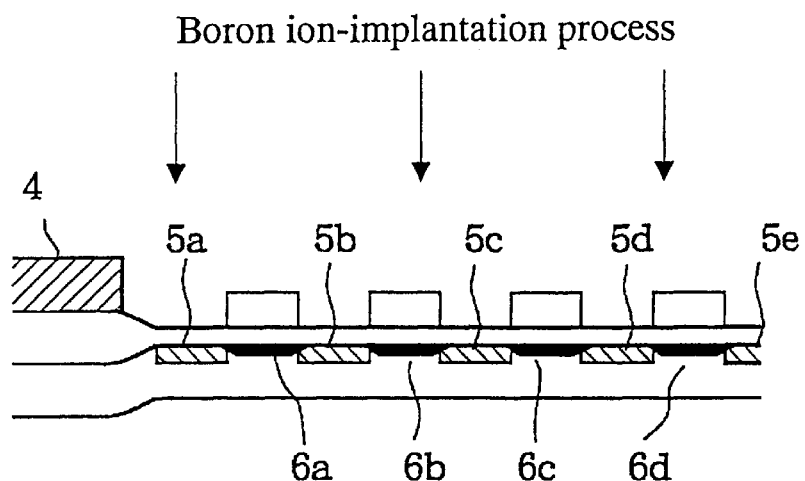

With reference to FIG. 6C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1 \times 10^{13}$ cm$^{-2}$ The formations of the p-type isolation regions 5a, 5b, 5c, 5d and 5e define first to fourth cell transistor channel regions 6a, 6b, 6c and 6d. The first cell transistor channel region 6a is defined between the first and second p-type isolation regions 5a and 5b and also is positioned under the first gate electrode 3a. The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c. The fourth cell transistor channel region 6d is defined between the fourth and fifth p-type isolation regions 5d and 5e and also is positioned under the fourth gate electrode 3d.

Figure 6D:
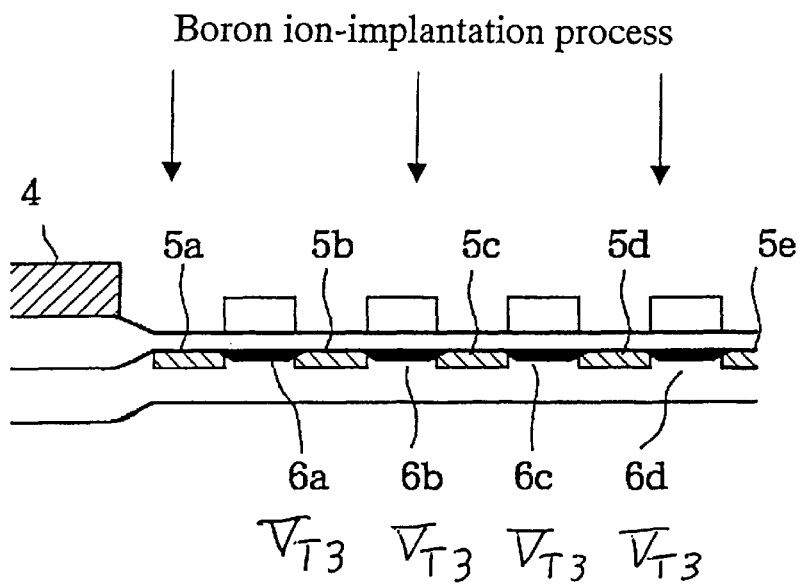

With reference to FIG. 6D, an ion-implantation of boron is carried out by use of the above photo-resist pattern 4 as a mask at an ion-implantation energy of 150 KeV and a dose in the range of about $8.0 \times 10^{13}$ to about $8.0 \times 10^{14}$ cm$^{-2}$, so that boron atoms penetrate through the gate oxide film 2 and the first to fourth gate electrodes 3a, 3b, 3c and 3d and are ion-implanted into not only the p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the boron atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the fourth threshold voltage level $V_{T3}$ as the highest threshold voltage level.

Figure 6E:
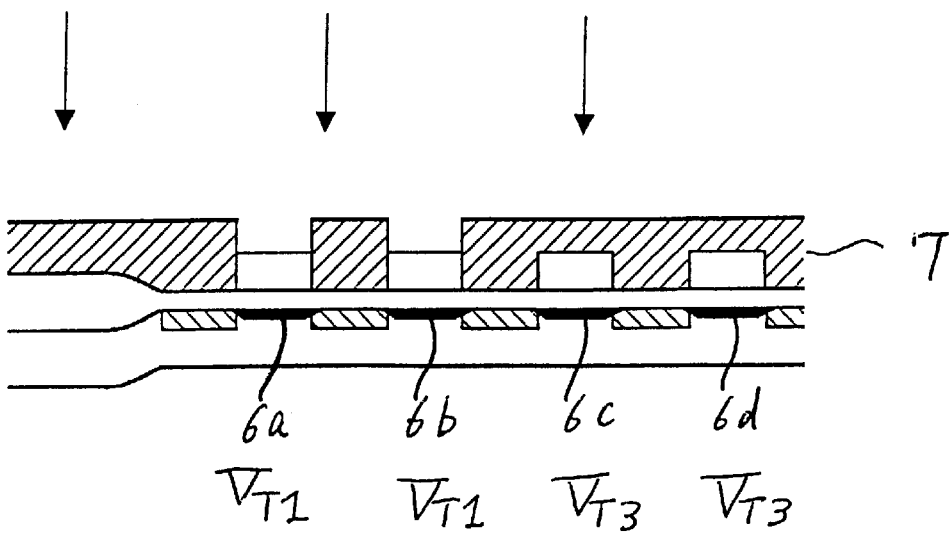

With reference to FIG. 6E, the used first photo-resist pattern 4 is removed before a second photo-resist pattern 7 is formed over the silicon substrate. The second photo-resist pattern 7 has two openings which are positioned over the first gate electrode 3a and the second gate electrode 3b respectively, so that the first and second gate electrodes 3a and 3b are shown through the two openings of the second photo-resist pattern 7, whilst the third and fourth gate electrodes 3c and 3d as well as the gate oxide film 2 and the field oxide film are covered by the second photo-resist pattern 7. A first code ion-implantation of phosphorus is carried out at an ion-implantation energy of 360 KeV and at a dose in the range of $9.0 \times 10^{12}$ cm$^{-2}$ to $1.0 \times 10^{13}$ cm$^{-2}$ by use of the second photo-resist pattern 7 as a mask, so that phosphorus atoms penetrate the first and second gate electrodes 3a and 3b and the gate oxide film 2 and are ion-implanted into the first and second cell transistor channel regions 6a and 6b positioned under the first and second gate electrodes 3a and 3b shown through the openings of the second photo-resist pattern 7, whereby the first and second cell transistor channel regions 6a and 6b having the fourth threshold voltage level $V_{T3}$ as the highest threshold voltage level drop in threshold voltage level by two levels to the second threshold voltage level $V_{T1}$ as the second lowest threshold voltage level, whilst the third and fourth cell transistor channel regions 6c and 6d having the fourth threshold voltage level $V_{T3}$ as the highest threshold voltage level remain unchanged in threshold voltage level. As a result of the first code ion-implantation, the first and second cell transistor channel regions 6a and 6b have the second threshold voltage level $V_{T1}$ as the second lowest threshold voltage level. The third and fourth cell transistor channel regions 6c and 6d have the fourth threshold voltage level $V_{T3}$ as the highest threshold voltage level.

Figure 6F:
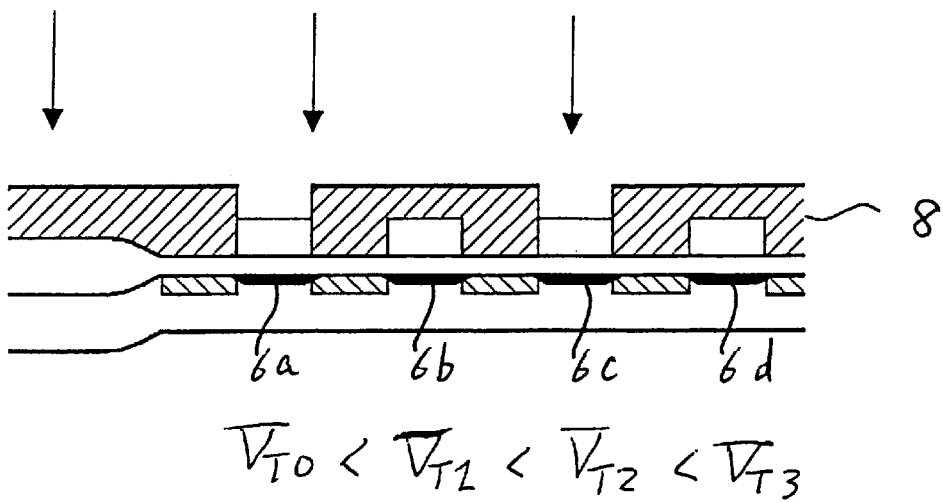

With reference to FIG. 6F, the used second photo-resist pattern 7 is removed before a third photo-resist pattern 8 is formed over the silicon substrate. The third photo-resist pattern 8 has two openings which are positioned over the first gate electrode 3a and the third gate electrode 3c respectively, so that the first and third gate electrodes 3a and 3c are shown through the two openings of the third photo-resist pattern 8, whilst the second and fourth gate electrodes 3b and 3d as well as the gate oxide film 2 and the field oxide film are covered by the third photo-resist pattern 8. A second code ion-implantation of phosphorus is carried out at an ion-implantation energy of 360 KeV and at a dose in the range of $4.0 \times 10^{12}$ cm$^{-2}$ to $5.0 \times 10^{12}$ cm$^{-2}$ by use of the third photo-resist pattern 8 as a mask, so that phosphorus atoms penetrate the first and third gate electrodes 3a and 3c and the gate oxide film 2 and are ion-implanted into the first and third cell transistor channel regions 6a and 6c positioned under the first and third gate electrodes 3a and 3c shown through the openings of the third photo-resist pattern 8, whereby the first cell transistor channel region 6a having the second threshold voltage level $V_{T1}$ as the second lowest threshold voltage level drops in threshold voltage level by one level to the first threshold voltage level $V_{T0}$ as the lowest threshold voltage level as well as the third cell transistor channel region 6c having the fourth threshold voltage level $V_{T3}$ as the highest threshold voltage level drops in threshold voltage level by one level to the third threshold voltage level $V_{T2}$ as the second highest threshold voltage level. In the meantime, the second cell transistor channel region 6b having the second threshold voltage level $V_{T1}$ as the second lowest threshold voltage level remain unchanged in threshold voltage level as well as the fourth cell transistor channel region 6d having the fourth threshold voltage level $V_{T3}$ as the highest threshold voltage level remain unchanged in threshold voltage level. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level.

Figure 6G:
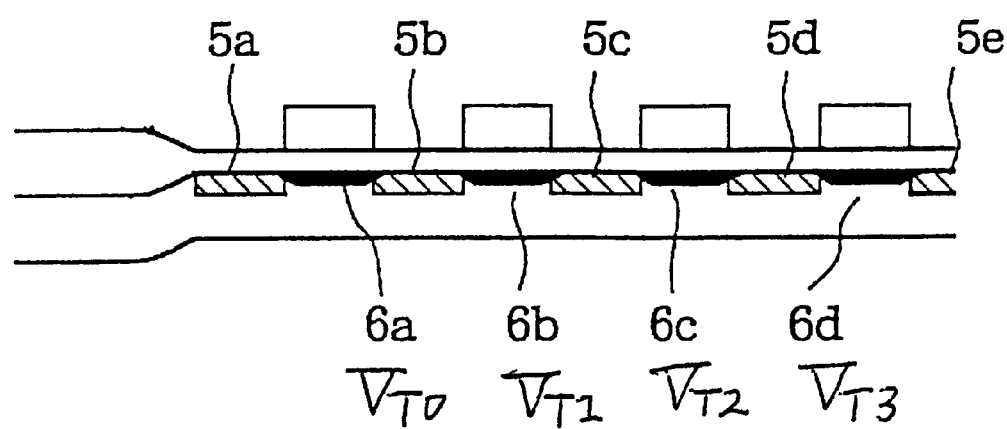

With reference to FIG. 6G, the used third photo-resist pattern 8 is removed. Implementation of the above combined two code ion-implantations, for example, the first and second code ion-implantation processes could set four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d, whereby the first cell transistor channel region 6a has the first threshold voltage level $V_{T0}$ as the lowest threshold voltage level, the second cell transistor channel region 6b has the second threshold voltage level $V_{T1}$ as the second lowest threshold voltage level, the third cell transistor channel region 6c has the third threshold voltage level $V_{T2}$ as the second highest threshold voltage level, and the fourth cell transistor channel region 6d has the fourth threshold voltage level $V_{T3}$ as the highest threshold voltage level. By contrast to the above present invention, it is necessary for the conventional method to implement three or more code ion-implantation processes as described above. The above novel method could reduce the number of the necessary code ion-implantation processes to set the four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting phosphorus which is heavier than boron. Phosphorus impurity heavier than boron impurity is capable of suppressing any excess thermal diffusion of the impurity in the first, second, third and fourth cell transistor channel regions 6a, 6b, 6c and 6d by a heat treatment to be carried out in a later manufacturing process, as compared to boron impurity This suppression of any excess thermal diffusion results in avoidance of any substantive variations in threshold voltage level of the cell transistor channel regions 6a, 6b, 6c and 6d by the heat treatment.

Figure 7:
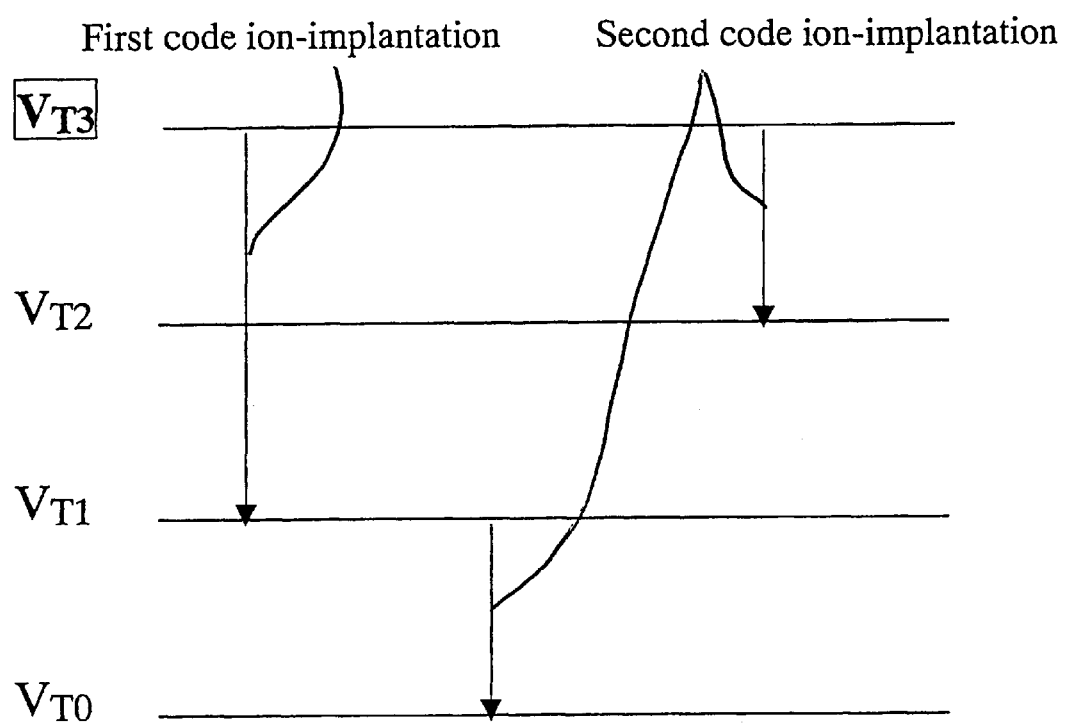
FIG. 7 is a diagram illustrative of changes in threshold voltage level of cell transistor channel regions upon first and second code selective ion-implantations for setting multiple different threshold voltage levels of a multiple-valued programmable read only memory in a second embodiment in accordance with the present invention.

FIG. 7 is a diagram illustrative of changes in threshold voltage level of cell transistor channel regions upon first and second code selective ion-implantations for setting multiple different threshold voltage levels of a multiple-valued programmable read only memory. The ion-implantation of boron is carried out to set the uniform threshold voltage level, for example, the fourth threshold voltage level $V_{T3}$ to all of the cell transistor channel regions 6a, 6b, 6c and 6d. The first code ion-implantation of phosphorus to the first and second cell transistor channel regions 6a and 6b is then carried out at the second level dose so that the fourth threshold voltage level $V_{T3}$ of the first and second cell transistor channel regions 6a and 6b is dropped by two levels into the second threshold voltage level $V_{T1}$, whilst the fourth threshold voltage level $V_{T3}$ of the third and fourth cell transistor channel regions 6c and 6d remains unchanged. Subsequently, the second code ion-implantation of phosphorus to the first and third cell transistor channel regions 6a and 6c is then carried out at the first level dose so that the second threshold voltage level $V_{T1}$ of the first cell transistor channel region 6a is dropped by one level into the first threshold voltage level $V_{T0}$, and the fourth threshold voltage level $V_{T3}$ of the third cell transistor channel region 6c is also dropped by one level into the third threshold voltage level $V_{T2}$. In the meantime, the second threshold voltage level $V_{T1}$ of the second cell transistor channel region 6b and the fourth threshold voltage level $V_{T3}$ of the fourth cell transistor channel region 6d remain unchanged. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level. The difference in dose of the first and second code ion-implantations shortens the number of the necessary steps to set the four different threshold voltage levels.

Third Embodiment

A third embodiment according to the present invention will be described in detail with reference to FIGS. 8A through 8G which are fragmentary cross sectional elevation views illustrative of sequential steps involved in a novel method of setting multiple different threshold voltage levels to cell transistor channel regions of a multiple-valued programmable read only memory. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 8A:
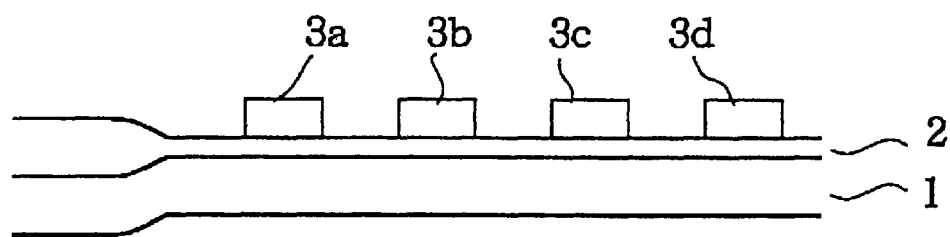
FIGS. 8A through 8G are fragmentary cross sectional elevation views illustrative of sequential steps involved in a novel method of setting multiple different threshold voltage levels to cell transistor channel regions of a multiple-valued programmable read only memory in a third embodiment in accordance with the present invention.

With reference to FIG. 8A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 8B:
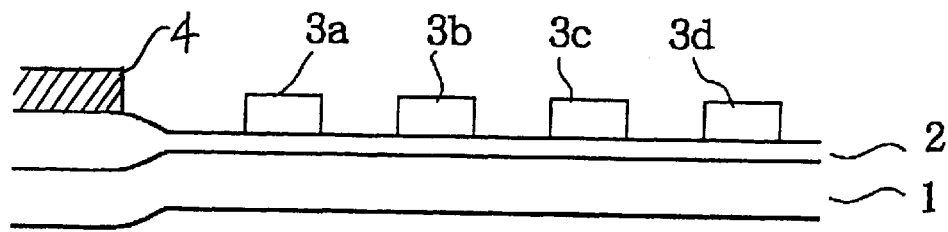

With reference to FIG. 8B, a photo-resist is applied on an entire surface of the silicon substrate for subsequent photolithography process to form a photo-resist pattern 4 over the filed oxide film so that the photo-resist pattern has an opening positioned over the active region or the gate electrodes 3a, 3b, 3c and 3d.

Figure 8C:
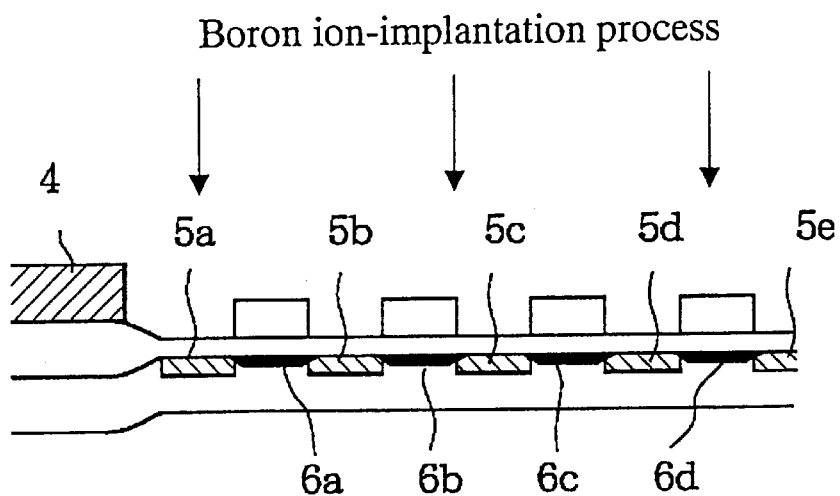

With reference to FIG. 8C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1 \times 10^{13}$ cm$^{-2}$. The formations of the p-type isolation regions 5a, 5b, 5c, 5d and 5e define first to fourth cell transistor channel regions 6a, 6b, 6c and 6d. The first cell transistor channel region 6a is defined between the first and second p-type isolation regions 5a and 5b and also is positioned under the first gate electrode 3a. The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c. The fourth cell transistor channel region 6d is defined between the fourth and fifth p-type isolation regions 5d and 5e and also is positioned under the fourth gate electrode 3d.

Figure 8D:
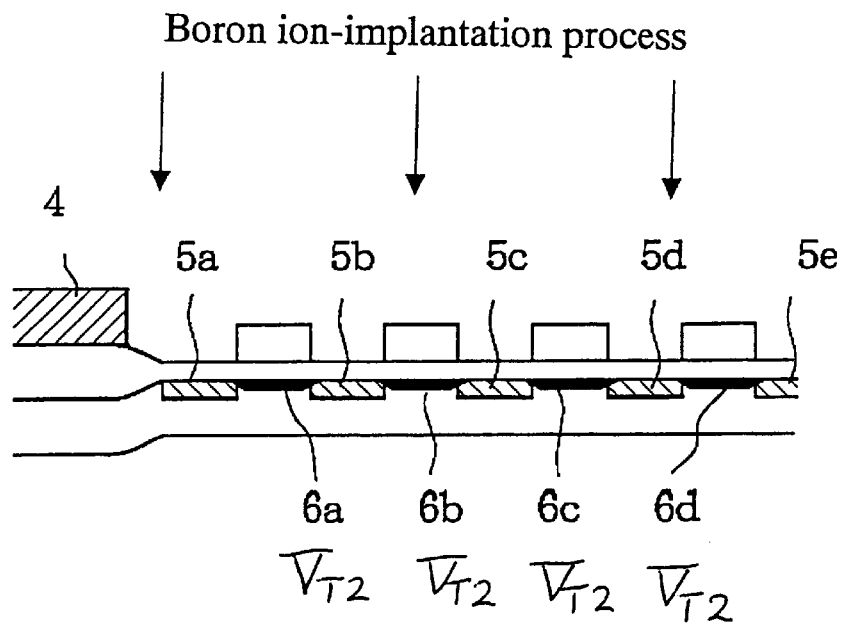

With reference to FIG. 8D, an ion-implantation of boron is carried out by use of the above photo-resist pattern 4 as a mask, so that boron atoms penetrate through the gate oxide film 2 and the first to fourth gate electrodes 3a, 3b, 3c and 3d and are ion-implanted into not only the p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the boron atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the third threshold voltage level $V_{T2}$ as the second highest threshold voltage level.

Figure 8E:
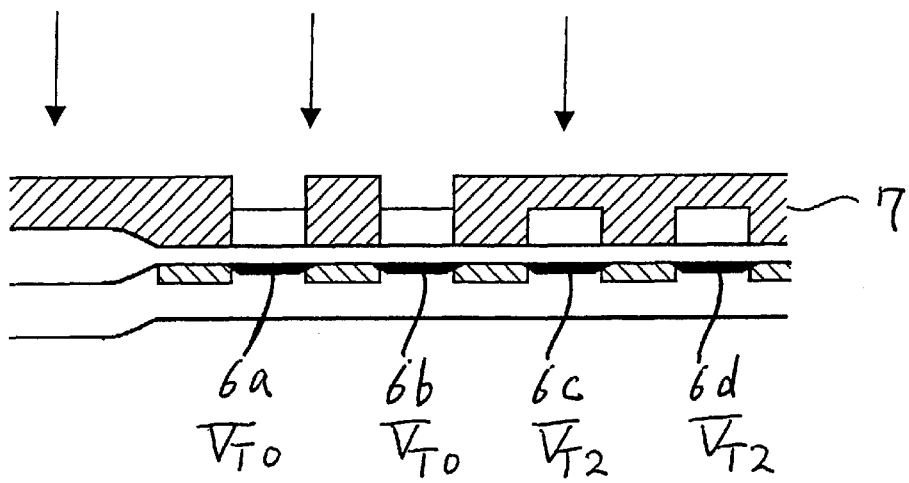

With reference to FIG. 8E, the used first photo-resist pattern 4 is removed before a second photo-resist pattern 7 is formed over the silicon substrate. The second photo-resist pattern 7 has two openings which are positioned over the first gate electrode 3a and the second gate electrode 3b respectively, so that the first and second gate electrodes 3a and 3b are shown through the two openings of the second photo-resist pattern 7, whilst the third and fourth gate electrodes 3c and 3d as well as the gate oxide film 2 and the field oxide film are covered by the second photo-resist pattern 7. A first code ion-implantation of phosphorus is carried out at an ion-implantation energy of 360 KeV and at a dose in the range of $9.0 \times 10^{12}$ cm$^{-2}$ to $1 \times 10^{13}$ cm$^{-2}$ by use of the second photo-resist pattern 7 as a mask, so that phosphorus atoms penetrate the first and second gate electrodes 3a and 3b and the gate oxide film 2 and are ion-implanted into the first and second cell transistor channel regions 6a and 6b positioned under the first and second gate electrodes 3a and 3b shown through the openings of the second photo-resist pattern 7, whereby the first and second cell transistor channel regions 6a and 6b having the third threshold voltage level $V_{T2}$ as the second highest threshold voltage level drop in threshold voltage level by two levels to the first threshold voltage level $V_{T0}$ as the lowest threshold voltage level, whilst the third and fourth cell transistor channel regions 6c and 6d having the third threshold voltage level $V_{T2}$ as the second highest threshold voltage level remain unchanged in threshold voltage level. As a result of the first code ion-implantation, the first and second cell transistor channel regions 6a and 6b have the first threshold voltage level $V_{T0}$ as the lowest threshold voltage level. The third and fourth cell transistor channel regions 6c and 6d have the third threshold voltage level $V_{T2}$ as the second highest threshold voltage level.

Figure 8F:
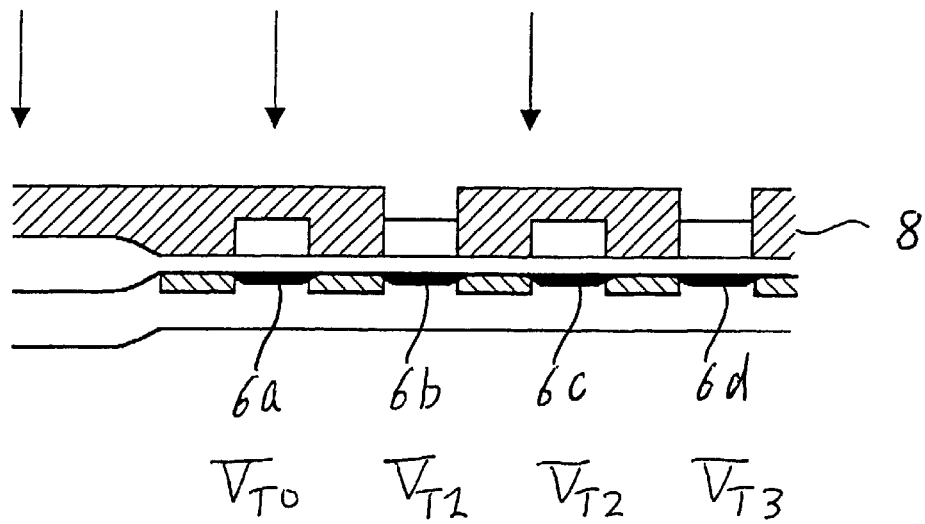

With reference to FIG. 8F, the used second photo-resist pattern 7 is removed before a third photo-resist pattern 8 is formed over the silicon substrate. The third photo-resist pattern 8 has two openings which are positioned over the second gate electrode 3b and the fourth gate electrode 3d respectively, so that the second and fourth gate electrodes 3b and 3d are shown through the two openings of the third photo-resist pattern 8, whilst the first and third gate electrodes 3a and 3c as well as the gate oxide film 2 and the field oxide film are covered by the third photo-resist pattern 8. A second code ion-implantation of boron difluoride is carried out at an ion-implantation energy of 360 KeV and at a dose in the range of $4.0 \times 10^{12}$ cm$^{-2}$ to $5.0 \times 10^{12}$ cm$^{-2}$ by use of the third photo-resist pattern 8 as a mask, so that boron difluoride molecules penetrate the second and fourth gate electrodes 3b and 3d and the gate oxide film 2 and are ion-implanted into the second and fourth cell transistor channel regions 6b and 6d positioned under the second and fourth gate electrodes 3b and 3d shown through the openings of the third photo-resist pattern 8, whereby the second cell transistor channel region 6b having the first threshold voltage level $V_{T0}$ as the lowest threshold voltage level rises in threshold voltage level by one level to the second threshold voltage level $V_{T1}$ as the second lowest threshold voltage level as well as the fourth cell transistor channel region 6d having the third threshold voltage level $V_{T2}$ as the second highest threshold voltage level rises in threshold voltage level by one level to the fourth threshold voltage level $V_{T3}$ as the highest threshold voltage level. In the meantime, the first cell transistor channel region 6a having the first threshold voltage level $V_{T0}$ as the lowest threshold voltage level remain unchanged in threshold voltage level as well as the third cell transistor channel region 6c having the third threshold voltage level $V_{T2}$ as the second highest threshold voltage level remain unchanged in threshold voltage level. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level.

Figure 8G:
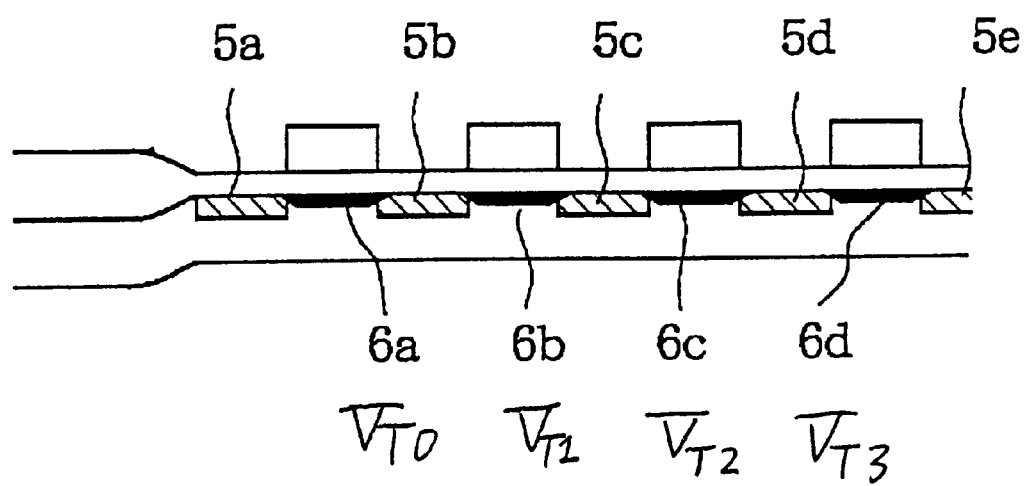

With reference to FIG. 8G, the used third photo-resist pattern 8 is removed. Implementation of the above combined two code ion-implantations, for example, the first and second code ion-implantation processes could set four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d, whereby the first cell transistor channel region 6a has the first threshold voltage level $V_{T0}$ as the lowest threshold voltage level, the second cell transistor channel region 6b has the second threshold voltage level $V_{T1}$ as the second lowest threshold voltage level, the third cell transistor channel region 6c has the third threshold voltage level $V_{T2}$ as the second highest threshold voltage level, and the fourth cell transistor channel region 6d has the fourth threshold voltage level $V_{T3}$ as the highest threshold voltage level. By contrast to the above present invention, it is necessary for the conventional method to implement three or more code ion-implantation processes as described above. The above novel method could reduce the number of the necessary code ion-implantation processes to set the four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting phosphorus and boron difluoride which are heavier than boron. Phosphorus impurity and boron difluoride impurity heavier than boron impurity are capable of suppressing any excess thermal diffusion of the impurity in the first, second, third and fourth cell transistor channel regions 6a, 6b, 6c and 6d by a heat treatment to be carried out in a later manufacturing process, as compared to boron impurity This suppression of any excess thermal diffusion results in avoidance of any substantive variations in threshold voltage level of the cell transistor channel regions 6a, 6b, 6c and 6d by the heat treatment.

Figure 9:
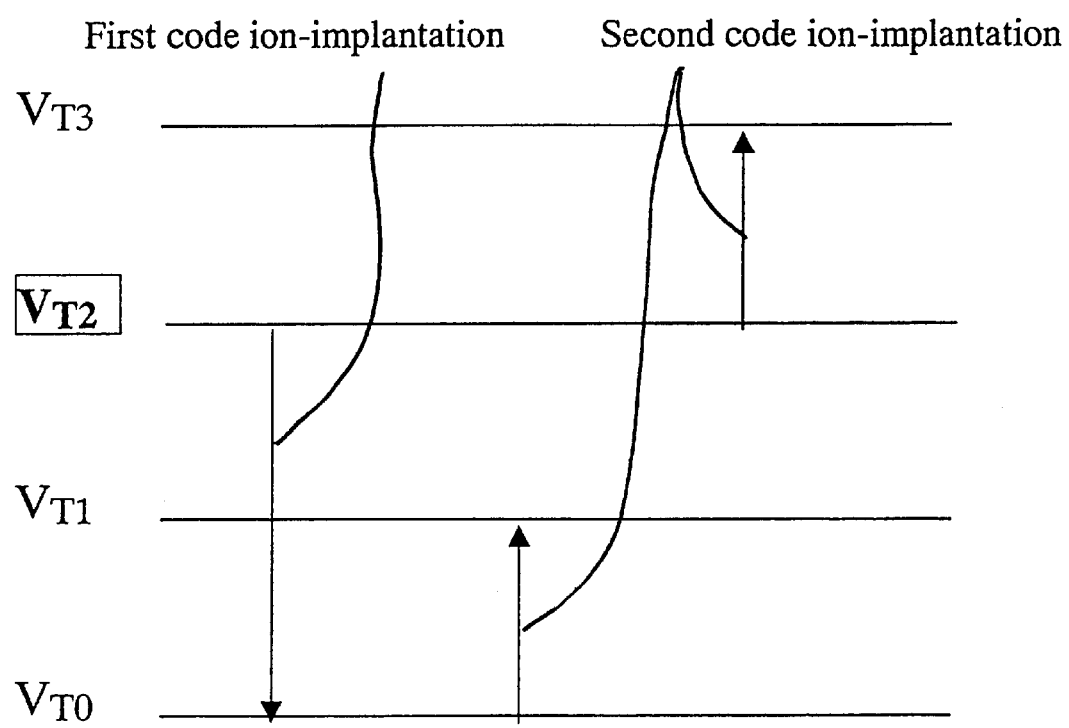
FIG. 9 is a diagram illustrative of changes in threshold voltage level of cell transistor channel regions upon first and second code selective ion-implantations for setting multiple different threshold voltage levels of a multiple-valued programmable read only memory in a third embodiment in accordance with the present invention.

FIG. 9 is a diagram illustrative of changes in threshold voltage level of cell transistor channel regions upon first and second code selective ion-implantations for setting multiple different threshold voltage levels of a multiple-valued programmable read only memory. The ion-implantation of boron is carried out to set the uniform threshold voltage level, for example, the third threshold voltage level $V_{T2}$ to all of the cell transistor channel regions 6a, 6b, 6c and 6d. The first code ion-implantation of phosphorus to the first and second cell transistor channel regions 6a and 6b is then carried out at the two level dose so that the third threshold voltage level $V_{T2}$ of the first and second cell transistor channel regions 6a and 6b is dropped by two levels into the first threshold voltage level $V_{T0}$, whilst the third threshold voltage level $V_{T2}$ of the third and fourth cell transistor channel regions 6c and 6d remains unchanged. Subsequently, the second code ion-implantation of boron difluoride to the second and fourth cell transistor channel regions 6b and 6d is then carried out at the first level dose so that the first threshold voltage level $V_{T0}$ of the second cell transistor channel region 6b is risen by one level into the second threshold voltage level $V_{T1}$, and the third threshold voltage level $V_{T2}$ of the fourth cell transistor channel region 6d is also risen by one level into the fourth threshold voltage level $V_{T3}$. In the meantime, the first threshold voltage level $V_{T0}$ of the first cell transistor channel region 6a and the third threshold voltage level $V_{T2}$ of the third cell transistor channel region 6c remain unchanged. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level. The difference in dose of the first and second code ion-implantations shortens the number of the necessary steps to set the four different threshold voltage levels.

Fourth Embodiment

A fourth embodiment according to the present invention will be described in detail with reference to FIGS. 10A through 10G which are fragmentary cross sectional elevation views illustrative of sequential steps involved in a novel method of setting multiple different threshold voltage levels to cell transistor channel regions of a multiple-valued programmable read only memory. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 10A:
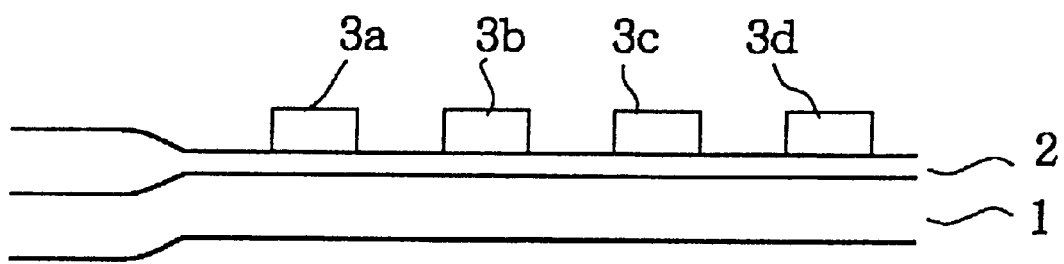
FIGS. 10A through 10G are fragmentary cross sectional elevation views illustrative of sequential steps involved in a novel method of setting multiple different threshold voltage levels to cell transistor channel regions of a multiple-valued programmable read only memory in a fourth embodiment in accordance with the present invention.

With reference to FIG. 10A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 10B:
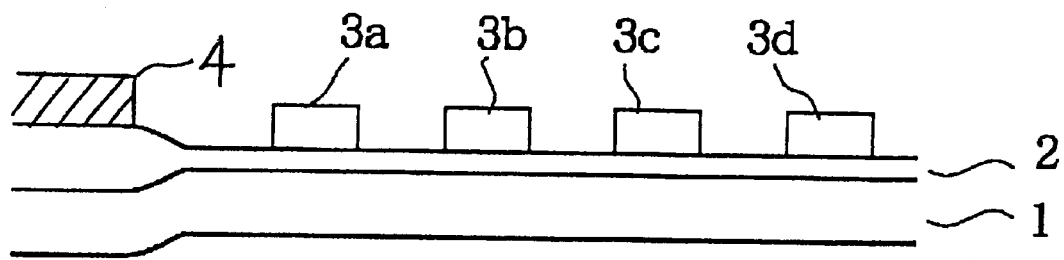

With reference to FIG. 10B, a photo-resist is applied on an entire surface of the silicon substrate for subsequent photo-lithography process to form a photo-resist pattern 4 over the filed oxide film so that the photo-resist pattern has an opening positioned over the active region or the gate electrodes 3a, 3b, 3c and 3d.

Figure 10C:
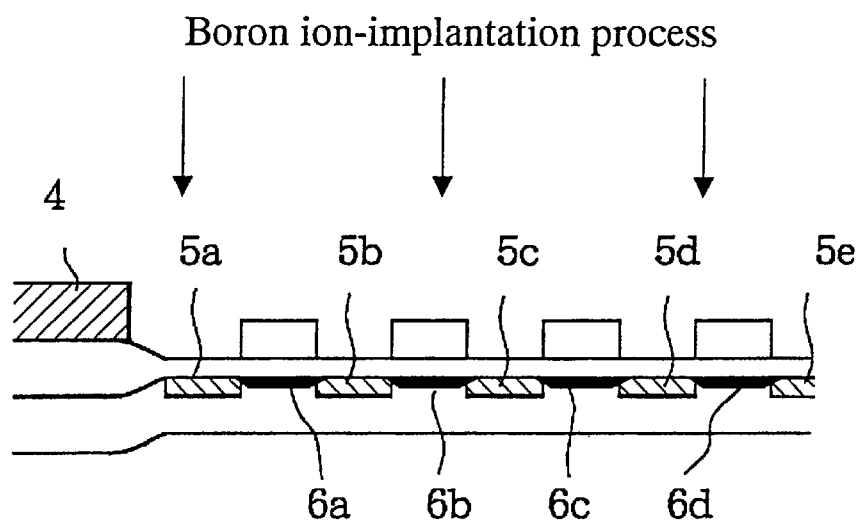

With reference to FIG. 10C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1\times10^{13}$ cm$^{-2}$. The formations of the p-type isolation regions 5a, 5b, 5c, 5d and 5e define first to fourth cell transistor channel regions 6a, 6b, 6c and 6d. The first cell transistor channel region 6a is defined between the first and second p-type isolation regions 5a and 5b and also is positioned under the first gate electrode 3a. The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c. The fourth cell transistor channel region 6d is defined between the fourth and fifth p-type isolation regions 5d and 5e and also is positioned under the fourth gate electrode 3d.

Figure 10D:
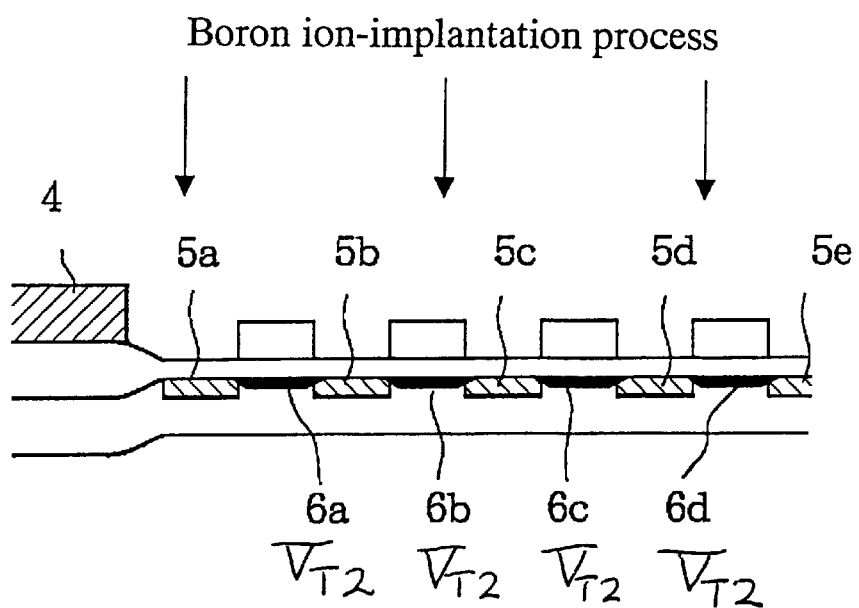

With reference to FIG. 10D, an ion-implantation of boron is carried out by use of the above photo-resist pattern 4 as a mask, so that boron atoms penetrate through the gate oxide film 2 and the first to fourth gate electrodes 3a, 3b, 3c and 3d and are ion-implanted into not only the p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the boron atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the third threshold voltage level $V_{T2}$ as the second highest threshold voltage level.

Figure 10E:
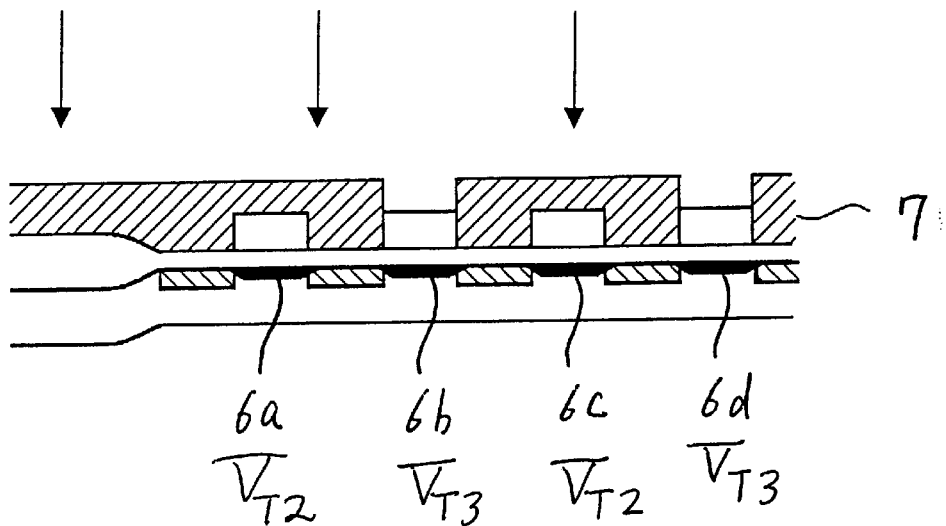

With reference to FIG. 10E, the used first photo-resist pattern 4 is removed before a second photo-resist pattern 7 is formed over the silicon substrate. The second photo-resist pattern 7 has two openings which are positioned over the second gate electrode 3b and the fourth gate electrode 3d respectively, so that the second and fourth gate electrodes 3b and 3d are shown through the two openings of the second photo-resist pattern 7, whilst the first and third gate electrodes 3a and 3c as well as the gate oxide film 2 and the field oxide film are covered by the second photo-resist pattern 7. A first code ion-implantation of boron difluoride is carried out at an ion-implantation energy of 360 KeV and at a dose in the range of $4.0\times10^{12}$ cm$^{-2}$ to $5.0\times10^{12}$ cm$^{-2}$ by use of the second photo-resist pattern 7 as a mask, so that boron difluoride molecules penetrate the second and fourth gate electrodes 3b and 3d and the gate oxide film 2 and are ion-implanted into the second and fourth cell transistor channel regions 6b and 6d positioned under the second and fourth gate electrodes 3b and 3d shown through the openings of the second photo-resist pattern 7, whereby the second and fourth cell transistor channel regions 6b and 6d having the third threshold voltage level $V_{T2}$ as the second highest threshold voltage level rise in threshold voltage level by one level to the fourth threshold voltage level $V_{T3}$ as the highest threshold voltage level, whilst the first and third cell transistor channel regions 6a and 6c having the third threshold voltage level $V_{T2}$ as the second highest threshold voltage level remain unchanged in threshold voltage level. As a result of the first code ion-implantation, the second and fourth cell transistor channel regions 6b and 6d have the fourth threshold voltage level $V_{T3}$ as the highest threshold voltage level. The first and third cell transistor channel regions 6a and 6c have the third threshold voltage level $V_{T2}$ as the second highest threshold voltage level.

Figure 10F:
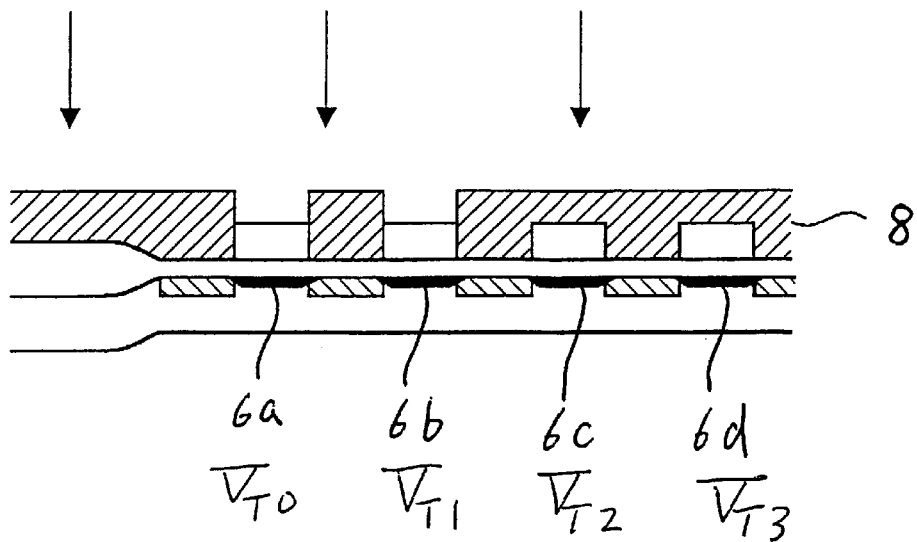

With reference to FIG. 10F, the used second photo-resist pattern 7 is removed before a third photo-resist pattern 8 is formed over the silicon substrate. The third photo-resist pattern 8 has two openings which are positioned over the first gate electrode 3a and the second gate electrode 3b respectively, so that the first and second gate electrodes 3a and 3b are shown through the two openings of the third photo-resist pattern 8, whilst the third and fourth gate electrodes 3c and 3d as well as the gate oxide film 2 and the field oxide film are covered by the third photo-resist pattern 8. A second code ion-implantation of phosphorus is carried out at an ion-implantation energy of 360 KeV and at a dose in the range of $9.0\times10^{12}$ cm$^{-2}$ to $1.0\times10^{13}$ cm$^{-2}$ by use of the third photo-resist pattern 8 as a mask, so that phosphorus atoms penetrate the first and second gate electrodes 3a and 3b and the gate oxide film 2 and are ion-implanted into the first and second cell transistor channel regions 6a and 6b positioned under the first and second gate electrodes 3a and 3b shown through the openings of the third photo-resist pattern 8, whereby the first cell transistor channel region 6a having the third threshold voltage level $V_{T2}$ as the second highest threshold voltage level drops in threshold voltage level by two levels to the first threshold voltage level $V_{T0}$ as the lowest threshold voltage level as well as the second cell transistor channel region 6b having the fourth threshold voltage level $V_{T3}$ as the highest threshold voltage level drops in threshold voltage level by two levels to the second threshold voltage level $V_{T1}$ as the second lowest threshold voltage level. In the meantime, the third cell transistor channel region 6c having the third threshold voltage level $V_{T2}$ as the second highest threshold voltage level remain unchanged in threshold voltage level as well as the fourth cell transistor channel region 6d having the fourth threshold voltage level $V_{T3}$ as the highest threshold voltage level remain unchanged in threshold voltage level. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_T$ as the second highest threshold voltage level. The fourth cell transistor channel region 6d has the fourth threshold voltage level $V_{T3}$ as the highest threshold voltage level.

Figure 10G:
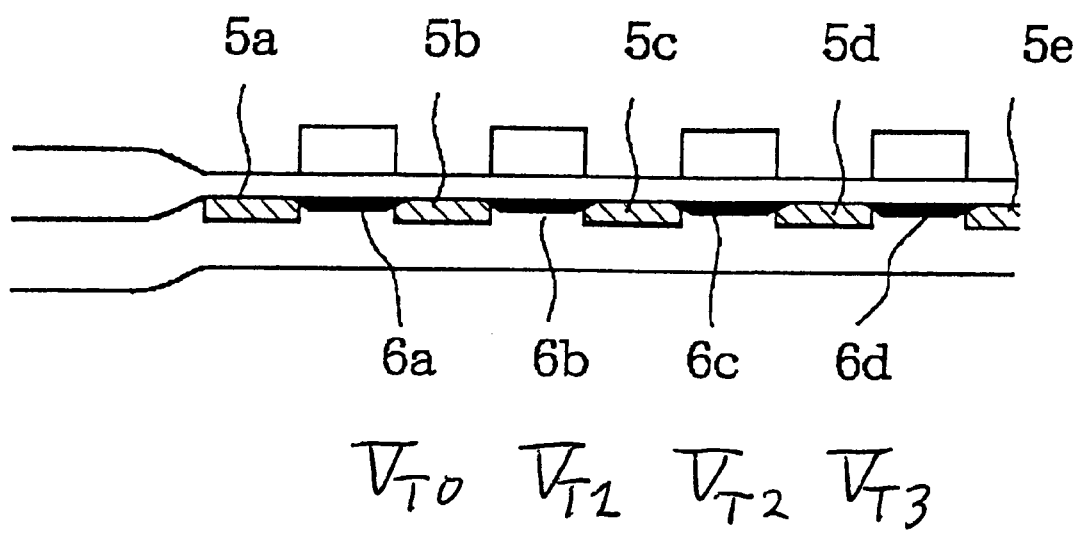

With reference to FIG. 10G, the used third photo-resist pattern 8 is removed. Implementation of the above combined two code ion-implantations, for example, the first and second code ion-implantation processes could set four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d, whereby the first cell transistor channel region 6a has the first threshold voltage level $V_{T0}$ as the lowest threshold voltage level, the second cell transistor channel region 6b has the second threshold voltage level $V_{T1}$ as the second lowest threshold voltage level, the third cell transistor channel region 6c has the third threshold voltage level $V_{T2}$ as the second highest threshold voltage level, and the fourth cell transistor channel region 6d has the fourth threshold voltage level $V_{T3}$ as the highest threshold voltage level. By contrast to the above present invention, it is necessary for the conventional method to implement three or more code ion-implantation processes as described above. The above novel method could reduce the number of the necessary code ion-implantation processes to set the four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting boron difluoride and phosphorus which are heavier than boron. Boron difluoride impurity and phosphorus impurity heavier than boron impurity are capable of suppressing any excess thermal diffusion of the impurity in the first, second, third and fourth cell transistor channel regions 6a, 6b, 6c and 6d by a heat treatment to be carried out in a later manufacturing process, as compared to boron impurity. This suppression of any excess thermal diffusion results in avoidance of any substantive variations in threshold voltage level of the cell transistor channel regions 6a, 6b, 6c and 6d by the heat treatment.

Figure 11:
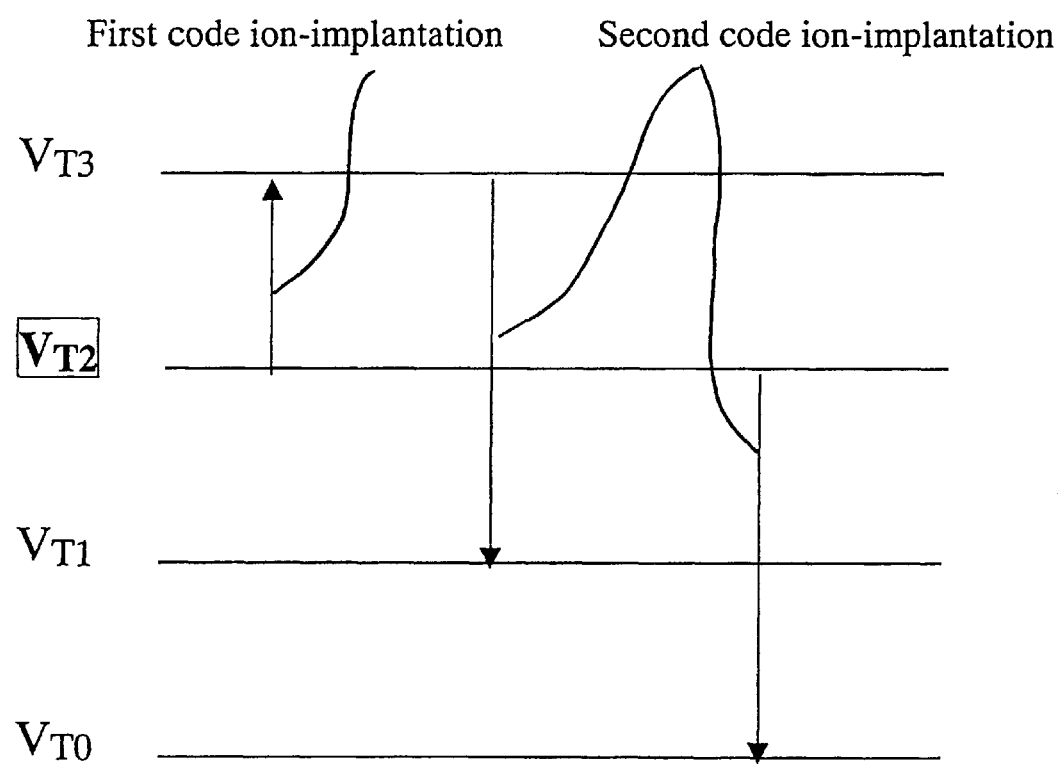
FIG. 11 is a diagram illustrative of changes in threshold voltage level of cell transistor channel regions upon first and second code selective ion-implantations for setting multiple different threshold voltage levels of a multiple-valued programmable read only memory in a fourth embodiment in accordance with the present invention.

FIG. 11 is a diagram illustrative of changes in threshold voltage level of cell transistor channel regions upon first and second code selective ion-implantations for setting multiple different threshold voltage levels of a multiple-valued programmable read only memory. The ion-implantation of boron is carried out to set the uniform threshold voltage level, for example, the third threshold voltage level $V_{T2}$ to all of the cell transistor channel regions 6a, 6b, 6c and 6d. The first code ion-implantation of boron difluoride to the second and fourth cell transistor channel regions 6b and 6d is then carried out at the one level dose so that the third threshold voltage level $V_{T2}$ of the second and fourth cell transistor channel regions 6b and 6d is risen by one level into the fourth threshold voltage level $V_{T3}$, whilst the third threshold voltage level $V_{T2}$ of the first and third cell transistor channel regions 6a and 6c remains unchanged. Subsequently, the second code ion-implantation of phosphorus to the first and second cell transistor channel regions 6a and 6b is then carried out at the second level dose so that the third threshold voltage level $V_{T2}$ of the first cell transistor channel region 6a is dropped by two levels into the first threshold voltage level $V_{T0}$, and the fourth threshold voltage level $V_{T3}$ of the second cell transistor channel region 6b is also dropped by two levels into the second threshold voltage level $V_{T1}$. In the meantime, the third threshold voltage level $V_{T2}$ of the third cell transistor channel region 6c and the fourth threshold voltage level $V_{T3}$ of the fourth cell transistor channel region 6d remain unchanged. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level. The difference in dose of the first and second code ion-implantations shortens the number of the necessary steps to set the four different threshold voltage levels.

Fifth Embodiment

A fifth embodiment according to the present invention will be described in detail with reference to FIGS. 12A through 12G which are fragmentary cross sectional elevation views illustrative of sequential steps involved in a novel method of setting multiple different threshold voltage levels to cell transistor channel regions of a multiple-valued programmable read only memory. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 12A:
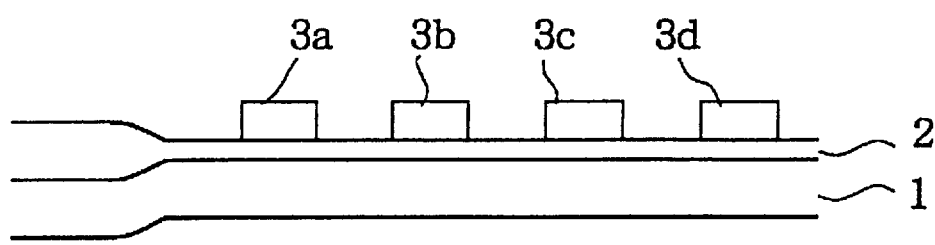
FIGS. 12A through 12G are fragmentary cross sectional elevation views illustrative of sequential steps involved in a novel method of setting multiple different threshold voltage levels to cell transistor channel regions of a multiple-valued programmable read only memory in a fifth embodiment in accordance with the present invention.

With reference to FIG. 12A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 12B:
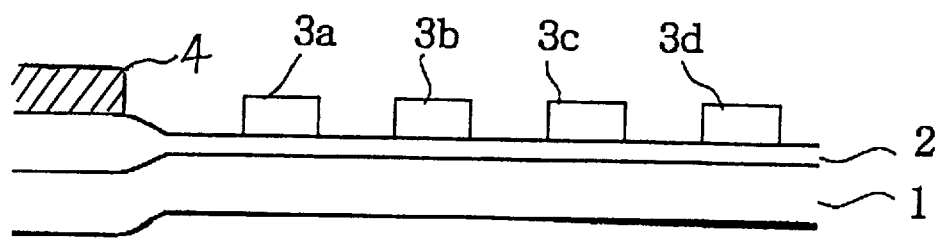

With reference to FIG. 12B, a photo-resist is applied on an entire surface of the silicon substrate for subsequent photo-lithography process to form a photo-resist pattern 4 over the filed oxide film so that the photo-resist pattern has an opening positioned over the active region or the gate electrodes 3a, 3b, 3c and 3d.

Figure 12C:
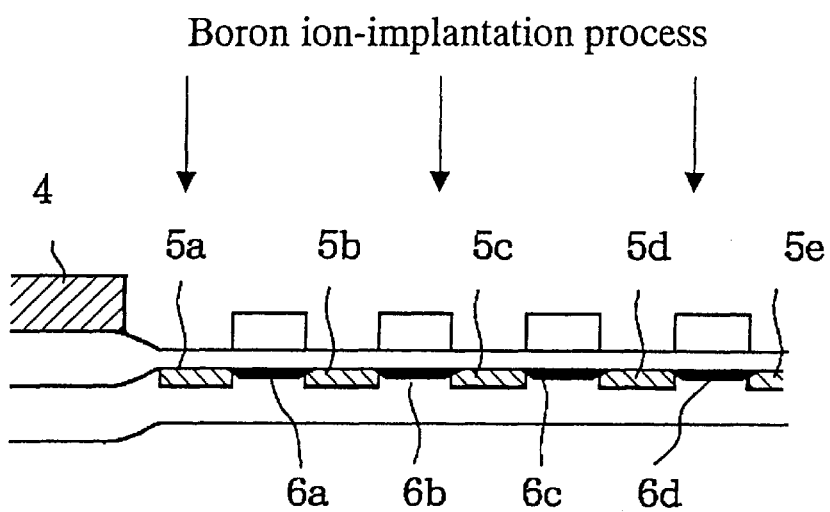

With reference to FIG. 12C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1\times10^{13}$ cm$^{-2}$. The formations of the p-type isolation regions 5a, 5b, 5c, 5d and 5e define first to fourth cell transistor channel regions 6a, 6b, 6c and 6d. The first cell transistor channel region 6a is defined between the first and second p-type isolation regions 5a and 5b and also is positioned under the first gate electrode 3a. The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c. The fourth cell transistor channel region 6d is defined between the fourth and fifth p-type isolation regions 5d and 5e and also is positioned under the fourth gate electrode 3d.

Figure 12D:
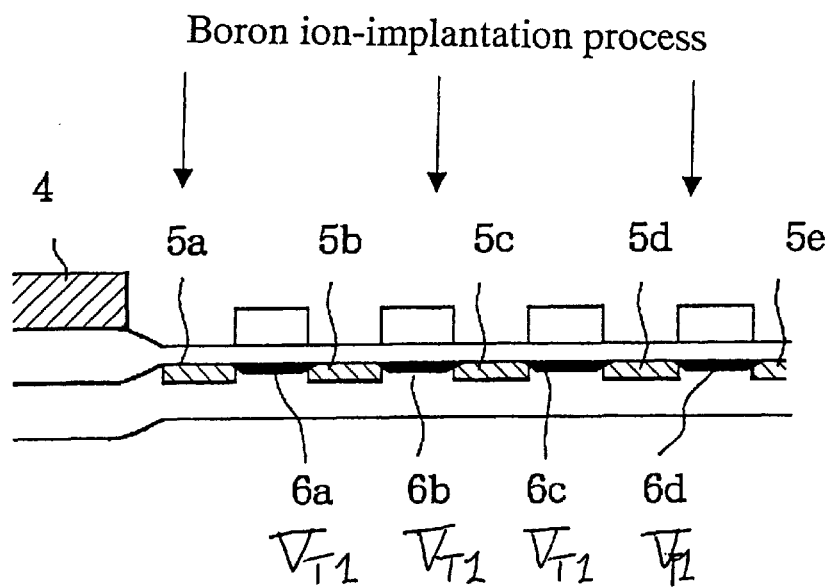

With reference to FIG. 12D, an ion-implantation of boron is carried out by use of the above photo-resist pattern 4 as a mask, so that boron atoms penetrate through the gate oxide film 2 and the first to fourth gate electrodes 3a, 3b, 3c and 3d and are ion-implanted into not only the p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the boron atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the second threshold voltage level $V_{T1}$ as the second lowest threshold voltage level.

Figure 12E:
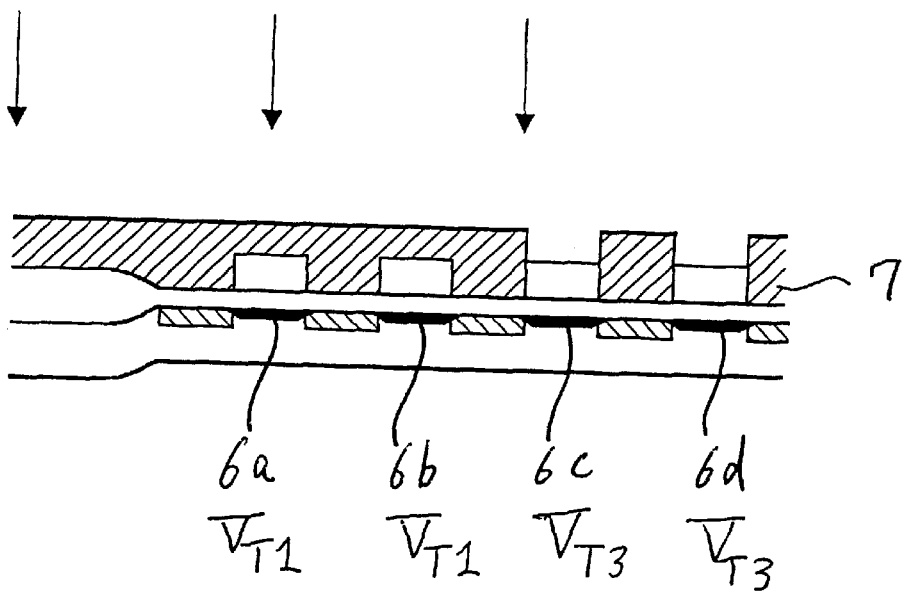

With reference to FIG. 12E, the used first photo-resist pattern 4 is removed before a second photo-resist pattern 7 is formed over the silicon substrate. The second photo-resist pattern 7 has two openings which are positioned over the third gate electrode 3c and the fourth gate electrode 3d respectively, so that the third and fourth gate electrodes 3c and 3d are shown through the two openings of the second photo-resist pattern 7, whilst the first and second gate electrodes 3a and 3b as well as the gate oxide film 2 and the field oxide film are covered by the second photo-resist pattern 7. A first code ion-implantation of boron difluoride is carried out at an ion-implantation energy of 360 KeV and at a dose in the range of $9.0 \times 10^{12}$ cm$^{-2}$ to $10 \times 10^{13}$ cm$^{-2}$ by use of the second photo-resist pattern 7 as a mask, so that boron difluoride molecules penetrate the third and fourth gate electrodes 3c and 3d and the gate oxide film 2 and are ion-implanted into the third and fourth cell transistor channel regions 6c and 6d positioned under the third and fourth gate electrodes 3c and 3d shown through the openings of the second photo-resist pattern 7, whereby the third and fourth cell transistor channel regions 6c and 6d having the second threshold voltage level $V_{T1}$ as the second lowest threshold voltage level rise in threshold voltage level by two levels to the fourth threshold voltage level $V_{T3}$ as the highest threshold voltage level, whilst the first and second cell transistor channel regions 6a and 6b having the second threshold voltage level $V_{T1}$ as the second lowest threshold voltage level remain unchanged in threshold voltage level. As a result of the first code ion-implantation, the third and fourth cell transistor channel regions 6c and 6d have the fourth threshold voltage level $V_{T3}$ as the highest threshold voltage level. The first and second cell transistor channel regions 6a and 6b have the second threshold voltage level $V_{T1}$ as the second lowest threshold voltage level.

Figure 12F:
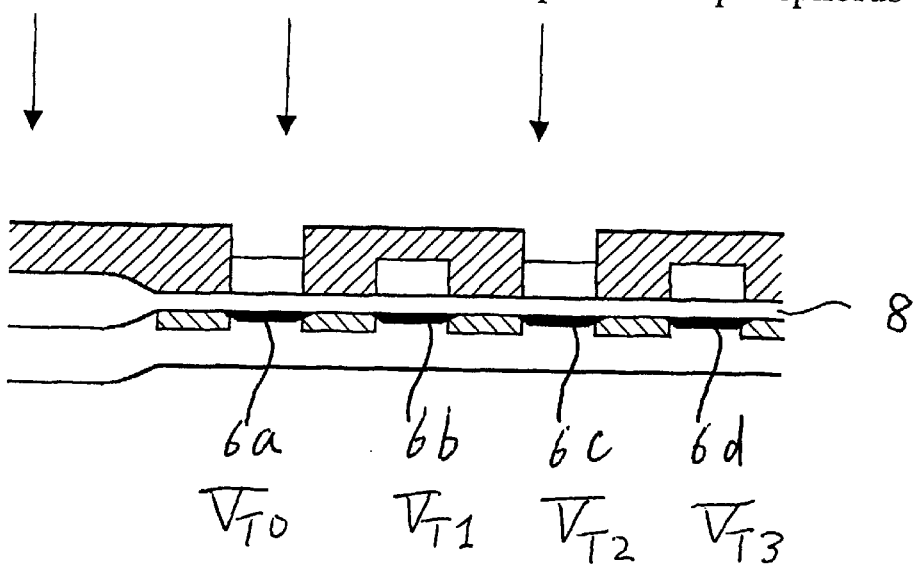

With reference to FIG. 12F, the used second photo-resist pattern 7 is removed before a third photo-resist pattern 8 is formed over the silicon substrate. The third photo-resist pattern 8 has two openings which are positioned over the first gate electrode 3a and the third gate electrode 3c respectively, so that the first and third gate electrodes 3a and 3c are shown through the two openings of the third photo-resist pattern 8, whilst the second and fourth gate electrodes 3b and 3d as well as the gate oxide film 2 and the field oxide film are covered by the third photo-resist pattern 8. A second code ion-implantation of phosphorus is carried out at an ion-implantation energy of 360 KeV and at a dose in the range of $4.0 \times 10^{12}$ cm$^{-2}$ to $5.0 \times 10^{12}$ cm$^{-2}$ by use of the third photo-resist pattern 8 as a mask, so that phosphorus atoms penetrate the first and third gate electrodes 3a and 3c and the gate oxide film 2 and are ion-implanted into the first and third cell transistor channel regions 6a and 6c positioned under the first and third gate electrodes 3a and 3c shown through the openings of the third photo-resist pattern 8, whereby the first cell transistor channel region 6a having the second threshold voltage level $V_{T1}$ as the second lowest threshold voltage level drops in threshold voltage level by one level to the first threshold voltage level $V_{T0}$ as the lowest threshold voltage level as well as the third cell transistor channel region 6c having the fourth threshold voltage level $V_{T3}$ as the highest threshold voltage level drops in threshold voltage level by one level to the third threshold voltage level $V_{T2}$ as the second highest threshold voltage level. In the meantime, the second cell transistor channel region 6b having the second threshold voltage level $V_{T1}$ as the second lowest threshold voltage level remain unchanged in threshold voltage level as well as the fourth cell transistor channel region 6d having the fourth threshold voltage level $V_{T3}$ as the highest threshold voltage level remain unchanged in threshold voltage level. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level.

Figure 12G:
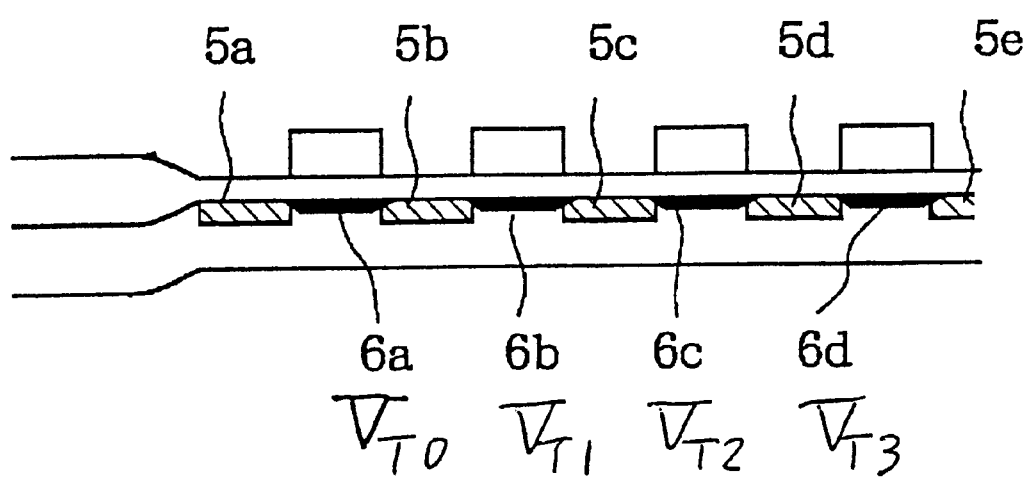

With reference to FIG. 12G, the used third photo-resist pattern 8 is removed. Implementation of the above combined two code ion-implantations, for example, the first and second code ion-implantation processes could set four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d, whereby the first cell transistor channel region 6a has the first threshold voltage level $V_{T0}$ as the lowest threshold voltage level, the second cell transistor channel region 6b has the second threshold voltage level $V_{T1}$ as the second lowest threshold voltage level, the third cell transistor channel region 6c has the third threshold voltage level $V_{T2}$ as the second highest threshold voltage level, and the fourth cell transistor channel region 6d has the fourth threshold voltage level $V_{T3}$ as the highest threshold voltage level. By contrast to the above present invention, it is necessary for the conventional method to implement three or more code ion-implantation processes as described above. The above novel method could reduce the number of the necessary code ion-implantation processes to set the four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting boron difluoride and phosphorus which are heavier than boron. Boron difluoride impurity and phosphorus impurity heavier than boron impurity are capable of suppressing any excess thermal diffusion of the impurity in the first, second, third and fourth cell transistor channel regions 6a, 6b, 6c and 6d by a heat treatment to be carried out in a later manufacturing process, as compared to boron impurity. This suppression of any excess thermal diffusion results in avoidance of any substantive variations in threshold voltage level of the cell transistor channel regions 6a, 6b, 6c and 6d by the heat treatment.

Figure 13:
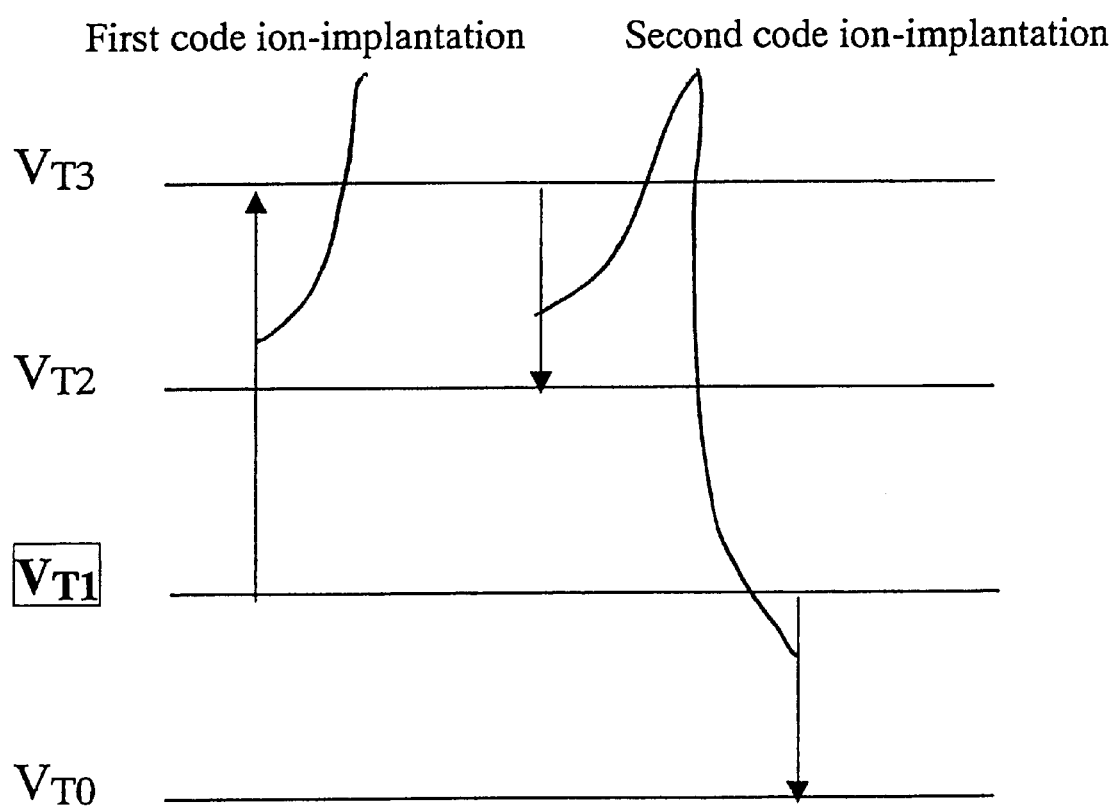
FIG. 13 is a diagram illustrative of changes in threshold voltage level of cell transistor channel regions upon first and second code selective ion-implantations for setting multiple different threshold voltage levels of a multiple-valued programmable read only memory in a fifth embodiment in accordance with the present invention.

FIG. 13 is a diagram illustrative of changes in threshold voltage level of cell transistor channel regions upon first and second code selective ion-implantations for setting multiple different threshold voltage levels of a multiple-valued programmable read only memory. The ion-implantation of boron is carried out to set the uniform threshold voltage level, for example, the second threshold voltage level $V_{T1}$ to all of the cell transistor channel regions 6a, 6b, 6c and 6d. The first code ion-implantation of boron difluoride to the third and fourth cell transistor channel regions 6c and 6d is then carried out at the second level dose so that the second threshold voltage level $V_{T1}$ of the third and fourth cell transistor channel regions 6c and 6d is risen by two levels into the fourth threshold voltage level $V_{T3}$, whilst the second threshold voltage level $V_{T1}$ of the first and second cell transistor channel regions 6a and 6b remains unchanged. Subsequently, the second code ion-implantation of phosphorus to the first and third cell transistor channel regions 6a and 6c is then carried out at the first level dose so that the second threshold voltage level $V_{T1}$ of the first cell transistor channel region 6a is dropped by one level into the first threshold voltage level $V_{T0}$, and the fourth threshold voltage level $V_{T3}$ of the third cell transistor channel region 6c is also dropped by one level into the third threshold voltage level $V_{T2}$. In the meantime, the second threshold voltage level $V_{T}$ of the second cell transistor channel region 6b and the fourth threshold voltage level $V_{T3}$ of the fourth cell transistor channel region 6d remain unchanged. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level. The difference in dose of the first and second code ion-implantations shortens the number of the necessary steps to set the four different threshold voltage levels.

Sixth Embodiment

A sixth embodiment according to the present invention will be described in detail with reference to FIGS. 14A through 14G which are fragmentary cross sectional elevation views illustrative of sequential steps involved in a novel method of setting multiple different threshold voltage levels to cell transistor channel regions of a multiple-valued programmable read only memory. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 14A:
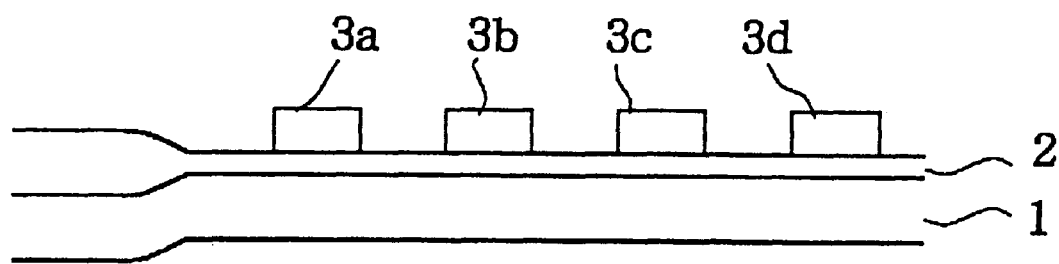
FIGS. 14A through 14G are fragmentary cross sectional elevation views illustrative of sequential steps involved in a novel method of setting multiple different threshold voltage levels to cell transistor channel regions of a multiple-valued programmable read only memory in a sixth embodiment in accordance with the present invention.

With reference to FIG. 14A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 14B:
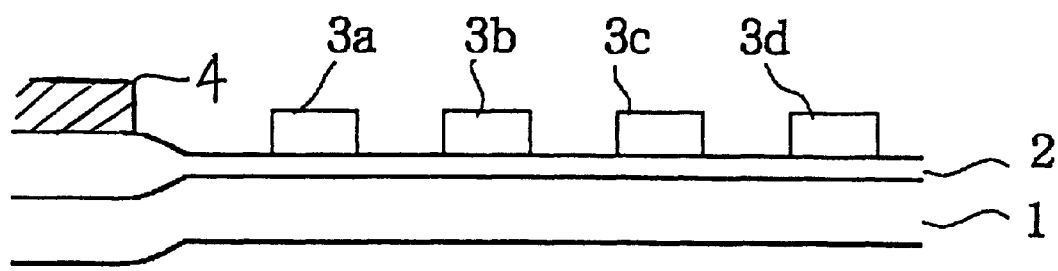

With reference to FIG. 14B, a photo-resist is applied on an entire surface of the silicon substrate for subsequent photo-lithography process to form a photo-resist pattern 4 over the filed oxide film so that the photo-resist pattern has an opening positioned over the active region or the gate electrodes 3a, 3b, 3c and 3d.

Figure 14C:
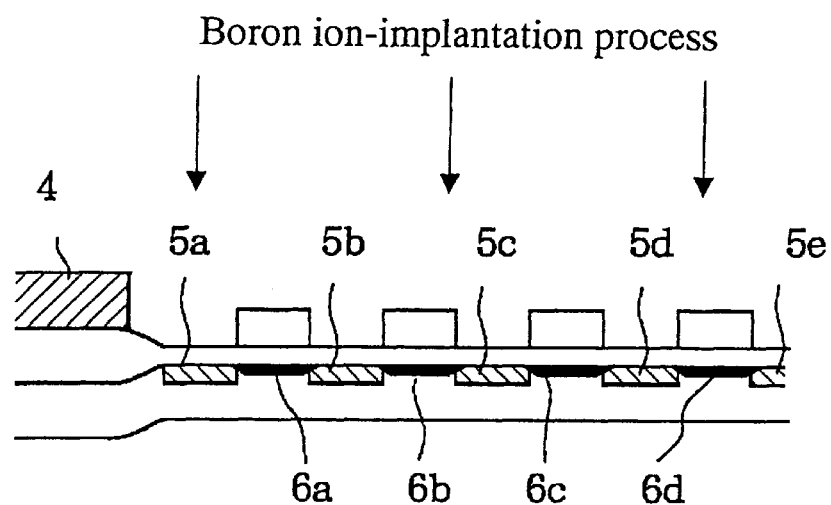

With reference to FIG. 14C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1 \times 10^{13}$ cm$^{-2}$. The formations of the p-type isolation regions 5a, 5b, 5c, 5d and 5e define first to fourth cell transistor channel regions 6a, 6b, 6c and 6d. The first cell transistor channel region 6a is defined between the first and second p-type isolation regions 5a and 5b and also is positioned under the first gate electrode 3a. The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c. The fourth cell transistor channel region 6d is defined between the fourth and fifth p-type isolation regions 5d and 5e and also is positioned under the fourth gate electrode 3d.

Figure 14D:
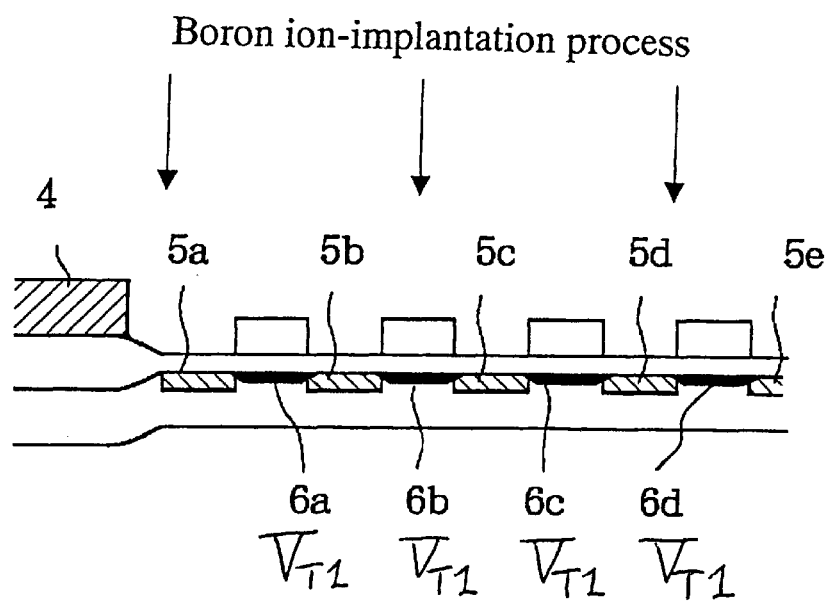

With reference to FIG. 14D, an ion-implantation of boron is carried out by use of the above photo-resist pattern 4 as a mask, so that boron atoms penetrate through the gate oxide film 2 and the first to fourth gate electrodes 3a, 3b, 3c and 3d and are ion-implanted into not only the p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the boron atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the second threshold voltage level $V_{T1}$ as the second lowest threshold voltage level.

Figure 14E:
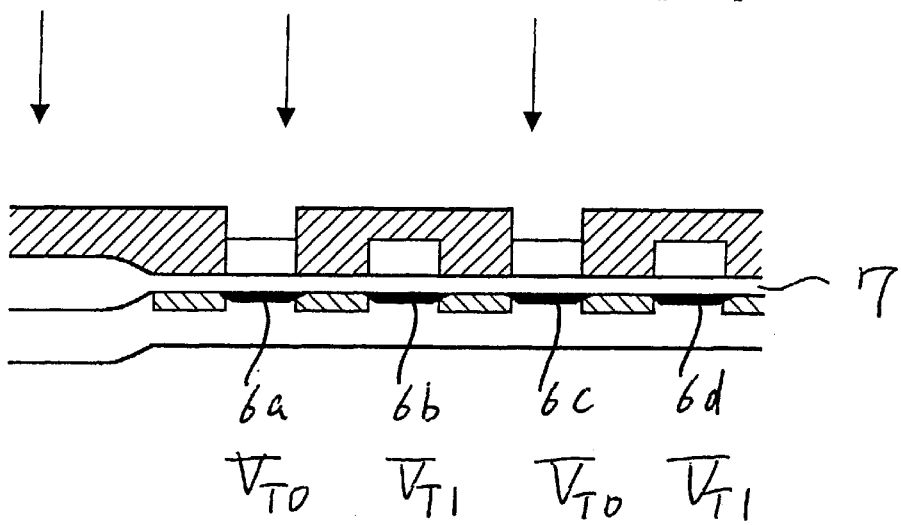

With reference to FIG. 14E, the used first photo-resist pattern 4 is removed before a second photo-resist pattern 7 is formed over the silicon substrate. The second photo-resist pattern 7 has two openings which are positioned over the first gate electrode 3a and the third gate electrode 3c respectively, so that the first and third gate electrodes 3a and 3c are shown through the two openings of the second photo-resist pattern 7, whilst the second and fourth gate electrodes 3b and 3d as well as the gate oxide film 2 and the field oxide film are covered by the second photo-resist pattern 7. A first code ion-implantation of phosphorus is carried out at an ion-implantation energy of 360 KeV and at a dose in the range of $4.0\times10^{12}$ cm$^{-2}$ to $5.0\times10^{12}$ cm$^{-2}$ by use of the second photo-resist pattern 7 as a mask, so that phosphorus atoms penetrate the first and third gate electrodes 3a and 3c and the gate oxide film 2 and are ion-implanted into the first and third cell transistor channel regions 6a and 6c positioned under the first and third gate electrodes 3a and 3c shown through the openings of the second photo-resist pattern 7, whereby the first and third cell transistor channel regions 6a and 6c having the second threshold voltage level $V_{T1}$ as the second lowest threshold voltage level drop in threshold voltage level by one level to the first threshold voltage level $V_{T0}$ as the lowest threshold voltage level, whilst the second and fourth cell transistor channel regions 6b and 6d having the second threshold voltage level $V_{T1}$ as the second lowest threshold voltage level remain unchanged in threshold voltage level. As a result of the first code ion-implantation, the first and third cell transistor channel regions 6a and 6c have the first threshold voltage level $V_{T0}$ as the lowest threshold voltage level. The second and fourth cell transistor channel regions 6b and 6d have the second threshold voltage level $V_{T1}$ as the second lowest threshold voltage level.

Figure 14F:
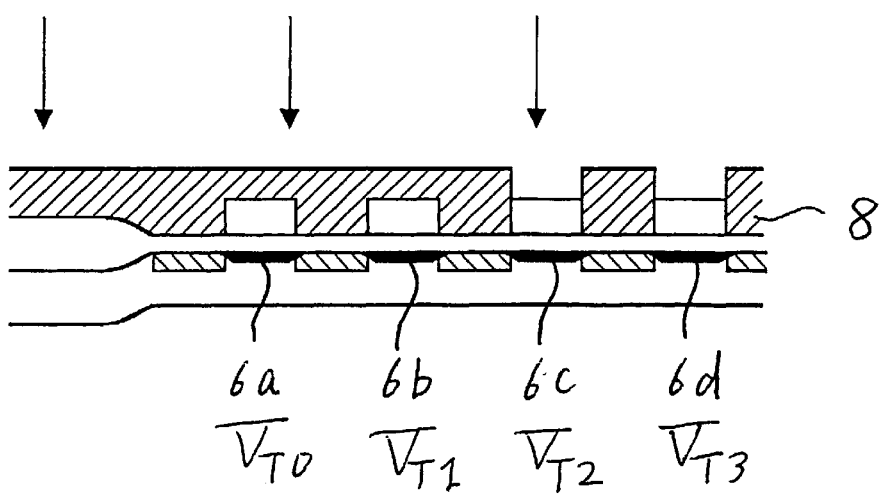

With reference to FIG. 14F, the used second photo-resist pattern 7 is removed before a third photo-resist pattern 8 is formed over the silicon substrate. The third photo-resist pattern 8 has two openings which are positioned over the third gate electrode 3c and the fourth gate electrode 3d respectively, so that the third and fourth gate electrodes 3c and 3d are shown through the two openings of the third photo-resist pattern 8, whilst the first and second gate electrodes 3a and 3b as well as the gate oxide film 2 and the field oxide film are covered by the third photo-resist pattern 8. A second code ion-implantation of boron difluoride is carried out at an ion-implantation energy of 360 KeV and at a dose in the range of $9.0\times10^{12}$ cm$^{-2}$ to $1.0\times10^{13}$ cm$^{-2}$ by use of the third photo-resist pattern 8 as a mask, so that boron difluoride molecules penetrate the third and fourth gate electrodes 3c and 3d and the gate oxide film 2 and are ion-implanted into the third and fourth cell transistor channel regions 6c and 6d positioned under the third and fourth gate electrodes 3c and 3d shown through the openings of the third photo-resist pattern 8, whereby the third cell transistor channel region 6c having the first threshold voltage level $V_{T0}$ as the lowest threshold voltage level rises in threshold voltage level by two levels to the third threshold voltage level $V_{T2}$ as the second highest threshold voltage level as well as the fourth cell transistor channel region 6d having the second threshold voltage level $V_{T1}$ as the second lowest threshold voltage level rises in threshold voltage level by two levels to the fourth threshold voltage level $V_{T3}$ as the highest threshold voltage level. In the meantime, the first cell transistor channel region 6a having the first threshold voltage level $V_{T0}$ as the lowest threshold voltage level remain unchanged in threshold voltage level as well as the second cell transistor channel region 6b having the second threshold voltage level $V_{T1}$ as the second lowest threshold voltage level remain unchanged in threshold voltage level. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level.

Figure 14G:
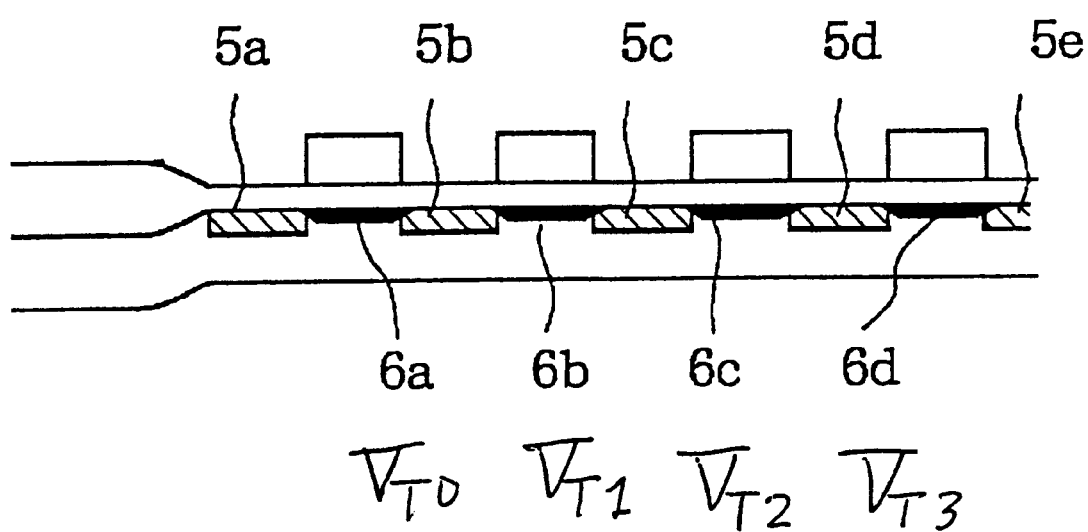

With reference to FIG. 14G, the used third photo-resist pattern 8 is removed. Implementation of the above combined two code ion-implantations, for example, the first and second code ion-implantation processes could set four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d, whereby the first cell transistor channel region 6a has the first threshold voltage level $V_{T0}$ as the lowest threshold voltage level, the second cell transistor channel region 6b has the second threshold voltage level $V_{T1}$ as the second lowest threshold voltage level, the third cell transistor channel region 6c has the third threshold voltage level $V_{T2}$ as the second highest threshold voltage level, and the fourth cell transistor channel region 6d has the fourth threshold voltage level $V_{T3}$ as the highest threshold voltage level. By contrast to the above present invention, it is necessary for the conventional method to implement three or more code ion-implantation processes as described above. The above novel method could reduce the number of the necessary code ion-implantation processes to set the four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting phosphorus and boron difluoride which are heavier than boron. Phosphorus impurity and boron difluoride impurity heavier than boron impurity are capable of suppressing any excess thermal diffusion of the impurity in the first, second, third and fourth cell transistor channel regions 6a, 6b, 6c and 6d by a heat treatment to be carried out in a later manufacturing process, as compared to boron impurity. This suppression of any excess thermal diffusion results in avoidance of any substantive variations in threshold voltage level of the cell transistor channel regions 6a, 6b, 6c and 6d by the heat treatment.

Figure 15:
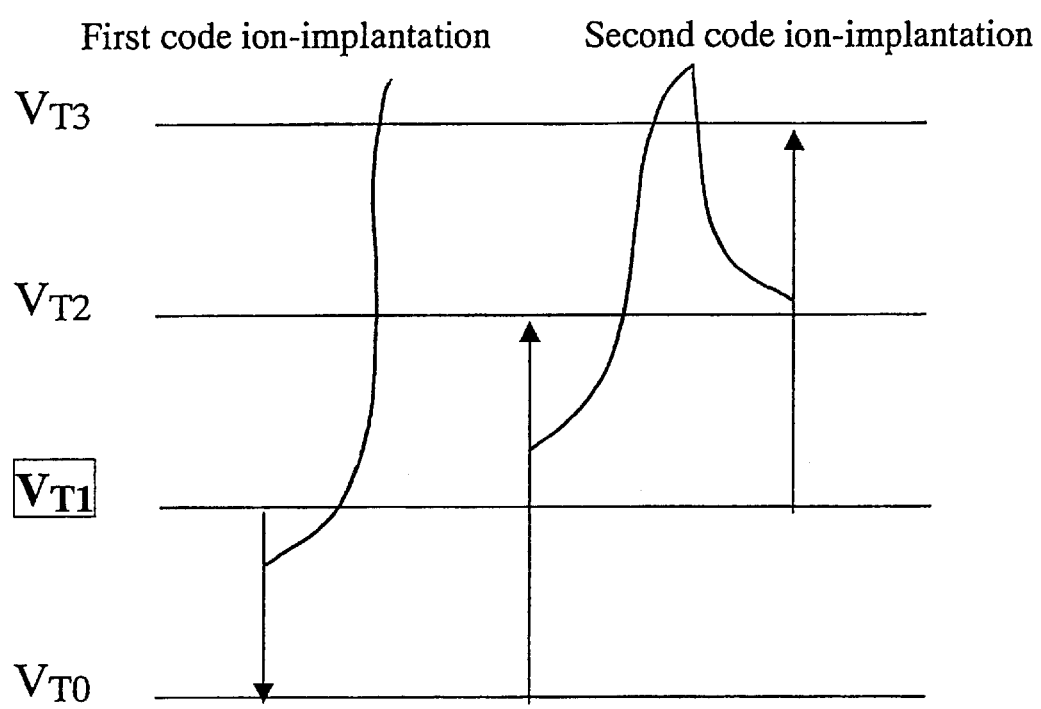
FIG. 15 is a diagram illustrative of changes in threshold voltage level of cell transistor channel regions upon first and second code selective ion-implantations for setting multiple different threshold voltage levels of a multiple-valued programmable read only memory in a sixth embodiment in accordance with the present invention.

FIG. 15 is a diagram illustrative of changes in threshold voltage level of cell transistor channel regions upon first and second code selective ion-implantations for setting multiple different threshold voltage levels of a multiple-valued programmable read only memory. The ion-implantation of boron is carried out to set the uniform threshold voltage level, for example, the second threshold voltage level $V_{T1}$ to all of the cell transistor channel regions 6a, 6b, 6c and 6d. The first code ion-implantation of phosphorus to the first and third cell transistor channel regions 6a and 6c is then carried out at the first level dose so that the second threshold voltage level $V_{T1}$ of the first and third cell transistor channel regions 6a and 6c is dropped by one level into the first threshold voltage level $V_{T0}$, whilst the second threshold voltage level $V_{T1}$ of the second and fourth cell transistor channel regions 6b and 6d remains unchanged. Subsequently, the second code ion-implantation of boron difluoride to the third and fourth cell transistor channel regions 6c and 6d is then carried out at the second level dose so that the first threshold voltage level $V_{T0}$ of the third cell transistor channel region 6c is risen by two levels into the third threshold voltage level $V_{T2}$, and the second threshold voltage level $V_{T1}$ of the fourth cell transistor channel region 6d is also risen by two levels into the fourth threshold voltage level $V_{T3}$. In the meantime, the first threshold voltage level $V_{T0}$ of the first cell transistor channel region 6a and the second threshold voltage level $V_{T1}$ of the second cell transistor channel region 6b remain unchanged. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level. The difference in dose of the first and second code ion-implantations shortens the number of the necessary steps to set the four different threshold voltage levels.

Seventh Embodiment

A seventh embodiment according to the present invention will be described in detail with reference to FIGS. 16A through 16F which are fragmentary cross sectional elevation views illustrative of sequential steps involved in a novel method of setting multiple different threshold voltage levels to cell transistor channel regions of a multiple-valued programmable read only memory. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 16A:
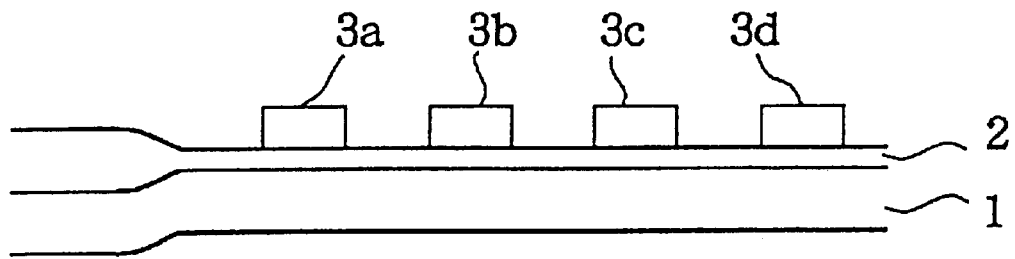
FIGS. 16A through 16G are fragmentary cross sectional elevation views illustrative of sequential steps involved in a novel method of setting multiple different threshold voltage levels to cell transistor channel regions of a multiple-valued programmable read only memory in a seventh embodiment in accordance with the present invention.

With reference to FIG. 16A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 16B:
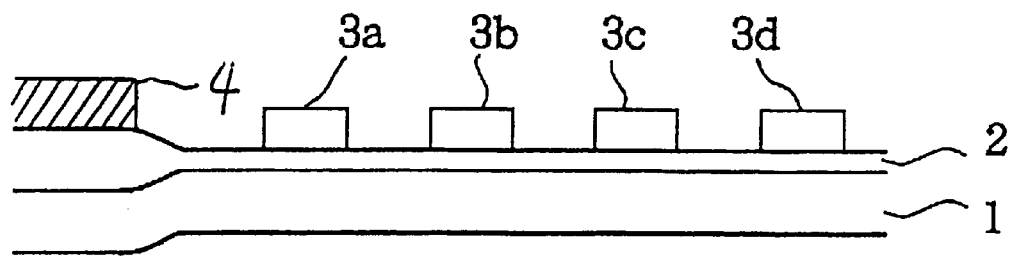

With reference to FIG. 16B, a photo-resist is applied on an entire surface of the silicon substrate for subsequent photo-lithography process to form a photo-resist pattern 4 over the filed oxide film so that the photo-resist pattern has an opening positioned over the active region or the gate electrodes 3a, 3b, 3c and 3d.

Figure 16C:
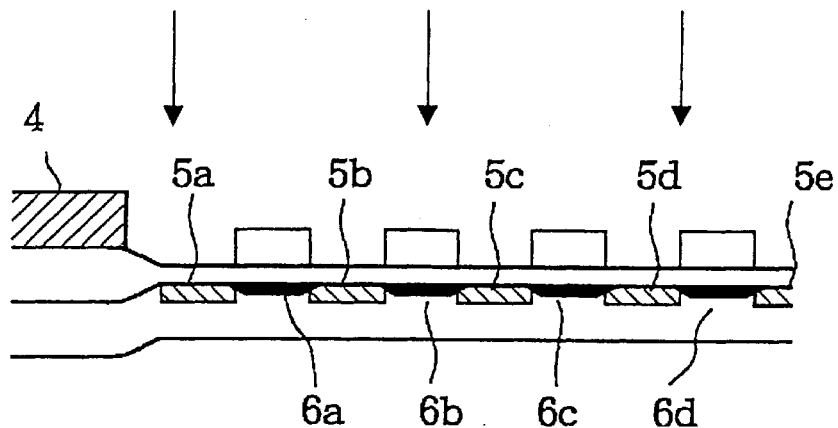

With reference to FIG. 16C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1 \times 10^{13}$ cm$^{-2}$. The formations of the p-type isolation regions 5a, 5b, 5c, 5d and 5e define first to fourth cell transistor channel regions 6a, 6b, 6c and 6d. The first cell transistor channel region 6a is defined between the first and second p-type isolation regions 5a and 5b and also is positioned under the first gate electrode 3a, The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c. The fourth cell transistor channel region 6d is defined between the fourth and fifth p-type isolation regions 5d and 5e and also is positioned under the fourth gate electrode 3d.

Figure 16D:
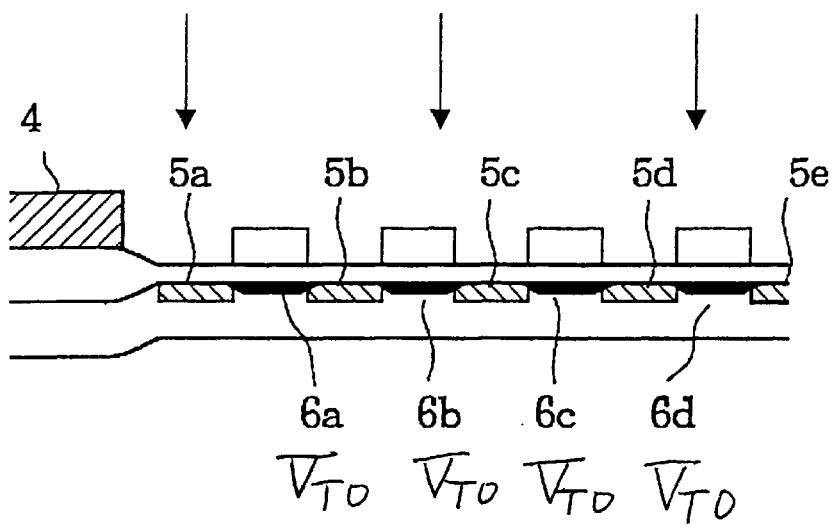

With reference to FIG. 16D, an ion-implantation of boron is carried out by use of the above photo-resist pattern 4 as a mask, so that boron atoms penetrate through the gate oxide film 2 and the first to fourth gate electrodes 3a, 3b, 3c and 3d and are ion-implanted into not only the p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the boron atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the first threshold voltage level $V_{T0}$ as the lowest threshold voltage level.

Figure 16E:
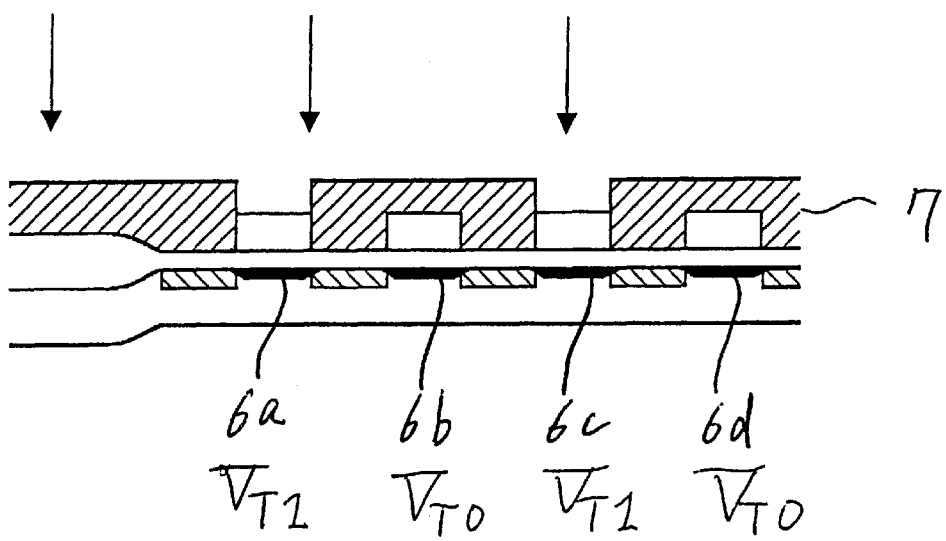

With reference to FIG. 16E, the used first photo-resist pattern 4 is removed before a second photo-resist pattern 7 is formed over the silicon substrate. The second photo-resist pattern 7 has two openings which are positioned over the first gate electrode 3a and the third gate electrode 3c respectively, so that the first and third gate electrodes 3a and 3c are shown through the two openings of the second photo-resist pattern 7, whilst the second and fourth gate electrodes 3b and 3d as well as the gate oxide film 2 and the field oxide film are covered by the second photo-resist pattern 7. A first code ion-implantation of boron difluoride is carried out at an ion-implantation energy of 360 KeV and at a dose in the range of $4.0 \times 10^{12}$ cm$^{-2}$ to $5.0 \times 10^{12}$ cm$^{-2}$ by use of the second photo-resist pattern 7 as a mask, so that boron difluoride molecules penetrate the first and third gate electrodes 3a and 3c and the gate oxide film 2 and are ion-implanted into the first and third cell transistor channel regions 6a and 6c positioned under the first and third gate electrodes 3a and 3c shown through the openings of the second photo-resist pattern 7, whereby the first and third cell transistor channel regions 6a and 6c having the first threshold voltage level $V_{T0}$ as the lowest threshold voltage level rise in threshold voltage level by one level to the second threshold voltage level $V_{T1}$ as the second lowest threshold voltage level, whilst the second and fourth cell transistor channel regions 6b and 6d having the first threshold voltage level $V_{T0}$ as the lowest threshold voltage level remain unchanged in threshold voltage level. As a result of the first code ion-implantation, the first and third cell transistor channel regions 6a and 6c have the second threshold voltage level $V_{T1}$ as the second lowest threshold voltage level. The second and fourth cell transistor channel regions 6b and 6d have the first threshold voltage level $V_{T0}$ as the lowest threshold voltage level.

Figure 16F:
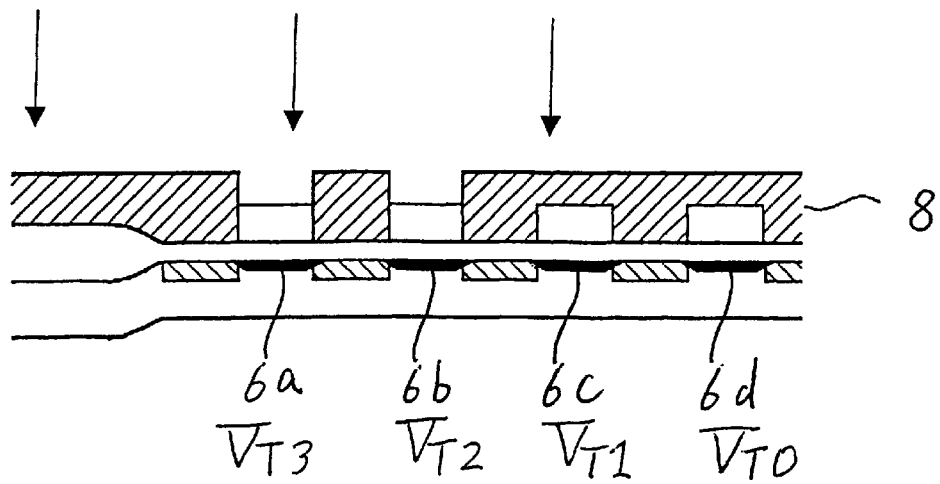

With reference to FIG. 16F, the used second photo-resist pattern 7 is removed before a third photo-resist pattern 8 is formed over the silicon substrate. The third photo-resist pattern 8 has two openings which are positioned over the first gate electrode 3a and the second gate electrode 3b respectively, so that the first and second gate electrodes 3a and 3b are shown through the two openings of the third photo-resist pattern 8, whilst the third and fourth gate electrodes 3c and 3d as well as the gate oxide film 2 and the field oxide film are covered by the third photo-resist pattern 8. A second code ion-implantation of boron difluoride is carried out at an ion-implantation energy of 360 KeV and at a dose in the range of $9.0\times10^{12}$ cm$^{-2}$ to $10\times10^{13}$ cm$^{-2}$ by use of the third photo-resist pattern 8 as a mask, so that boron difluoride molecules penetrate the first and second gate electrodes 3a and 3b and the gate oxide film 2 and are ion-implanted into the first and second cell transistor channel regions 6a and 6b positioned under the first and second gate electrodes 3a and 3b shown through the openings of the third photo-resist pattern 8, whereby the first cell transistor channel region 6a having the second threshold voltage level $V_{T1}$ as the second lowest threshold voltage level rises in threshold voltage level by two levels to the fourth threshold voltage level $V_{T3}$ as the highest threshold voltage level as well as the second cell transistor channel region 6b having the first threshold voltage level $V_{T0}$ as the lowest threshold voltage level rises in threshold voltage level by two levels to the third threshold voltage level $V_{T2}$ as the second highest threshold voltage level. In the meantime, the third cell transistor channel region 6c having the second threshold voltage level $V_{T1}$ as the second lowest threshold voltage level remain unchanged in threshold voltage level as well as the fourth cell transistor channel region 6d having the first threshold voltage level $V_{T0}$ as the lowest threshold voltage level remain unchanged in threshold voltage level. As a result of the second code ion-implantation, the first cell transistor channel region 6a has the fourth threshold voltage level $V_{T3}$ as the highest threshold voltage level. The second cell transistor channel region 6b has the third threshold voltage level $V_{T2}$ as the second highest threshold voltage level. The third cell transistor channel region 6c has the second threshold voltage level $V_{T1}$ as the second lowest threshold voltage level. The fourth cell transistor channel region 6d has the first threshold voltage level $V_{T0}$ as the lowest threshold voltage level.

Figure 16G:
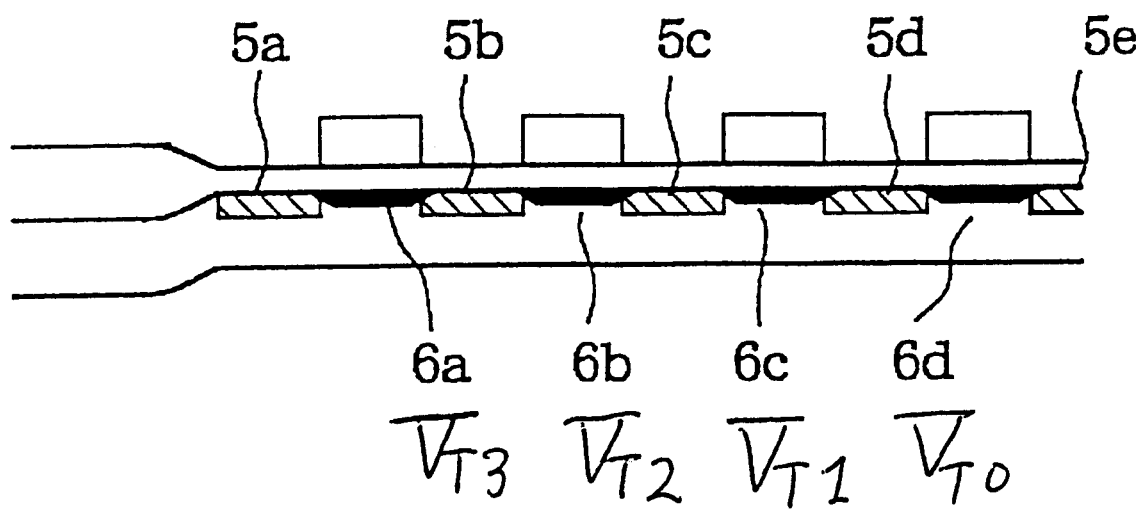

With reference to FIG. 16G, the used third photo-resist pattern 8 is removed. Implementation of the above combined two code ion-implantations, for example, the first and second code ion-implantation processes could set four different threshold voltage levels, for example, the fourth, third, second and first threshold voltage levels $V_{T3}$, $V_{T2}$, $V_{T1}$, and $V_{T0}$ to the first, second, third and fourth cell transistor channel regions 6a, 6b, 6c and 6d, whereby the first cell transistor channel region 6a has the fourth threshold voltage level $V_{T3}$ as the highest threshold voltage level. The second cell transistor channel region 6b has the third threshold voltage level $V_{T2}$ as the second highest threshold voltage level. The third cell transistor channel region 6c has the second threshold voltage level $V_{T1}$ as the second lowest threshold voltage level. The fourth cell transistor channel region 6d has the first threshold voltage level $V_{T0}$ as the lowest threshold voltage level. By contrast to the above present invention, it is necessary for the conventional method to implement three or more code ion-implantation processes as described above. The above novel method could reduce the number of the necessary code ion-implantation processes to set the four different threshold voltage levels, for example, the fourth, third, second and first threshold voltage levels $V_{T3}$, $V_{T2}$, $V_{T1}$, and $V_{T0}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting boron difluoride which is heavier than boron. Boron difluoride impurity heavier than boron impurity is capable of suppressing any excess thermal diffusion of the impurity in the first, second, third and fourth cell transistor channel regions 6a, 6b, 6c and 6d by a heat treatment to be carried out in a later manufacturing process, as compared to boron impurity. This suppression of any excess thermal diffusion results in avoidance of any substantive variations in threshold voltage level of the cell transistor channel regions 6a, 6b, 6c and 6d by the heat treatment.

Figure 17:
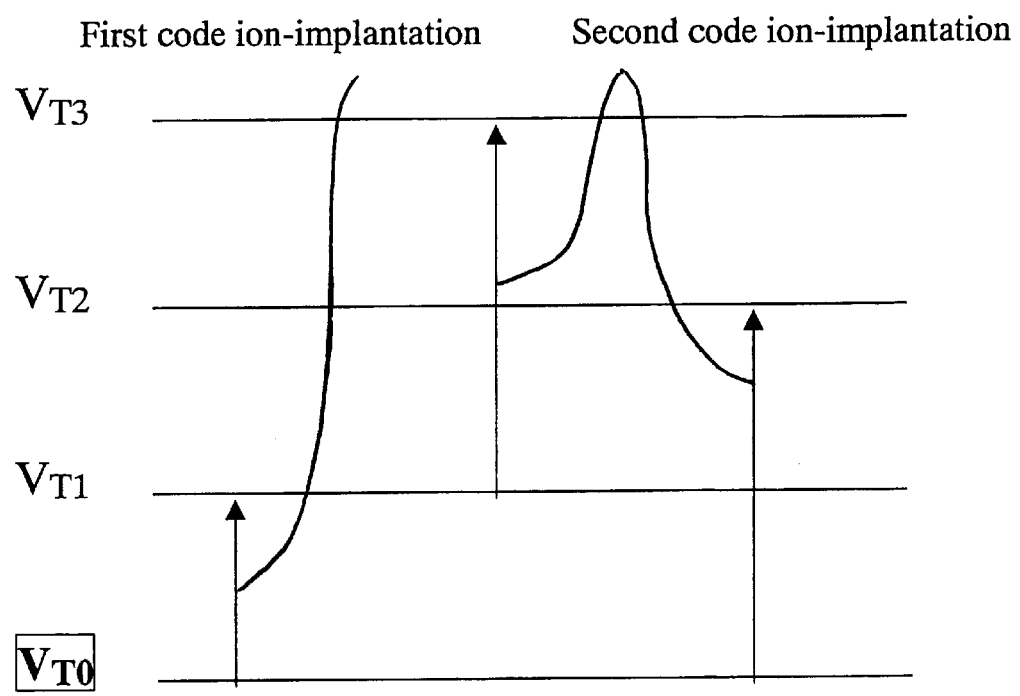
FIG. 17 is a diagram illustrative of changes in threshold voltage level of cell transistor channel regions upon first and second code selective ion-implantations for setting multiple different threshold voltage levels of a multiple-valued programmable read only memory in a seventh embodiment in accordance with the present invention.

FIG. 17 is a diagram illustrative of changes in threshold voltage level of cell transistor channel regions upon first and second code selective ion-implantations for setting multiple different threshold voltage levels of a multiple-valued programmable read only memory. The ion-implantation of boron is carried out to set the uniform threshold voltage level, for example, the first threshold voltage level $V_{T0}$ to all of the cell transistor channel regions 6a, 6b, 6c and 6d. The first code ion-implantation of boron difluoride to the first and third cell transistor channel regions 6a and 6c is then carried out at the first level dose so that the first threshold voltage level $V_{T0}$ of the first and third cell transistor channel regions 6a and 6c is risen by one level into the second threshold voltage level $V_{T1}$, whilst the first threshold voltage level $V_{T0}$ of the second and fourth cell transistor channel regions 6b and 6d remains unchanged. Subsequently, the second code ion-implantation of boron difluoride to the first and second cell transistor channel regions 6a and 6b is then carried out at the second level dose so that the second threshold voltage level $V_{T1}$ of the first cell transistor channel region 6a is risen by two levels into the fourth threshold voltage level $V_{T3}$, and the first threshold voltage level $V_{T0}$ of the second cell transistor channel region 6b is also risen by two levels into the third threshold voltage level $V_T$. In the meantime, the second threshold voltage level $V_{T1}$ of the third cell transistor channel region 6c and the first threshold voltage level $V_{T0}$ of the fourth cell transistor channel region 6d remain unchanged. As a result of the second code ion-implantation, the first cell transistor channel region 6a has the fourth threshold voltage level $V_{T3}$ as the highest threshold voltage level The second cell transistor channel region 6b has the third threshold voltage level $V_{T2}$ as the second highest threshold voltage level. The third cell transistor channel region 6c has the second threshold voltage level $V_{T1}$ as the second lowest threshold voltage level. The fourth cell transistor channel region 6d has the first threshold voltage level $V_{T0}$ as the lowest threshold voltage level.

Eight Embodiment

An eighth embodiment according to the present invention will be described in detail with reference to FIGS. 18A through 18F which are fragmentary cross sectional elevation views illustrative of sequential steps involved in a novel method of setting multiple different threshold voltage levels to cell transistor channel regions of a multiple-valued programmable read only memory. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 18A:
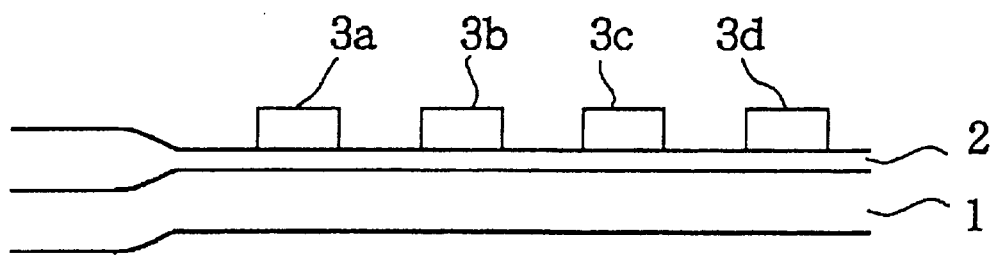
FIGS. 18A through 18G are fragmentary cross sectional elevation views illustrative of sequential steps involved in a novel method of setting multiple different threshold voltage levels to cell transistor channel regions of a multiple-valued programmable read only memory in an eighth embodiment in accordance with the present invention.

With reference to FIG. 18A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 18B:
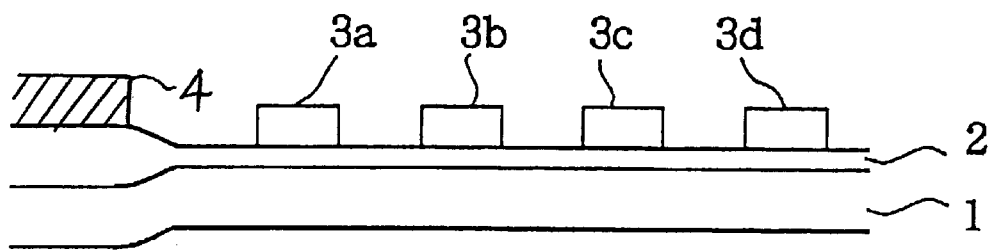

With reference to FIG. 18B, a photo-resist is applied on an entire surface of the silicon substrate for subsequent photo-lithography process to form a photo-resist pattern 4 over the filed oxide film so that the photo-resist pattern has an opening positioned over the active region or the gate electrodes 3a, 3b, 3c and 3d.

Figure 18C:
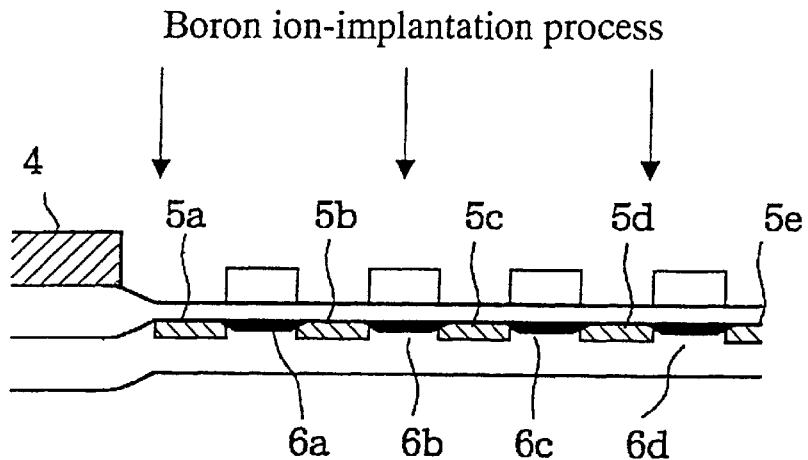

With reference to FIG. 18C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1\times10^{13}$ cm$^{-2}$. The formations of the p-type isolation regions 5a, 5b, 5c, 5d and 5e define first to fourth cell transistor channel regions 6a, 6b, 6c and 6d. The first cell transistor channel region 6a is defined between the first and second p-type isolation regions 5a and 5b and also is positioned under the first gate electrode 3a. The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c The fourth cell transistor channel region 6d is defined between the fourth and fifth p--type isolation regions 5d and 5e and also is positioned under the fourth gate electrode 3d.

Figure 18D:
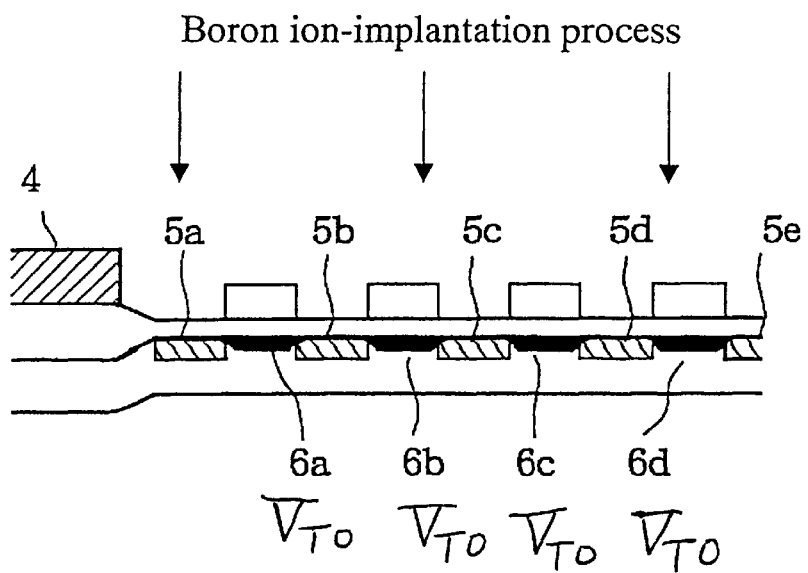

With reference to FIG. 18D, an ion-implantation of boron is carried out by use of the above photo-resist pattern 4 as a mask, so that boron atoms penetrate through the gate oxide film 2 and the first to fourth gate electrodes 3a, 3b, 3c and 3d and are ion-implanted into not only the p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the boron atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the first threshold voltage level $V_{T0}$ as the lowest threshold voltage level.

Figure 18E:
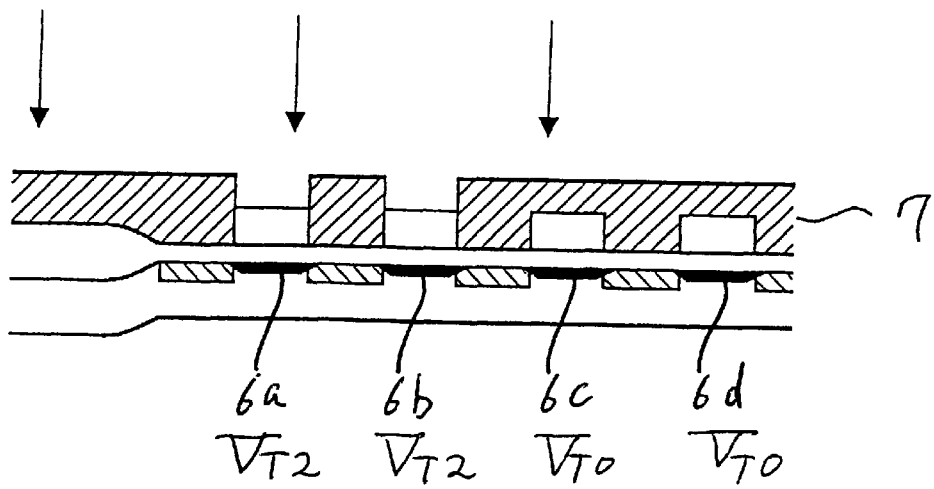

With reference to FIG. 18E, the used first photo-resist pattern 4 is removed before a second photo-resist pattern 7 is formed over the silicon substrate. The second photo-resist pattern 7 has two openings which are positioned over the first gate electrode 3a and the second gate electrode 3b respectively, so that the first and second gate electrodes 3a and 3b are shown through the two openings of the second photo-resist pattern 7, whilst the third and fourth gate electrodes 3c and 3d as well as the gate oxide film 2 and the field oxide film are covered by the second photo-resist pattern 7. A first code ion-implantation of boron difluoride is carried out at an ion-implantation energy of 360 KeV and at a dose in the range of $9.0\times10^{12}$ cm$^{-2}$ to $1.0\times10^{13}$ cm$^{-2}$ by use of the second photo-resist pattern 7 as a mask, so that boron difluoride molecules penetrate the first and second gate electrodes 3a and 3b and the gate oxide film 2 and are ion-implanted into the first and second cell transistor channel regions 6a and 6b positioned under the first and second gate electrodes 3a and 3b shown through the openings of the second photo-resist pattern 7, whereby the first and second cell transistor channel regions 6a and 6b having the first threshold voltage level $V_{T0}$ as the lowest threshold voltage level rise in threshold voltage level by two levels to the third threshold voltage level $V_{T2}$ as the second highest threshold voltage level, whilst the third and fourth cell transistor channel regions 6c and 6d having the first threshold voltage level $V_{T0}$ as the lowest threshold voltage level remain unchanged in threshold voltage level. As a result of the first code ion-implantation, the first and second cell transistor channel regions 6a and 6b have the third threshold voltage level $V_{T2}$ as the second highest threshold voltage level. The third and fourth cell transistor channel regions 6c and 6d have the first threshold voltage level $V_{T0}$ as the lowest threshold voltage level.

Figure 18F:
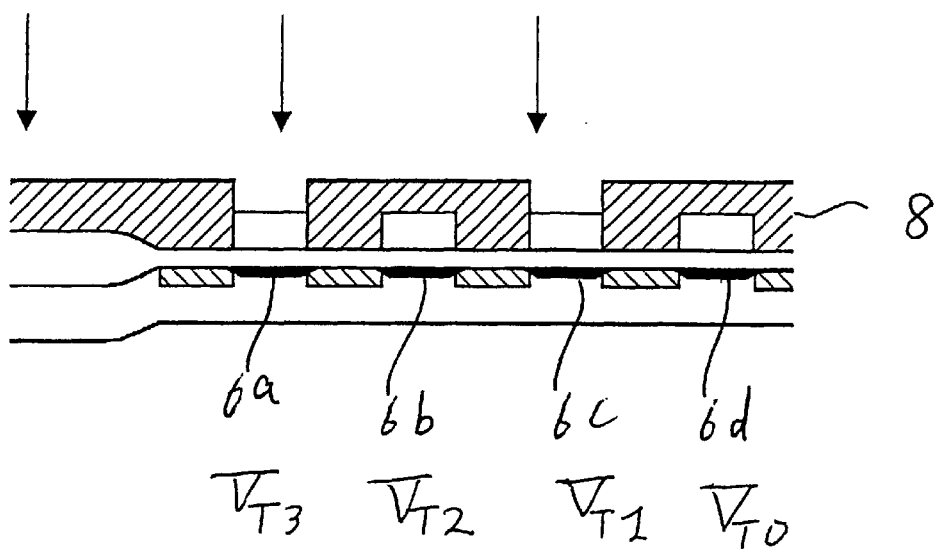

With reference to FIG. 18F, the used second photo-resist pattern 7 is removed before a third photo-resist pattern 8 is formed over the silicon substrate. The third photo-resist pattern 8 has two openings which are positioned over the first gate electrode 3a and the third gate electrode 3c respectively, so that the first and third gate electrodes 3a and 3c are shown through the two openings of the third photo-resist pattern 8, whilst the second and fourth gate electrodes 3b and 3d as well as the gate oxide film 2 and the field oxide film are covered by the third photo-resist pattern 8. A second code ion-implantation of boron difluoride is carried out at an ion-implantation energy of 360 KeV and at a dose in the range of $4.0\times10^{12}$ cm$^{-2}$ to $5.0\times10^{12}$ cm$^{-2}$ by use of the third photo-resist pattern 8 as a mask, so that boron difluoride molecules penetrate the first and third gate electrodes 3a and 3c and the gate oxide film 2 and are ion-implanted into the first and third cell transistor channel regions 6a and 6c positioned under the first and third gate electrodes 3a and 3c shown through the openings of the third photo-resist pattern 8, whereby the first cell transistor channel region 6a having the third threshold voltage level $V_{T2}$ as the second highest threshold voltage level rises in threshold voltage level by one level to the fourth threshold voltage level $V_{T3}$ as the highest threshold voltage level as well as the third cell transistor channel region 6b having the first threshold voltage level $V_{T0}$ as the lowest threshold voltage level rises in threshold voltage level by one level to the second threshold voltage level $V_{T1}$ as the second lowest threshold voltage level. In the meantime, the second cell transistor channel region 6c having the third threshold voltage level $V_{T2}$ as the second highest threshold voltage level remain unchanged in threshold voltage level as well as the fourth cell transistor channel region 6d having the first threshold voltage level $V_{T0}$ as the lowest threshold voltage level remain unchanged in threshold voltage level. As a result of the second code ion-implantation, the first cell transistor channel region 6a has the fourth threshold voltage level $V_{T3}$ as the highest threshold voltage level. The second cell transistor channel region 6b has the third threshold voltage level $V_{T2}$ as the second highest threshold voltage level. The third cell transistor channel region 6c has the second threshold voltage level $V_{T1}$ as the second lowest threshold voltage level. The fourth cell transistor channel region 6d has the first threshold voltage level $V_{T0}$ as the lowest threshold voltage level.

Figure 18G:
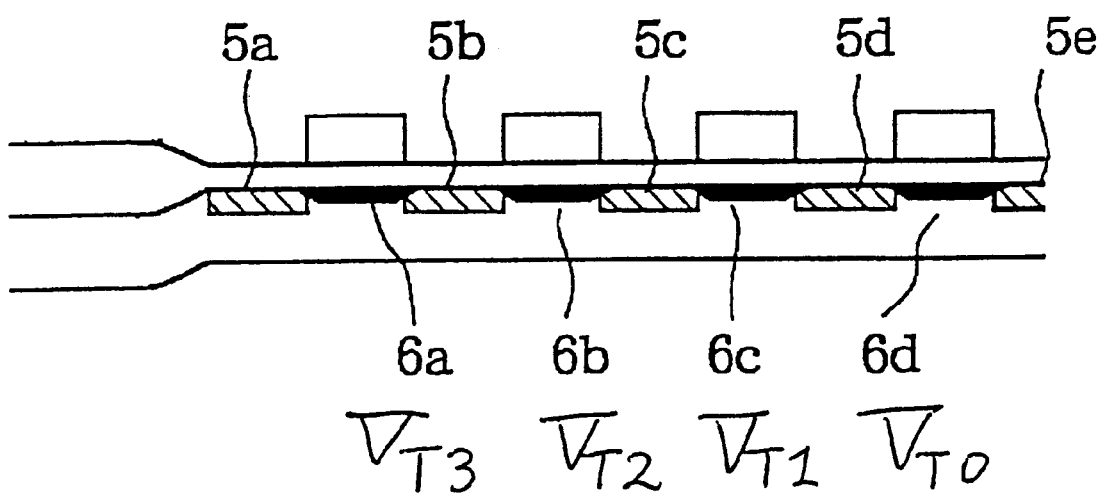

With reference to FIG. 18G, the used third photo-resist pattern 8 is removed. Implementation of the above combined two code ion-implantations, for example, the first and second code ion-implantation processes could set four different threshold voltage levels, for example, the fourth, third, second and first threshold voltage levels $V_{T3}$, $V_{T2}$, $V_{T1}$, and $V_{T0}$ to the first, second, third and fourth cell transistor channel regions 6a, 6b, 6c and 6d, whereby the first cell transistor channel region 6a has the fourth threshold voltage level $V_{T3}$ as the highest threshold voltage level. The second cell transistor channel region 6b has the third threshold voltage level $V_{T2}$ as the second highest threshold voltage level. The third cell transistor channel region 6c has the second threshold voltage level $V_{T1}$ as the second lowest threshold voltage level. The fourth cell transistor channel region 6d has the first threshold voltage level $V_{T0}$ as the lowest threshold voltage level. By contrast to the above present invention, it is necessary for the conventional method to implement three or more code ion-implantation processes as described above. The above novel method could reduce the number of the necessary code ion-implantation processes to set the four different threshold voltage levels, for example, the fourth, third, second and first threshold voltage levels $V_{T3}$, $V_{T2}$, $V_{T1}$, and $V_{T0}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting boron difluoride which is heavier than boron. Boron difluoride impurity heavier than boron impurity is capable of suppressing any excess thermal diffusion of the impurity in the first, second, third and fourth cell transistor channel regions 6a, 6b, 6c and 6d by a heat treatment to be carried out in a later manufacturing process, as compared to boron impurity. This suppression of any excess thermal diffusion results in avoidance of any substantive variations in threshold voltage level of the cell transistor channel regions 6a, 6b, 6c and 6d by the heat treatment.

Figure 19:
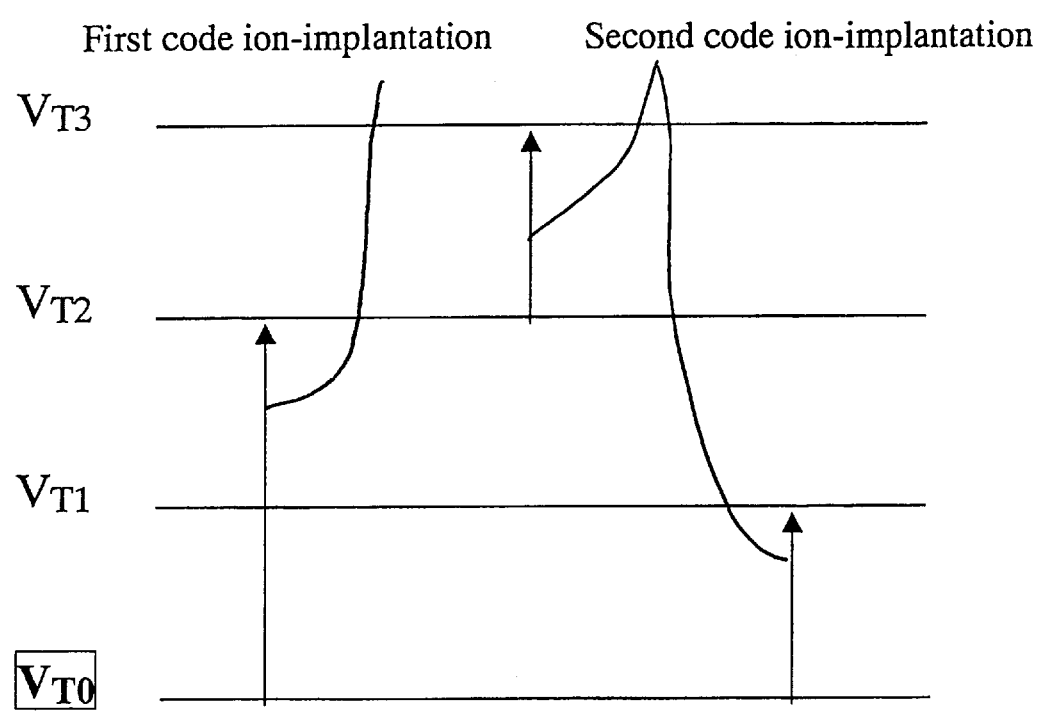
FIG. 19 is a diagram illustrative of changes in threshold voltage level of cell transistor channel regions upon first and second code selective ion-implantations for setting multiple different threshold voltage levels of a multiple-valued programmable read only memory in an eighth embodiment in accordance with the present invention.

FIG. 19 is a diagram illustrative of changes in threshold voltage level of cell transistor channel regions upon first and second code selective ion-implantations for setting multiple different threshold voltage levels of a multiple-valued programmable read only memory. The ion-implantation of boron is carried out to set the uniform threshold voltage level, for example, the first threshold voltage level $V_{T0}$ to all of the cell transistor channel regions 6a, 6b, 6c and 6d. The first code ion-implantation of boron difluoride to the first and second cell transistor channel regions 6a and 6b is then carried out at the second level dose so that the first threshold voltage level $V_{T0}$ of the first and second cell transistor channel regions 6a and 6b is risen by two levels into the second threshold voltage level $V_{T1}$, whilst the first threshold voltage level $V_{T0}$ of the third and fourth cell transistor channel regions 6c and 6d remains unchanged. Subsequently, the second code ion-implantation of boron difluoride to the first and third cell transistor channel regions 6a and 6c is then carried out at the first level dose so that the third threshold voltage level $V_{T2}$ of the first cell transistor channel region 6a is risen by one level into the fourth threshold voltage level $V_{T3}$, and the first threshold voltage level $V_{T0}$ of the third cell transistor channel region 6c is also risen by one level into the third threshold voltage level $V_{T2}$. In the meantime, the third threshold voltage level $V_{T2}$ of the second cell transistor channel region 6b and the first threshold voltage level $V_{T0}$ of the fourth cell transistor channel region 6d remain unchanged. As a result of the second code ion-implantation, the first cell transistor channel region 6a has the fourth threshold voltage level $V_{T3}$ as the highest threshold voltage level. The second cell transistor channel region 6b has the third threshold voltage level $V_{T2}$ as the second highest threshold voltage level. The third cell transistor channel region 6c has the second threshold voltage level $V_{T1}$ as the second lowest threshold voltage level. The fourth cell transistor channel region 6d has the first threshold voltage level $V_{T0}$ as the lowest threshold voltage level.

Ninth Embodiment

A ninth embodiment according to the present invention will be described in detail with reference to FIGS. 20A through 20F which are fragmentary cross sectional elevation views illustrative of sequential steps involved in a novel method of setting multiple different threshold voltage levels to cell transistor channel regions of a multiple-valued programmable read only memory. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 20A:
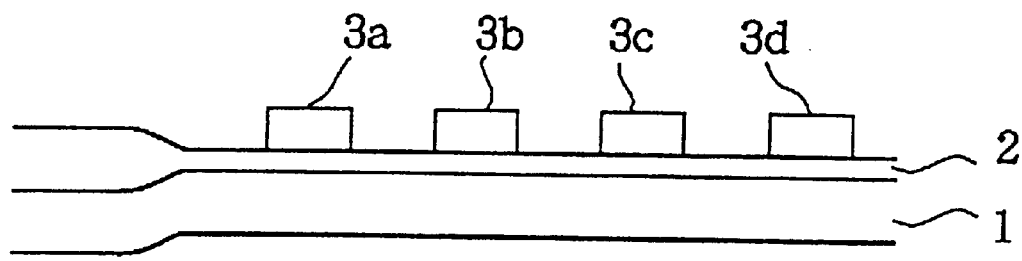
FIGS. 20A through 20G are fragmentary cross sectional elevation views illustrative of sequential steps involved in a novel method of setting multiple different threshold voltage levels to cell transistor channel regions of a multiple-valued programmable read only memory in a ninth embodiment in accordance with the present invention.

With reference to FIG. 20A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 20B:
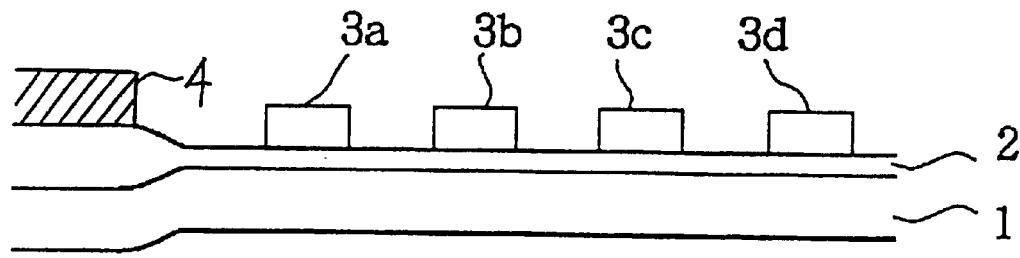

With reference to FIG. 20B, a photo-resist is applied on an entire surface of the silicon substrate for subsequent photo-lithography process to form a photo-resist pattern 4 over the filed oxide film so that the photo-resist pattern has an opening positioned over the active region or the gate electrodes 3a, 3b, 3c and 3d.

Figure 20C:
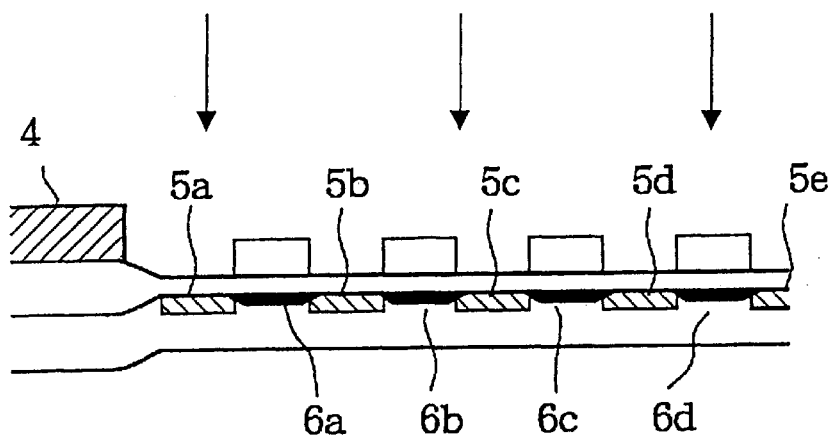

With reference to FIG. 20C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1 \times 10^{13}$ cm$^{-2}$. The formations of the p-type isolation regions 5a, 5b, 5c, 5d and 5e define first to fourth cell transistor channel regions 6a, 6b, 6c and 6d. The first cell transistor channel region 6a is deemed between the first and second p-type isolation regions 5a and 5b and also is positioned under the first gate electrode 3a. The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c. The fourth cell transistor channel region 6d is defined between the fourth and fifth p-type isolation regions 5d and 5e and also is positioned under the fourth gate electrode 3d.

Figure 20D:
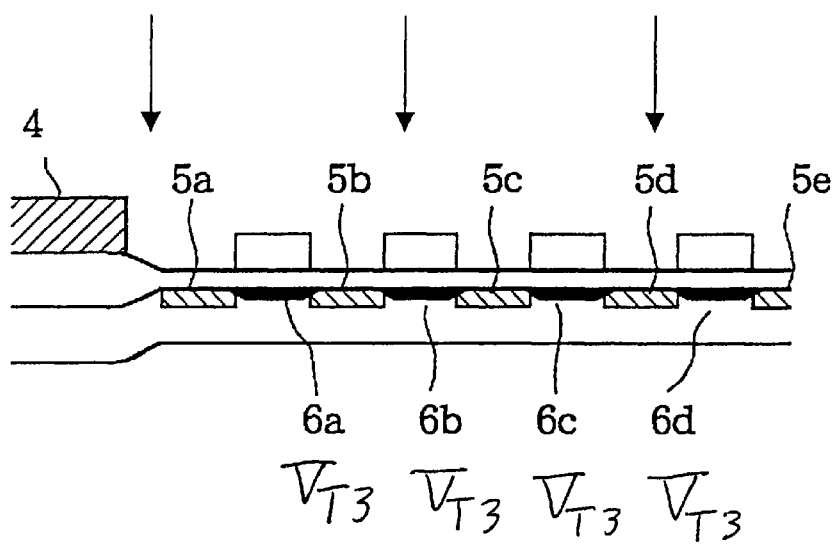

With reference to FIG. 20D, an ion-implantation of phosphorus is carried out by use of the above photo-resist pattern 4 as a mask, so that phosphorus atoms penetrate through the gate oxide film 2 and the first to fourth gate electrodes 3a, 3b, 3c and 3d and are ion-implanted into not only the, p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the phosphorus atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the fourth threshold voltage level $V_{T3}$ as the highest threshold voltage level.

Figure 20E:
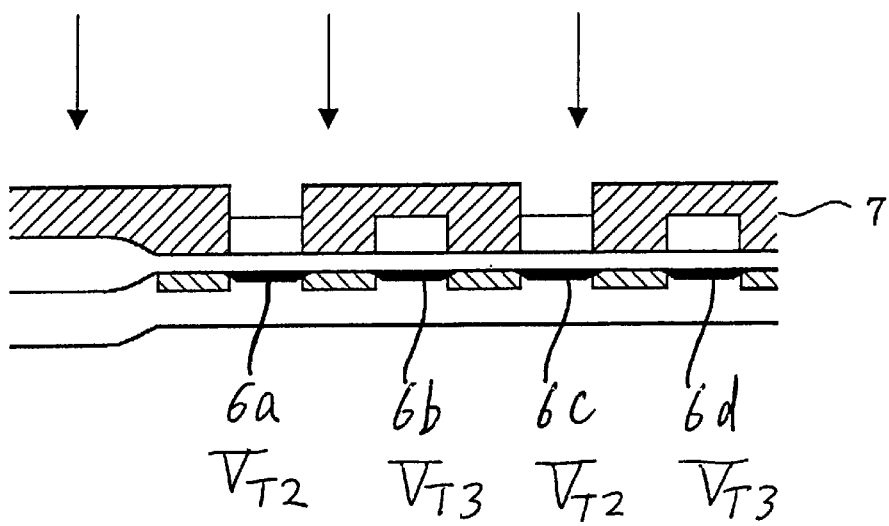

With reference to FIG. 20E, the used first photo-resist pattern 4 is removed before a second photo-resist pattern 7 is formed over the silicon substrate. The second photo-resist pattern 7 has two openings which are positioned over the first gate electrode 3a and the third gate electrode 3c respectively, so that the first and third gate electrodes 3a and 3c are shown through the two openings of the second photo-resist pattern 7, whilst the second and fourth gate electrodes 3b and 3d as well as the gate oxide film 2 and the field oxide film are covered by the second photo-resist pattern 7. A first code ion-implantation of arsenic is carried out at an ion-implantation energy of 360 KeV and at a dose in the range of $4.0 \times 10^{12}$ cm$^{-2}$ to $5.0 \times 10^{12}$ cm$^{-2}$ by use of the second photo-resist pattern 7 as a mask, so that arsenic atoms penetrate the first and third gate electrodes 3a and 3c and the gate oxide film 2 and are ion-implanted into the first and third cell transistor channel regions 6a and 6c positioned under the first and third gate electrodes 3a and 3c shown through the openings of the second photo-resist pattern 7, whereby the first and third cell transistor channel regions 6a and 6c having the fourth threshold voltage level $V_{T3}$ as the highest threshold voltage level drop in threshold voltage level by one level to the third threshold voltage level $V_{T2}$ as the second highest threshold voltage level, whilst the second and fourth cell transistor channel regions 6b and 6d having the fourth threshold voltage level $V_{T3}$ as the highest threshold voltage level remain unchanged in threshold voltage level. As a result of the first code ion-implantation, the first and third cell transistor channel regions 6a and 6c have the third threshold voltage level $V_{T2}$ as the second highest threshold voltage level. The second and fourth cell transistor channel regions 6b and 6d have the fourth threshold voltage level $V_{T3}$ as the highest threshold voltage level.

Figure 20F:
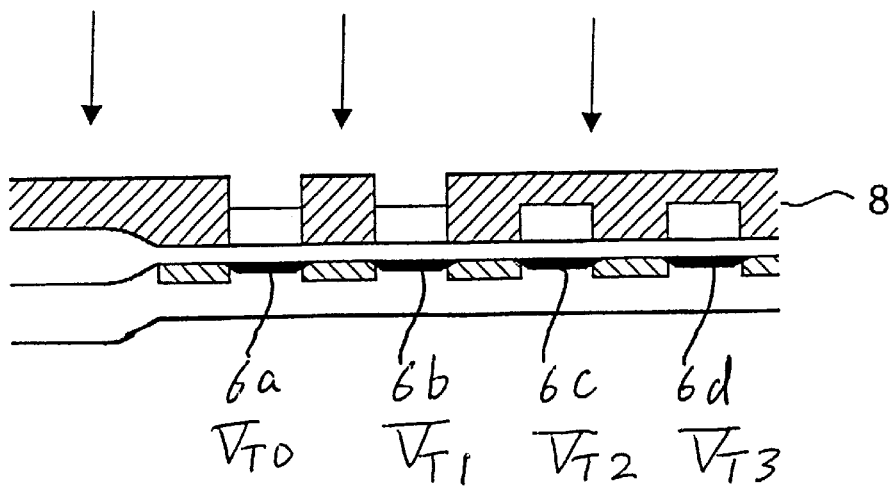

With reference to FIG. 20F, the used second photo-resist pattern 7 is removed before a third photo-resist pattern 8 is formed over the silicon substrate. The third photo-resist pattern 8 has two openings which are positioned over the first gate electrode 3a and the second gate electrode 3b respectively, so that the first and second gate electrodes 3a and 3b are shown through the two openings of the third photo-resist pattern 8, whilst the third and fourth gate electrodes 3c and 3d as well as the gate oxide film 2 and the field oxide film are covered by the third photo-resist pattern 8. A second code ion-implantation of arsenic is carried out at an ion-implantation energy of 360 KeV and at a dose in the range of $9.0 \times 10^{12}$ cm$^{-2}$ to $1.0 \times 10^{13}$ cm$^{-2}$ by use of the third photo-resist pattern 8 as a mask, so that arsenic atoms penetrate the first and second gate electrodes 3a and 3b and the gate oxide film 2 and are ion-implanted into the first and second cell transistor channel regions 6a and 6b positioned under the first and second gate electrodes 3a and 3b shown through the openings of the third photo-resist pattern 8, whereby the first cell transistor channel region 6a having the third threshold voltage level $V_{T2}$ as the second highest threshold voltage level drops in threshold voltage level by two levels to the first threshold voltage level $V_{T0}$ as the lowest threshold voltage level as well as the second cell transistor channel region 6b having the fourth threshold voltage level $V_{T3}$ as the highest threshold voltage level drops in threshold voltage level by two levels to the second threshold voltage level $V_{T1}$ as the second lowest threshold voltage level. In the meantime, the third cell transistor channel region 6c having the third threshold voltage level $V_{T1}$ as the second highest threshold voltage level remain unchanged in threshold voltage level as well as the fourth cell transistor channel region 6d having the fourth threshold voltage level $V_{T3}$ as the highest threshold voltage level remain unchanged in threshold voltage level. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level.

Figure 20G:
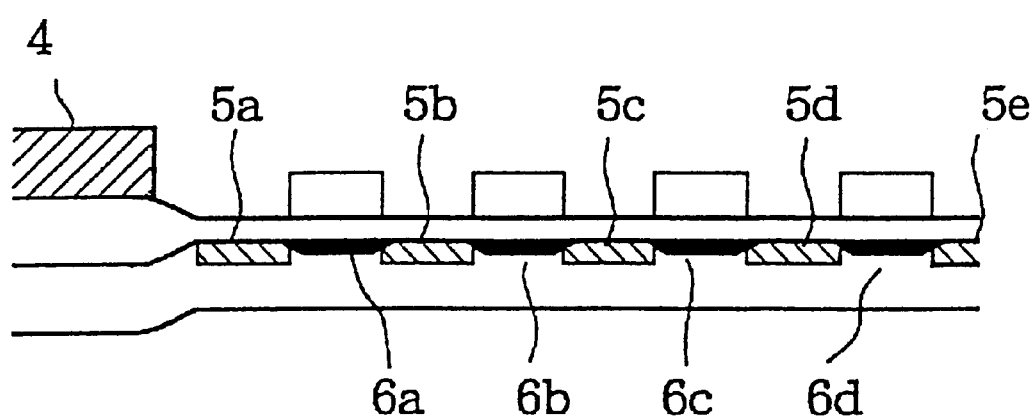

With reference to FIG. 20G, the used third photo-resist pattern 8 is removed. Implementation of the above combined two code ion-implantations, for example, the first and second code ion-implantation processes could set four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d, whereby the first cell transistor channel region 6a has the first threshold voltage level $V_{T0}$ as the lowest threshold voltage level, the second cell transistor channel region 6b has the second threshold voltage level $V_{T1}$ as the second lowest threshold voltage level, the third cell transistor channel region 6c has the third threshold voltage level $V_{T2}$ as the second highest threshold voltage level, and the fourth cell transistor channel region 6d has the fourth threshold voltage level $V_{T3}$ as the highest threshold voltage level. By contrast to the above present invention, it is necessary for the conventional method to implement three or more code ion-implantation processes as described above The above novel method could reduce the number of the necessary code ion-implantation processes to set the four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting arsenic which is heavier than boron. Arsenic impurity heavier than boron impurity is capable of suppressing any excess thermal diffusion of the impurity in the first, second, third and fourth cell transistor channel regions 6a, 6b, 6c and 6d by a heat treatment to be carried out in a later manufacturing process, as compared to boron impurity. This suppression of any excess thermal diffusion results in avoidance of any substantive variations in threshold voltage level of the cell transistor channel regions 6a, 6b, 6c and 6d by the heat treatment.

Figure 21:
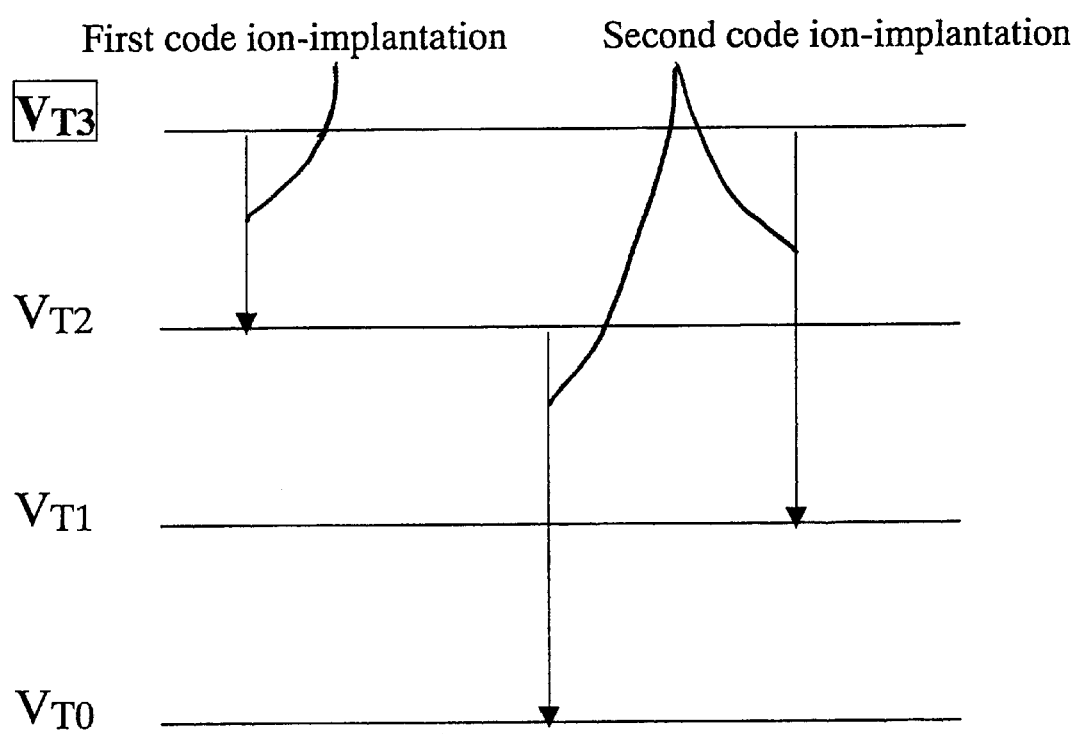
FIG. 21 is a diagram illustrative of changes in threshold voltage level of cell transistor channel regions upon first and second code selective ion-implantations for setting multiple different threshold voltage levels of a multiple-valued programmable read only memory in a ninth embodiment in accordance with the present invention.

FIG. 21 is a diagram illustrative of changes in threshold voltage level of cell transistor channel regions upon first and second code selective ion-implantations for setting multiple different threshold voltage levels of a multiple-valued programmable read only memory. The ion-implantation of phosphorus is carried out to set the uniform threshold voltage level, for example, the fourth threshold voltage level $V_{T3}$ to all of the cell transistor channel regions 6a, 6b, 6c and 6d. The first code ion-implantation of arsenic to the first and third cell transistor channel regions 6a and 6c is then carried out at the first level dose so that the fourth threshold voltage level $V_{T3}$ of the first and third cell transistor channel regions 6a and 6c is dropped by one level into the third threshold voltage level $V_{T2}$, whilst the fourth threshold voltage level $V_{T3}$ of the second and fourth cell transistor channel regions 6b and 6d remains unchanged. Subsequently, the second code ion-implantation of arsenic to the first and second cell transistor channel regions 6a and 6b is then carried out at the second level dose so that the third threshold voltage level $V_{T2}$ of the first cell transistor channel region 6a is dropped by two levels into the first threshold voltage level $V_{T0}$, and the fourth threshold voltage level $V_{T3}$ of the second cell transistor channel region 6b is also dropped by two levels into the second threshold voltage level $V_{T1}$. In the meantime, the third threshold voltage level $V_{T2}$ of the third cell transistor channel region 6c and the fourth threshold voltage level $V_{T3}$ of the fourth cell transistor channel region 6d remain unchanged. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level. The difference in dose of the first and second code ion-implantations shortens the number of the necessary steps to set the four different threshold voltage levels.

Tenth Embodiment

A tenth embodiment according to the present invention will be described in detail with reference to FIGS. 22A through 22F which are fragmentary cross sectional elevation views illustrative of sequential steps involved in a novel method of setting multiple different threshold voltage levels to cell transistor channel regions of a multiple-valued programmable read only memory in a tenth embodiment in accordance with the present invention. In this embodiment, four different threshold voltage levels of the cell transistor channel regions of the multiple-valued programmable read only memory are set by combined uses of code ion-implantations into a p-well region over a silicon substrate. The four different threshold voltage levels, for example, first, second, third and fourth threshold voltage levels $V_{T0}$, $V_{T1}$, $V_{T2}$, and $V_{T3}$, are set by first and second code ion-implantations into the individual cell transistor channel regions of the four-valued programmable read only memory in accordance with data from the user. The first threshold voltage level $V_{T0}$ is the lowest threshold voltage level. The second threshold voltage level $V_{T1}$ is the second lowest threshold voltage level. The third threshold voltage level $V_{T2}$ is the second highest threshold voltage level. The fourth threshold voltage level $V_{T3}$ is the highest threshold voltage level.

Figure 22A:
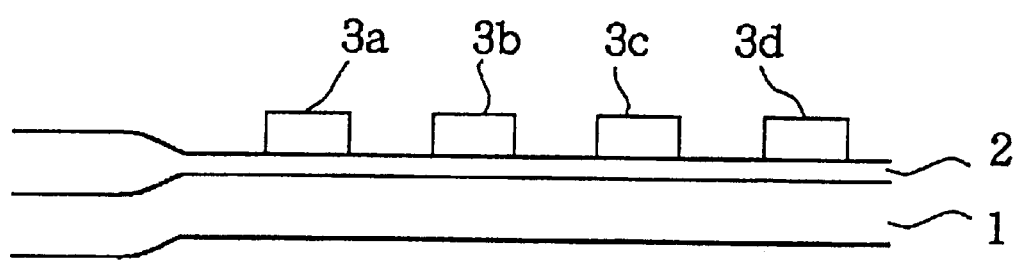
FIGS. 22A through 22G are fragmentary cross sectional elevation views illustrative of sequential steps involved in a novel method of setting multiple different threshold voltage levels to cell transistor channel regions of a multiple-valued programmable read only memory in a tenth embodiment in accordance with the present invention.

With reference to FIG. 22A, a p-well region 1 is formed over a silicon substrate. Field oxide films are selectively formed on the p-well region 1 over the silicon substrate to define an active region surrounded by the field oxide films. A gate oxide film 2 is formed on the active region of the p-well region 1. Further, gate electrodes are formed on the surface of the gate oxide film 2 so that the gate electrode are aligned at a constant pitch, wherein only four gate electrodes, for example, first to fourth gate electrodes 3a, 3b, 3c and 3d are illustrated.

Figure 22B:
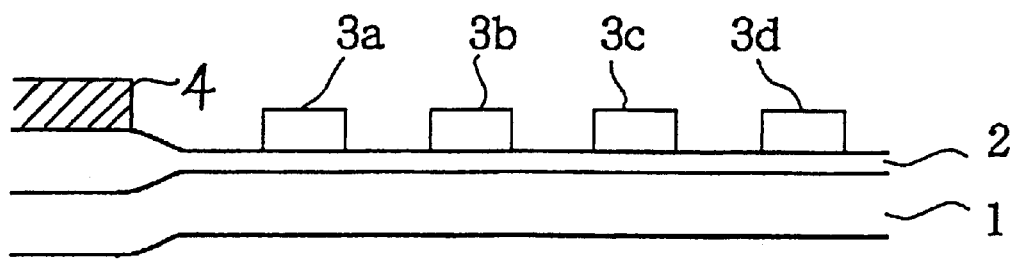

With reference to FIG. 22B, a photo-resist is applied on an entire surface of the silicon substrate for subsequent photo-lithography process to form a photo-resist pattern 4 over the filed oxide film so that the photo-resist pattern has an opening positioned over the active region or the gate electrodes 3a, 3b, 3c and 3d.

Figure 22C:
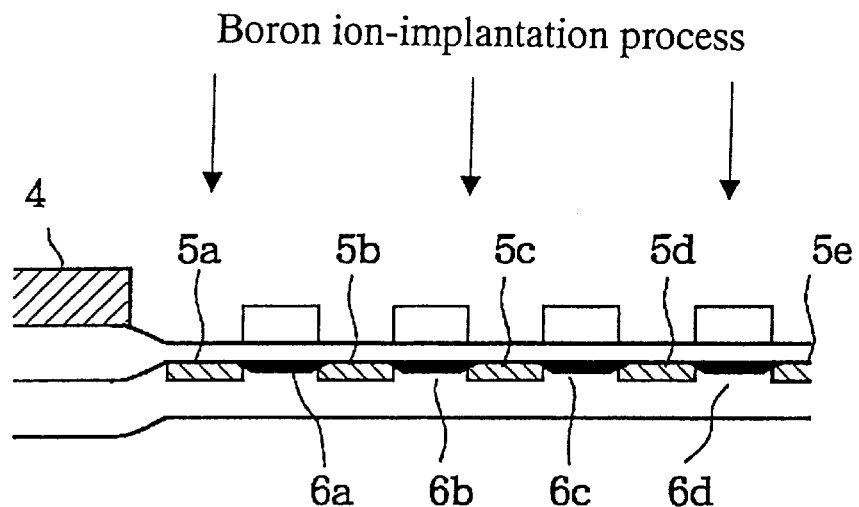

With reference to FIG. 22C, an ion-implantation of boron into an upper region of the p-well region 1 is carried out by use of the photo-resist pattern and the gate electrodes 3a, 3b, 3c and 3d as masks, whereby p-type isolation regions 5a, 5b, 5c, 5d and 5e are formed in the upper region of the p-well region 1 and positioned under apertures between the gate electrodes 3a, 3b, 3c and 3d. This ion-implantation of boron is carried out at an ion-implantation energy of 20 KeV, and at a dose of about $1 \times 10^{13}$ cm$^{-2}$. The formations of the p-type isolation regions 5a, 5b, 5c, 5d and 5e define first to fourth cell transistor channel regions 6a, 6b, 6c and 6d. The first cell transistor channel region 6a is defined between the first and second p-type isolation regions 5a and 5b and also is positioned under the first gate electrode 3a. The second cell transistor channel region 6b is defined between the second and third p-type isolation regions 5b and 5c and also is positioned under the second gate electrode 3b. The third cell transistor channel region 6c is defined between the third and fourth p-type isolation regions 5c and 5d and also is positioned under the third gate electrode 3c. The fourth cell transistor channel region 6d is defined between the fourth and fifth p-type isolation regions 5d and 5e and also is positioned under the fourth gate electrode 3d.

Figure 22D:
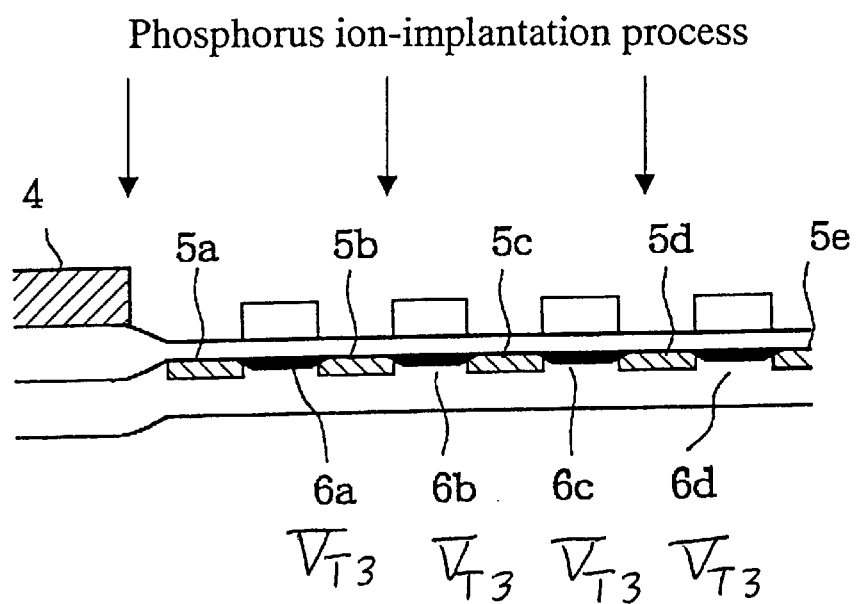

With reference to FIG. 22D, an ion-implantation of phosphorus is carried out by use of the above photo-resist pattern 4 as a mask, so that phosphorus atoms penetrate through the gate oxide film 2 and the first to fourth gate electrodes 3a, 3b, 3c and 3d and are ion-implanted into not only the p-type isolation regions 5a, 5b, 5c, 5d and 5e but also the first to fourth cell transistor channel regions 6a, 6b, 6c and 6d under the first to fourth gate electrodes 3a, 3b, 3c and 3d. The ion-implantation energy is decided so that the phosphorus atoms penetrate through both the first to fourth gate electrodes 3a, 3b, 3c and 3d and the gate oxide film 2 so that the boron atoms are implanted into the first to fourth cell transistor channel regions 6a, 6b, 6c and 6d under the first to fourth gate electrodes 3a, 3b, 3c and 3d. The dose of the above ion-implantation is adjusted so that the above first to fourth cell transistor channel regions 6a, 6b, 6c and 6d have a uniform threshold voltage level, for example, the fourth threshold voltage level $V_{T3}$ as the highest threshold voltage level.

Figure 22E:
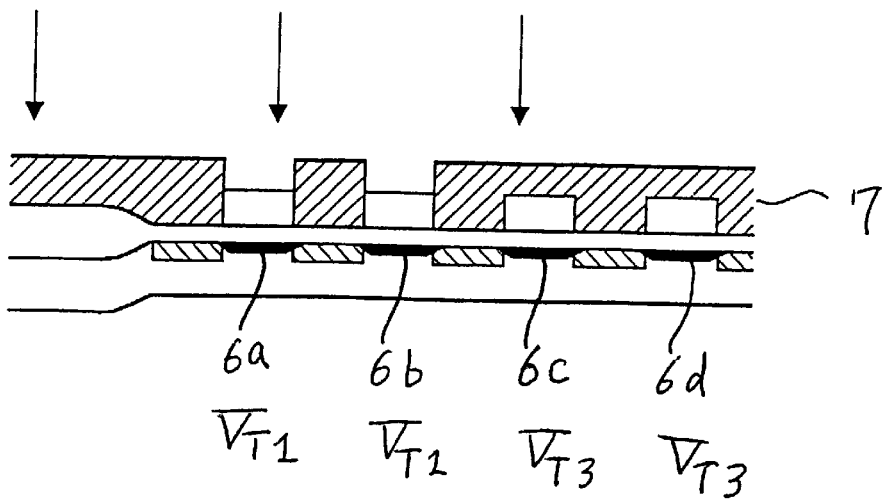

With reference to FIG. 22E, the used first photo-resist pattern 4 is removed before a second photo-resist pattern 7 is formed over the silicon substrate. The second photo-resist pattern 7 has two openings which are positioned over the first gate electrode 3a and the second gate electrode 3b respectively, so that the first and second gate electrodes 3a and 3b are shown through the two openings of the second photo-resist pattern 7, whilst the third and fourth gate electrodes 3c and 3d as well as the gate oxide film 2 and the field oxide film are covered by the second photo-resist pattern 7. A first code ion-implantation of arsenic is carried out at an ion-implantation energy of 360 KeV and at a dose in the range of $9.0 \times 10^{12}$ cm$^{-2}$ to $1.0 \times 10^{13}$ cm$^{-2}$ by use of the second photo-resist pattern 7 as a mask, so that arsenic atoms penetrate the first and second gate electrodes 3a and 3b and the gate oxide film 2 and are ion-implanted into the first and second cell transistor channel regions 6a and 6b positioned under the first and second gate electrodes 3a and 3b shown through the openings of the second photo-resist pattern 7, whereby the first and second cell transistor channel regions 6a and 6b having the fourth threshold voltage level $V_{T3}$ as the highest threshold voltage level drop in threshold voltage level by two levels to the second threshold voltage level $V_{T1}$ as the second lowest threshold voltage level, while the third and fourth cell transistor channel regions 6c and 6d having the fourth threshold voltage level $V_{T3}$ as the highest threshold voltage level remain unchanged in threshold voltage level. As a result of the first code ion-implantation, the first and second cell transistor channel regions 6a and 6b have the second threshold voltage level $V_{T1}$ as the second lowest threshold voltage level. The third and fourth cell transistor channel regions 6c and 6d have the fourth threshold voltage level $V_{T3}$ as the highest threshold voltage level.

Figure 22F:
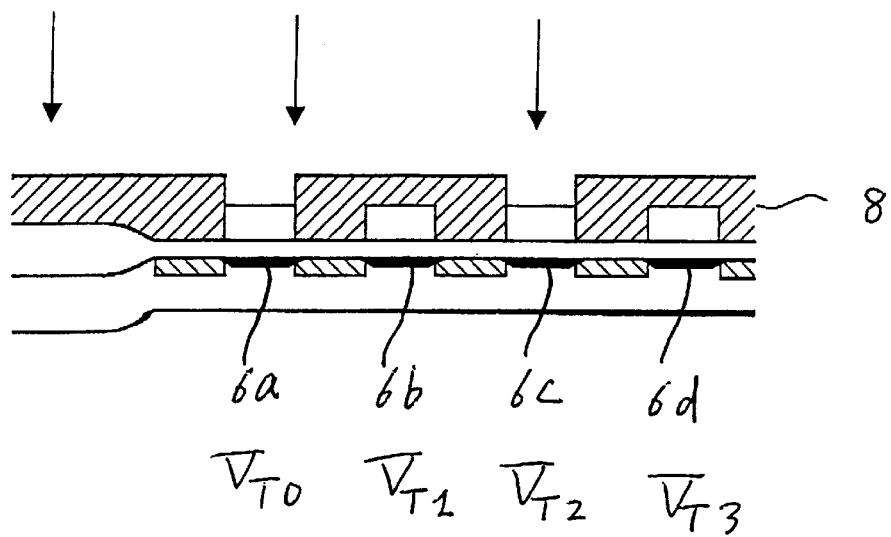

With reference to FIG. 22F, the used second photo-resist pattern 7 is removed before a third photo-resist pattern 8 is formed over the silicon substrate. The third photo-resist pattern 8 has two openings which are positioned over the first gate electrode 3a and the third gate electrode 3c respectively, so that the first and third gate electrodes 3a and 3c are shown through the two openings of the third photo-resist pattern 8, whilst the second and fourth gate electrodes 3b and 3d as well as the gate oxide film 2 and the field oxide film are covered by the third photo-resist pattern 8. A second code ion-implantation of arsenic is carried out at an ion-implantation energy of 360 KeV and at a dose in the range of $4.0 \times 10^{12}$ cm$^{-2}$ to $5.0 \times 10^{12}$ cm$^{-2}$ by use of the third photo-resist pattern 8 as a mask, so that phosphorus atoms penetrate the first and third gate electrodes 3a and 3c and the gate oxide film 2 and are ion-implanted into the first and third cell transistor channel regions 6a and 6c positioned under the first and third gate electrodes 3a and 3c shown through the openings of the third photo-resist pattern 8, whereby the first cell transistor channel region 6a having the second threshold voltage level $V_{T1}$ as the second lowest threshold voltage level drops in threshold voltage level by one level to the first threshold voltage level $V_{T0}$ as the lowest threshold voltage level as well as the third cell transistor channel region 6c having the fourth threshold voltage level $V_{T3}$ as the highest threshold voltage level drops in threshold voltage level by one level to the third threshold voltage level $V_{T2}$ as the second highest threshold voltage level. In the meantime, the second cell transistor channel region 6b having the second threshold voltage level $V_{T1}$ as the second lowest threshold voltage level remain unchanged in threshold voltage level as well as the fourth cell transistor channel region 6d having the fourth threshold voltage level $V_{T3}$ as the highest threshold voltage level remain unchanged in threshold voltage level. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level.

Figure 22G:
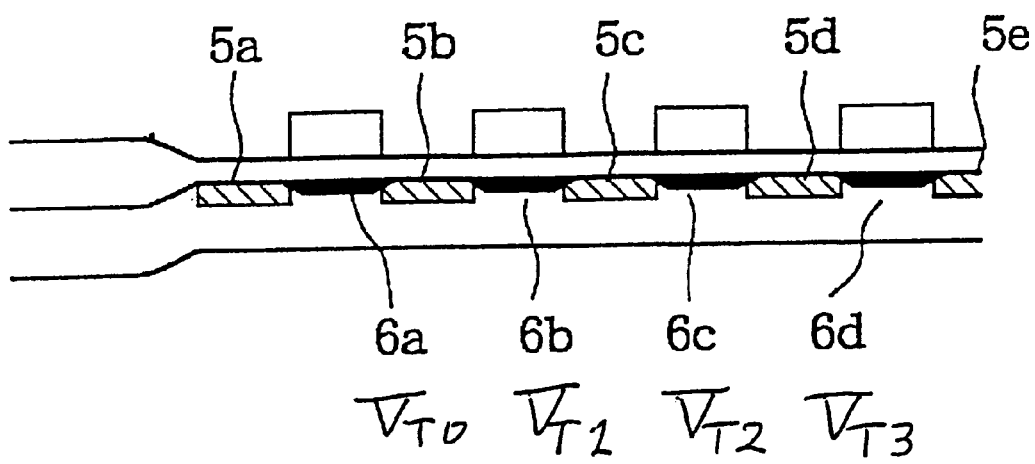

With reference to FIG. 22G, the used third photo-resist pattern 8 is removed. Implementation of the above combined two code ion-implantations, for example, the first and second code ion-implantation processes could set four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d, whereby the first cell transistor channel region 6a has the first threshold voltage level $V_{T0}$ as the lowest threshold voltage level, the second cell transistor channel region 6b has the second threshold voltage level $V_{T1}$ as the second lowest threshold voltage level, the third cell transistor channel region 6c has the third threshold voltage level $V_{T2}$ as the second highest threshold voltage level, and the fourth cell transistor channel region 6d has the fourth threshold voltage level $V_{T3}$ as the highest threshold voltage level. By contrast to the above present invention, it is necessary for the conventional method to implement three or more code ion-implantation processes as described above. The above novel method could reduce the number of the necessary code ion-implantation processes to set the four different threshold voltage levels, for example, the first, second, third and fourth threshold voltage levels $V_{T0}$, $V_{T1}$, $V_{T2}$, and $V_{T3}$ to the first, second, third and fourth cell transistor channel regions 6a, 6b, 6c and 6d. The reduction in the number of the necessary code ion-implantation processes shortens the turn around time.

Further, it is more important that the first and second code ion-implantation processes are carried out by implanting arsenic which is heavier than boron. An arsenic impurity heavier than boron impurity is capable of suppressing any excess thermal diffusion of the impurity in the first, second, third and fourth cell transistor channel regions 6a, 6b, 6c and 6d by a heat treatment to be carried out in a later manufacturing process, as compared to boron impurity. This suppression of any excess thermal diffusion results in avoidance of any substantive variations in threshold voltage level of the cell transistor channel regions 6a, 6b, 6c and 6d by the heat treatment.

Figure 23:
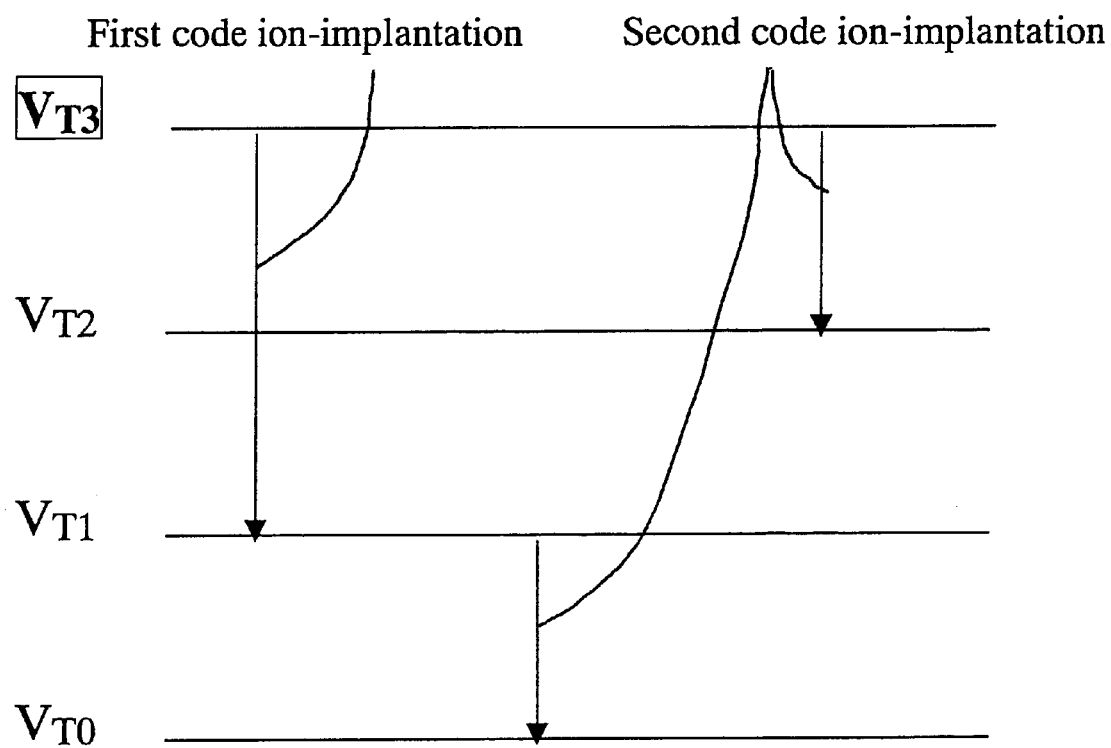
FIG. 23 is a diagram illustrative of changes in threshold voltage level of cell transistor channel regions upon first and second code selective ion-implantations for setting multiple different threshold voltage levels of a multiple-valued programmable read only memory in a tenth embodiment in accordance with the present invention.

FIG. 23 is a diagram illustrative of changes in threshold voltage level of cell transistor channel regions upon first and second code selective ion-implantations for setting multiple different threshold voltage levels of a multiple-valued programmable read only memory. The ion-implantation of phosphorus is carried out to set the uniform threshold voltage level, for example, the fourth threshold voltage level $V_{T3}$ to all of the cell transistor channel regions 6a, 6b, 6c and 6d. The first code ion-implantation of arsenic to the first and second cell transistor channel regions 6a and 6b is then carried out at the second level dose so that the fourth threshold voltage level $V_{T3}$ of the first and second cell transistor channel regions 6a and 6b is dropped by two levels into the second threshold voltage level $V_{T1}$, whilst the fourth threshold voltage level $V_{T3}$ of the third and fourth cell transistor channel regions 6c and 6d remains unchanged. Subsequently, the second code ion-implantation of arsenic to the first and third cell transistor channel regions 6a and 6c is then carried out at the first level dose so that the second threshold voltage level $V_{T1}$ of the first cell transistor channel region 6a is dropped by one level into the first threshold voltage level $V_{T0}$, and the fourth threshold voltage level $V_{T3}$ of the third cell transistor channel region 6c is also dropped by one level into the third threshold voltage level $V_{T2}$. In the meantime, the second threshold voltage level $V_{T1}$ of the second cell transistor channel region 6b and the fourth threshold voltage level $V_{T3}$ of the fourth cell transistor channel region 6d remain unchanged. As a result of the second code ion-implantation, the first cell transistor channel region 6a has the first threshold voltage level $V_{T0}$ as the lowest threshold voltage level. The second cell transistor channel region 6b has the second threshold voltage level $V_{T1}$ as the second lowest threshold voltage level. The third cell transistor channel region 6c has the third threshold voltage level $V_{T2}$ as the second highest threshold voltage level. The fourth cell transistor channel region 6d has the fourth threshold voltage level $V_{T3}$ as the highest threshold voltage level. The difference in dose of the first and second code ion-implantations shortens the number of the necessary steps to set the four different threshold voltage levels.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of setting a plurality of different threshold voltage levels to a plurality of cell regions for a mask programmable semiconductor device, said method comprising the steps of:

forming gate electrodes surrounded by a first photo-resist mask;

applying a first ion-implantation dose to simultaneously form drain, source, and channel regions associated with all of the gate electrodes surrounded by the first photo-resist mask;

while retaining the first photo-resist mask, with a first impurity carrying out a second ion-implantation through all of the gate electrodes to establish a first threshold voltage level associated with each of the gate electrodes of all of the cell regions surrounded by the first photo-resist mask, the first ion-implantation being performed at an energy level lower than the second ion-implantation;

discarding the first photo-resist mask and providing a second photo-resist mask protecting the drain and source region and plural ones of the gate electrodes, at least one of the gate electrodes being exposed by the second photo-resist mask; and with a second impurity applying a first-code selective ion-implantation through at least a first-selected one of the exposed gate electrodes to establish a second threshold voltage level associated with the exposed at least one gate electrode, the second threshold voltage level being different from the first threshold voltage level, wherein said second impurity of said first-code selective ion-implantation is heavier than said first impurity so as to suppress any excess thermal diffusion to avoid variations in threshold voltage level of said cell regions.

2. The method as claimed in claim 1, wherein said second impurity has an opposite conductivity type to said first impurity.

3. The method as claimed in claim 2, wherein said first impurity comprises boron and said second impurity comprises an n-type impurity heavier than boron.

4. The method as claimed in claim 3, wherein said n-type impurity of said second impurity comprises one selected from the group consisting of P, As and Sb.

5. The method as claimed in claim 2, wherein said first impurity comprises an n-type impurity and said second impurity comprises a p-type impurity heavier than said n-type impurity.

6. The method as claimed in claim 1, wherein said second impurity has the same conductivity type as said first impurity.

7. The method as claimed in claim 6, wherein said first and second impurities are of p-type, and said first impurity comprises boron and said second impurity comprises one selected from the group consisting of boron difluoride, gallium and indium.

8. The method as claimed in claim 7, wherein said first and second impurities are of n-type, and said first impurity comprises phosphorus and said second impurity comprises one selected from the group consisting of arsenic and antimony.

9. The method as claimed in claim 1, further comprising a step of:

carrying out a second-code selective ion-implantation of a third impurity into at least a second-selected one of said plurality of gate electrodes, so that said at least second-selected one of said gate electrodes has a third threshold voltage level which is different from said first and second threshold voltage levels, wherein said third impurity of said second-code, selective ion-implantation is heavier than said first impurity.

10. The method as claimed in claim 9, wherein said third impurity has an opposite conductivity type to said first impurity.

11. The method as claimed in claim 10, wherein said first impurity comprises boron and said second impurity comprises an n-type impurity heavier than boron.

12. The method as claimed in claim 11, wherein said n-type impurity of said third impurity comprises one selected from the group consisting of P, As and Sb.

13. The method as claimed in claim 10, wherein said first impurity comprises an n-type impurity and said third impurity comprises a p-type impurity heavier than said n-type impurity.

14. The method as claimed in claim 9, wherein said third impurity has the same conductivity type as said first impurity.

15. The method as claimed in claim 14, wherein said first and third impurities are of p-type, and said first impurity comprises boron and said third impurity comprises one selected from the group consisting of boron difluoride, gallium and indium.

16. The method as claimed in claim 15, wherein said first and third impurities are of n-type, and said first impurity comprises phosphorus and said third impurity comprises one selected from the group consisting of arsenic and antimony.

17. The method as claimed in claim 9, wherein said first-code selective ion-implantation of said second impurity and said second-code selective ion-implantation of said third impurity are carried out at different doses from each other.

18. The method as claimed in claim 17, wherein at least one of the date electrodes is subjected to both said first-code selective ion-implantation and subsequent said second-code selective ion-implantation.

19. The method as claimed in claim 1, wherein said first-code selective ion-implantation is carried out at an ion-implantation energy which is higher than when said first impurity is doped into said all cell regions.

20. The method as claimed in claim 9, wherein said second-code selective ion-implantation is carried out at the same ion-implantation energy as said first-code selective ion-implantation.

21. A method of setting multiple different threshold voltage levels to a plurality of cell transistor channel regions for a multiple-valued mask programmable read only memory, said method comprising the steps of:
    forming gate electrodes surrounded by a first photo-resist mask;
    applying a first ion-implantation dose to simultaneously form drain, source, and cell transistor channel regions intermediate the drain and source regions and associated with all of the gate electrodes surrounded by the first photo-resist mask;
    while retaining the first photo-resist mask, with a first impurity carrying out a second ion-implantation through all of the gate electrodes to establish a first threshold voltage level associated with each of the gate electrodes of all of the cell regions surrounded by the first photo-resist mask, the first ion-implantation being performed at an energy level lower than the second ion-implantation;
    carrying out a first-code selective ion-implantation, into at least a first-selected one of said plurality of cell transistor channel regions with a second impurity so that said at least the first-selected one of said cell transistor channel regions has a second threshold voltage level which is different from said first threshold voltage levels; and
    carrying out a second-code selective ion-implantation of a third impurity into at least second-selected one of said plurality of cell transistor channel regions, so that said at least second-selected one of said cell transistor channel regions has a third threshold voltage level which is different from said first and second threshold voltage levels,
    wherein said second impurity of said first-code selective ion-implantation is heavier than said first impurity, and said third impurity of said second-code selective ion-implantation is also heavier than said first impurity, so as to suppress any excess thermal diffusion to avoid variations in threshold voltage level of said cell transistor channel regions, and
    wherein at least any one of said second and third impurities has an opposite conductivity type to said first impurity.

22. The method as claimed in claim 21, wherein both said second and third impurities have an opposite conductivity type to said first impurity.

23. The method as claimed in claim 22, wherein said first impurity comprises boron and each of said second and third impurities comprises an n-type impurity heavier than boron.

24. The method as claimed in claim 23, wherein, said n-type impurity of each of said second and third impurities comprises one selected from the group consisting of P, As and Sb.

25. The method as claimed in claim 22, wherein, said first impurity comprises an n-type impurity and each of said second and third impurities comprises a p-type impurity heavier than said n-type impurity.

26. The method as claimed in claim 25, wherein said first impurity comprises an n-type impurity and both said second and third impurities comprises the same p-type impurity heavier than said n-type impurity.

27. The method as claimed in claim 26, wherein said first and second impurities are of p-type, and said first impurity comprises boron and said second impurity comprises one selected from the group consisting of boron difluoride, gallium and indium.

28. The method as claimed in claim 27, wherein said first and second impurities are of n-type, and said first impurity comprises phosphorus and said second impurity comprises one selected from the group consisting of arsenic and antimony.

29. The method as claimed in claim 21, wherein both said second and third impurities have opposite conductivity types to each other.

30. The method as claimed in claim 29, wherein said first impurity comprises boron, said second impurity comprises an n-type impurity heavier than boron, said third impurity comprises a p-type impurity heavier than boron.

31. The method as claimed in claim 30, wherein said n-type impurity of said second impurity comprises one selected from the group consisting of P, As and Sb, and said p-type impurity of said third impurity comprises one selected from the group consisting of boron difluoride, gallium and indium.

32. The method as claimed in claim 29, wherein said first impurity comprises boron, said second impurity comprises a p-type impurity heavier than boron, said third impurity comprises an n-type impurity heavier than boron.

33. The method as claimed in claim 32, wherein said n-type impurity of said third impurity comprises one selected from the group consisting of P, As and Sb, and said p-type impurity of said second impurity comprises one selected from the group consisting of boron difluoride, gallium and indium.

34. The method as claimed in claim 21, wherein said first-code selective ion-implantation of said second impurity and said second-code selective ion-implantation of said third impurity are carried out at different doses from each other.

35. The method as claimed in claim 34, wherein said at least first-selected one of said cell transistor channel regions comprises first-selected plural cell transistor channel regions and said at least first-selected one of said cell transistor channel regions comprises second-selected plural cell transistor channel regions, and wherein said first-selected plural cell transistor channel regions partially overlap said second-selected plural cell transistor channel regions, so that at least an overlapped cell transistor channel region belonging both said first-selected and second-selected plural cell transistor channel regions is subjected to both said first-code selective ion-implantation and subsequent said second-code selective ion-implantation.

36. The method as claimed in claim 21, wherein each of said first-code selective ion-implantation and said second-code selective ion-implantation is carried out at an ion-implantation energy which is higher than when said first impurity is doped into said all cell transistor channel regions.

37. A method of setting multiple different threshold voltage levels to a plurality of cell transistor channel regions formed in a p-type silicon region for a multiple-valued mask programmable read only memory, said method comprising the steps of:

forming gate electrodes surrounded by a first photo-resist mask;

applying a first ion-implantation dose to simultaneously form drain, source, and cell transistor channel regions intermediate the drain and source regions and associated with all of the gate electrodes surrounded by the first photo-resist mask;

while retaining the first photo-resist mask, with a first impurity of boron carrying out a second ion-implantation through all of the gate electrodes to establish a first threshold voltage level associated with each of the gate electrodes of all of the cell regions surrounded by the first photo-resist mask, the first ion-implantation being performed at an energy level lower than the second ion-implantation;

carrying out a first-code selective ion-implantation, into at least a first-selected one of said plurality of cell transistor channel regions with a second impurity of an n-type so that said at least the first-selected one of said cell transistor channel regions has a second threshold voltage level which is different from said first threshold voltage levels; and carrying out a second-code selective ion-implantation of a third impurity of said n-type into at least a second-selected one of said plurality of cell transistor channel regions, so that said at least second-selected one of said cell transistor channel regions has a third threshold voltage level which is different from said first and second threshold voltage levels, wherein said second impurity of said first-code selective ion-implantation is heavier than said first impurity, and said third impurity of said second-code selective ion-implantation is also heavier than said first impurity, so as to suppress any excess thermal diffusion to avoid variations in threshold voltage level of said cell transistor channel regions.

38. The method as claimed in claim 37, wherein said n-type impurity of each of said second and third impurities comprises one selected from the group consisting of P, As and Sb.

39. The method as claimed in claim 37, wherein said first-code selective ion-implantation of said second impurity and said second-code selective ion-implantation of said third impurity are carried out at different doses from each other.

40. The method as claimed in claim 39, wherein said at least first-selected one of said cell transistor channel regions comprises first-selected plural cell transistor channel regions and said at least first-selected one of said cell transistor channel regions comprises second-selected plural cell transistor channel regions, and wherein said fire-selected plural cell transistor channel regions partially overlap said second-selected plural cell transistor channel regions, so that at least in overlapped cell transistor channel region belonging both said first-selected and second-selected plural cell transistor channel regions is subjected to both said first-code selective ion-implantation and subsequent said second-code selective ion-implantation.

41. The method as claimed in claim 37, wherein each of said first-code selective ion-implantation and said second-code selective ion-implantation is carried out at an ion-implantation energy which is higher than when boron as said first impurity is doped into said all cell transistor channel regions.

42. A method of setting multiple different threshold voltage levels to a plurality of cell transistor channel regions formed in a p-type silicon region for a multiple-valued mask programmable read only memory, said method comprising the steps of:

forming gate electrodes surrounded by a first photo-resist mask;

applying a first ion-implantation dose to simultaneously form drain, source, and cell transistor channel regions intermediate the drain and source regions and associated with all of the gate electrodes surrounded by the first photo-resist mask;

while retaining the first photo-resist mask, with a first impurity of boron carrying out a second ion-implantation through all of the gate electrodes to establish a first threshold voltage level associated with each of the gate electrodes of all of the cell regions surrounded by the first photo-resist mask, the first ion-implantation being performed at an energy level lower than the second ion-implantation;

carrying out a first-code selective ion-implantation, into at least a first-selected one of said plurality of cell transistor channel regions with a second impurity of a n n-type so that said at least the first-selected one of said cell transistor channel regions has a second threshold voltage level which is different from said first threshold voltage level; and carrying out a second-code selective ion-implantation of a third impurity of a p-type into at least a second-selected one of said plurality of cell transistor channel regions, so that said at least second-selected one of said cell transistor channel regions has a third threshold voltage level which is different from said first and second threshold voltage levels, wherein said second impurity of said first-code selective ion-implantation is heavier than said first impurity, and said third impurity of said second-code selective ion-implantation is also heavier than said first impurity, so as to suppress any excess thermal diffusion to avoid variations in threshold voltage level of said cell transistor channel regions.

43. The method as claimed in claim 42, wherein said n-type impurity of said second impurity comprises one selected from the group consisting of P, As and Sb, and said p-type impurity of laid third impurity comprises one selected from the group consisting of boron difluoride, gallium and indium.

44. The method as claimed in claim 42, wherein said first-code selective ion-implantation of said second impurity and said second-code selective ion-implantation of said third impurity are carried out at different doses from each other.

45. The method as claimed in claim 44, wherein said at least first-selected one of said cell transistor channel regions comprises first-selected plural cell transistor channel regions and said at least first-selected one of said cell transistor channel regions comprises second-selected plural cell transistor channel regions, and wherein said first-selected plural cell transistor channel regions partially overlap said second-selected plural cell transistor channel regions, so that at least an overlapped cell transistor channel region belonging both said first-selected and second-selected plural cell transistor channel regions is subjected to both said first-code selective ion-implantation and subsequent said second-code selective ion-implantation.

46. The method as claimed in claim 42, wherein each of said first-code selective ion-implantation and said second-code selective ion-implantation is carried out at an ion-implantation energy which is higher than when boron as said first impurity is doped into said all cell transistor channel regions.

47. A method of setting multiple different threshold voltage levels to a plurality of cell transistor channel regions formed in a p-type silicon region for a multiple-valued mask programmable read only memory, said method comprising the steps of:

forming gate electrodes surrounded by a first photo-resist mask;

applying a first ion-implantation dose to simultaneously form drain, source, and cell transistor channel regions intermediate the drain and source regions and associated with all of the gate electrodes surrounded by the first photo-resist mask;

while retaining the first photo-resist mask, with a first impurity of boron carrying out a second ion-implantation through all of the gate electrodes to establish a first threshold voltage level associated with each of the gate electrodes of all of the cell regions surrounded by the first photo-resist mask, the first ion-implantation being performed at an energy level lower than the second ion-implantation;

carrying out a first-code selective ion-implantation, into at least a first-selected one of said plurality of cell transistor channel regions with a second impurity of an p-type so that said at least the first-selected one of said cell transistor channel regions has a second threshold voltage level which is different from said first threshold voltage levels; and carrying out a second-code selective ion-implantation of a third impurity of said n-type into at least a second-selected one of said plurality of cell transistor channel regions, so that said at least second-selected one of said cell transistor channel regions has a third threshold voltage level which is different from said first and second threshold voltage levels, wherein said second impurity of said first-code selective ion-implantation is heavier than said first impurity, and said third impurity of said second-code selective ion-implantation is also heavier than said first impurity, so as to suppress any excess thermal diffusion to avoid variations in threshold voltage level of said cell transistor channel regions.

48. The method as claimed in claim 47, wherein said p-type impurity of said second impurity comprises one selected from the group consisting of boron difluoride, gallium and indium, and said n-type impurity of said third impurity comprises one selected from the group consisting of P, As and Sb.

49. The method as claimed in claim 47, wherein said first-code selective ion-implantation of said second impurity and said second-code selective ion-implantation of said third impurity are carried out at different doses from each other.

50. The method as claimed in claim 49, wherein said at least first-selected one of said cell transistor channel regions comprises first-selected plural cell transistor channel regions and said at least first-selected one of said cell transistor channel regions comprises second-selected plural cell transistor channel regions, and wherein said first-selected plural cell transistor channel regions partially overlap said second-selected plural cell transistor channel regions, so that at least an overlapped cell transistor channel region belonging both said first-selected and second-selected plural cell transistor channel regions is subjected to both said first-code selective ion-implantation and subsequent said second-code selective ion-implantation.

51. The method as claimed in claim 47, wherein each of said first-code selective ion-implantation and said second-code selective ion-implantation is carried out at an ion-implantation energy which is higher than when boron as said first impurity is doped into said all cell transistor channel regions.

* * * * *